United States Patent
Yokouchi

(10) Patent No.: US 9,449,825 B2
(45) Date of Patent: Sep. 20, 2016

(54) HEAT TREATMENT APPARATUS FOR HEATING SUBSTRATE BY IRRADIATION WITH FLASHES OF LIGHT, AND HEAT TREATMENT METHOD

(71) Applicant: DAINIPPON SCREEN MFG. CO., LTD., Kyoto (JP)

(72) Inventor: Kenichi Yokouchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 626 days.

(21) Appl. No.: 13/752,420

(22) Filed: Jan. 29, 2013

(65) Prior Publication Data

US 2013/0203269 A1 Aug. 8, 2013

(30) Foreign Application Priority Data

Feb. 3, 2012 (JP) .................................. 2012-022433
Feb. 3, 2012 (JP) .................................. 2012-022435
Feb. 3, 2012 (JP) .................................. 2012-022454

(51) Int. Cl.
F27B 5/14 (2006.01)
F27B 5/18 (2006.01)
F27D 11/12 (2006.01)
H01L 21/26 (2006.01)
F27B 17/00 (2006.01)
(Continued)

(52) U.S. Cl.
CPC ................. *H01L 21/26* (2013.01); *F27B 5/14* (2013.01); *F27B 17/0016* (2013.01); *F27D 5/0037* (2013.01); *F27D 11/12* (2013.01); *H01L 21/6838* (2013.01); *F27B 5/18* (2013.01); *F27B 17/0025* (2013.01)

(58) Field of Classification Search
None
See application file for complete search history.

(56) References Cited

U.S. PATENT DOCUMENTS 4,698,486 A * 10/1987 Sheets ............................ 219/390
6,570,656 B1 * 5/2003 Owens et al. ................. 356/445
(Continued)

FOREIGN PATENT DOCUMENTS

JP   2003-257882   9/2003
JP   2008-147533   6/2008
(Continued)

OTHER PUBLICATIONS

Three Japanese Office Action all issued on Aug. 11, 2015 in connection with corresponding japanese application Nos. 2012-022433; 2012-022454 and 2012-022435.

(Continued)

*Primary Examiner* — Joseph M Pelham
(74) *Attorney, Agent, or Firm* — Ostrolenk Faber LLP

(57) ABSTRACT

A first flash heating is performed in which a lower flash lamp irradiates a back surface of a semiconductor wafer with flashes of light, so that heat conduction from the back surface to a surface of the semiconductor wafer raises the temperature of the surface from the room temperature to an intermediate temperature. Then, a second flash heating is performed in which an upper flash lamp irradiates the surface of the semiconductor wafer with flashes of light, to raise the temperature of the surface of the semiconductor wafer from the intermediate temperature to a target temperature. Since only the irradiation with flashes of light emitted from the lower flash lamp and the upper flash lamp is used to cause the semiconductor wafer having the room temperature to reach the target temperature, all heat treatments can be completed in an extremely short time of one second or less.

19 Claims, 40 Drawing Sheets

(51) Int. Cl.
*F27D 5/00* (2006.01)
*H01L 21/683* (2006.01)

(56) References Cited

U.S. PATENT DOCUMENTS

| | | | |
|---|---|---|---|
| 6,594,446 B2 | 7/2003 | Camm et al. | |
| 6,737,367 B1* | 5/2004 | Drechsler et al. | 438/795 |
| 6,798,142 B2* | 9/2004 | Eguchi | 315/115 |
| 6,885,815 B2* | 4/2005 | Kusuda et al. | 392/416 |
| 6,951,996 B2* | 10/2005 | Timans et al. | 219/390 |
| 6,970,644 B2* | 11/2005 | Koren et al. | 392/418 |
| 7,183,229 B2* | 2/2007 | Yamanaka | 438/795 |
| 7,317,870 B2* | 1/2008 | Timans et al. | 392/416 |
| 7,616,872 B2* | 11/2009 | Camm et al. | 392/416 |
| 7,800,081 B2* | 9/2010 | Moffatt et al. | 250/492.2 |
| 7,981,816 B2 | 7/2011 | Takahashi et al. | |
| 8,000,587 B2* | 8/2011 | Timans et al. | 392/411 |
| 8,005,351 B2* | 8/2011 | Camm et al. | 392/416 |
| 8,145,046 B2 | 3/2012 | Kiyama et al. | |
| 8,173,937 B2* | 5/2012 | Yokouchi | 219/411 |
| 8,295,691 B2 | 10/2012 | Kusuda | |
| 8,314,369 B2* | 11/2012 | Moffatt et al. | 219/411 |
| 8,498,525 B2 | 7/2013 | Kiyama et al. | |
| 8,541,297 B2 | 9/2013 | Yamaguchi et al. | |
| 8,861,944 B2 | 10/2014 | Kiyama et al. | |
| 2002/0195437 A1* | 12/2002 | Kusuda | 219/390 |
| 2003/0013280 A1* | 1/2003 | Yamanaka | 438/487 |
| 2003/0183612 A1* | 10/2003 | Timans et al. | 219/390 |
| 2004/0149715 A1* | 8/2004 | Timans et al. | 219/390 |
| 2005/0258162 A1* | 11/2005 | Kusuda et al. | 219/411 |
| 2006/0096677 A1* | 5/2006 | Camm et al. | 148/565 |
| 2006/0225657 A1* | 10/2006 | Mizushima et al. | 118/724 |
| 2006/0249078 A1* | 11/2006 | Nowak et al. | 118/724 |
| 2006/0291835 A1 | 12/2006 | Nozaki et al. | 392/416 |
| 2007/0069161 A1* | 3/2007 | Camm et al. | 250/504 R |
| 2008/0069550 A1* | 3/2008 | Timans et al. | 392/411 |
| 2008/0143268 A1 | 6/2008 | Toriaki et al. | |
| 2008/0190909 A1* | 8/2008 | Yokouchi | 219/385 |
| 2008/0273867 A1* | 11/2008 | Camm et al. | 392/416 |
| 2010/0151696 A1 | 6/2010 | Ito et al. | |
| 2011/0274417 A1* | 11/2011 | Camm et al. | 392/411 |
| 2012/0057855 A1* | 3/2012 | Yokouchi | 392/407 |
| 2012/0061374 A1* | 3/2012 | Yokouchi | 219/385 |
| 2012/0063751 A1* | 3/2012 | Yokouchi | 392/407 |

FOREIGN PATENT DOCUMENTS

| | | |
|---|---|---|
| JP | 2009-164525 | 7/2009 |
| JP | 2009-188210 | 8/2009 |
| JP | 2009-231676 | 10/2009 |
| JP | 2009-260018 | 11/2009 |
| JP | 2010-093282 | 4/2010 |
| JP | 2010-141103 | 6/2010 |
| JP | 2010-192663 | 9/2010 |
| JP | 2011-119562 | 6/2011 |
| JP | 2011-210790 | 10/2011 |

OTHER PUBLICATIONS

Japanese Office Action (JP Application No. 2012-022435) dated Apr. 12, 2016 and its English translation.
Japanese Office Action (JP Application No. 2012-022454) dated Apr. 12, 2016 and its English translation.

* cited by examiner

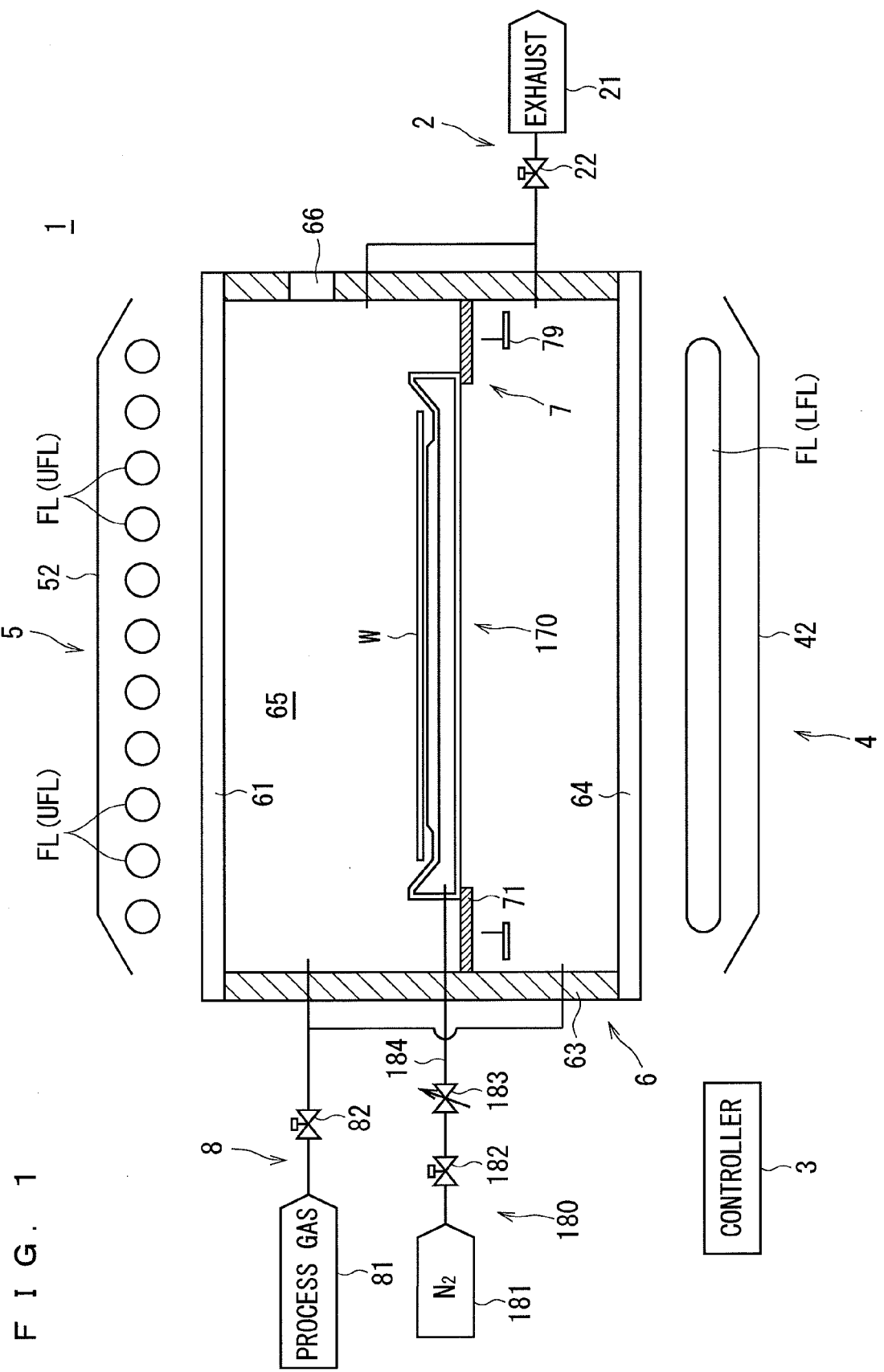
F I G. 1

F I G. 2
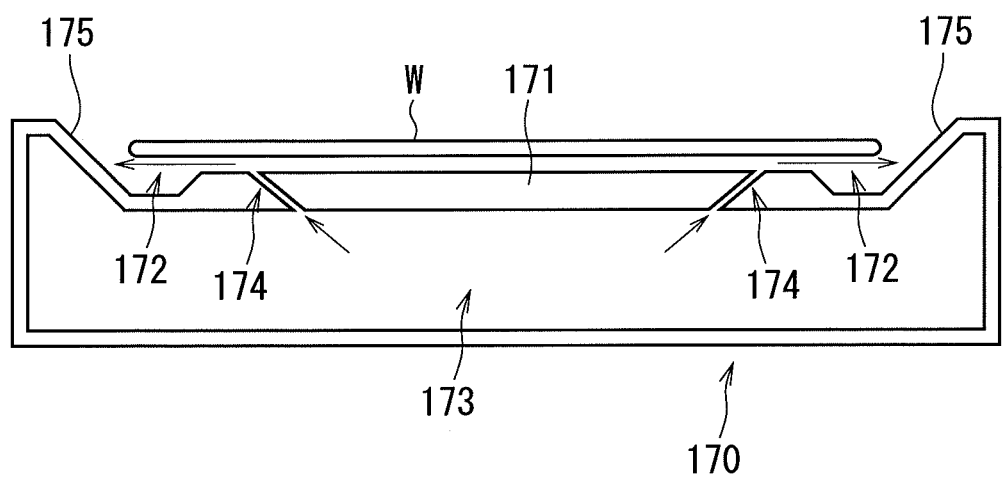

F I G. 3
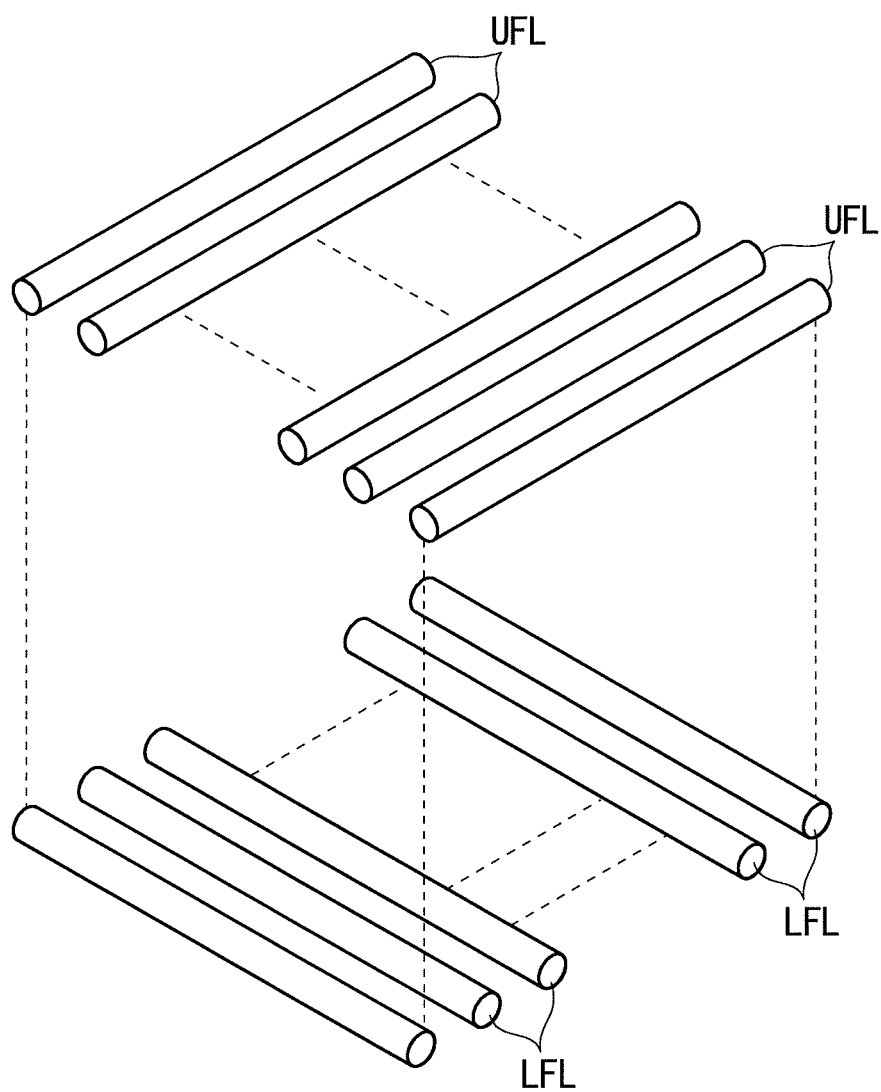

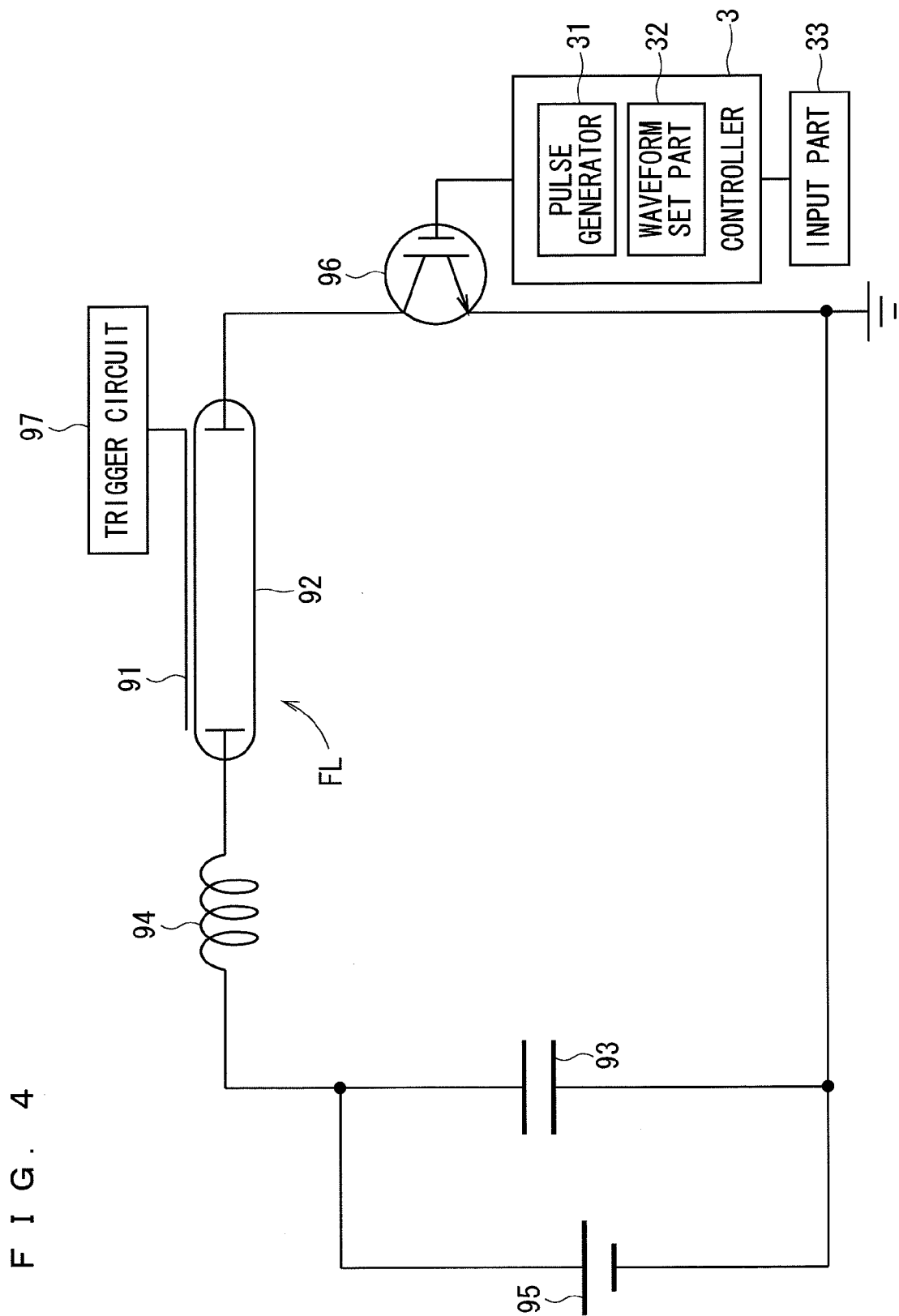
F I G . 4

F I G. 5
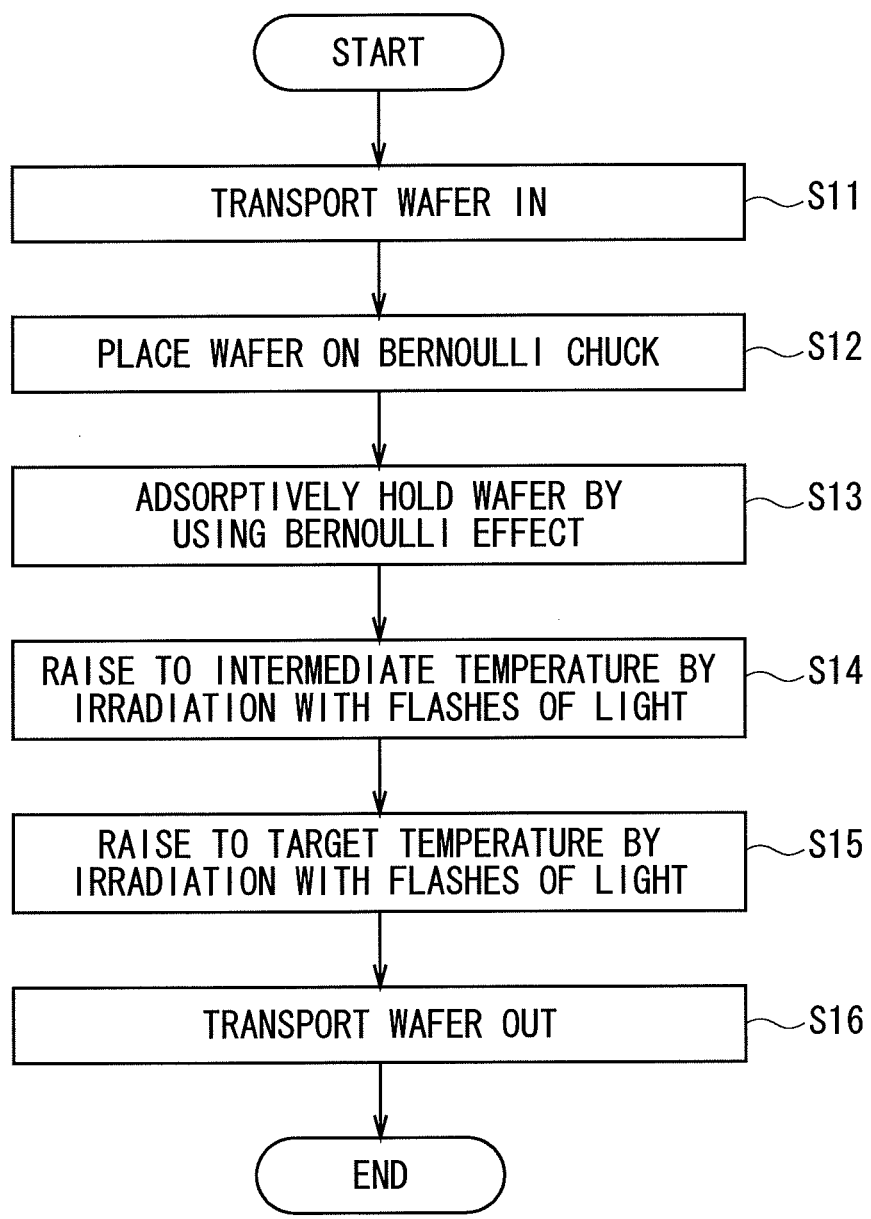

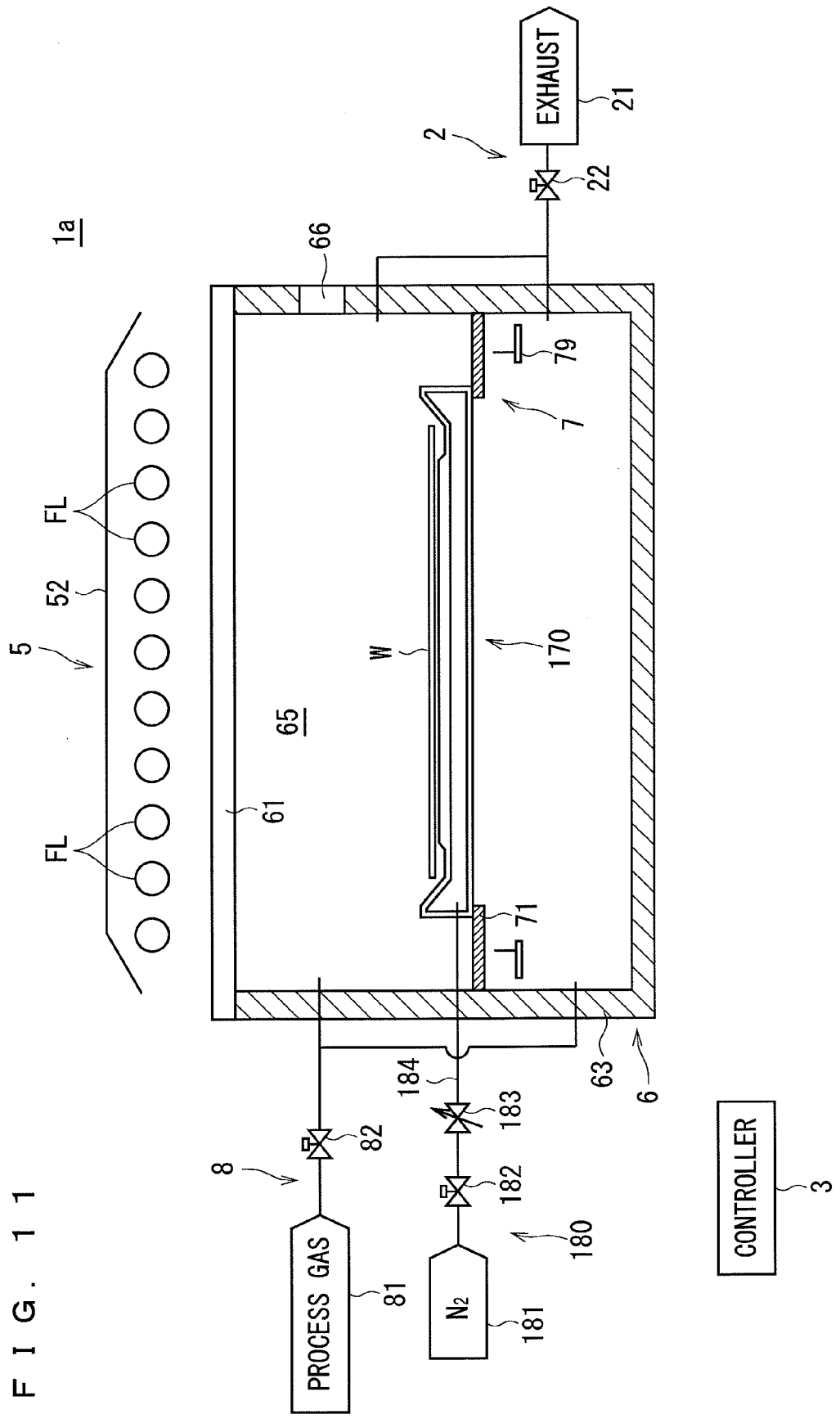

F I G . 1 2
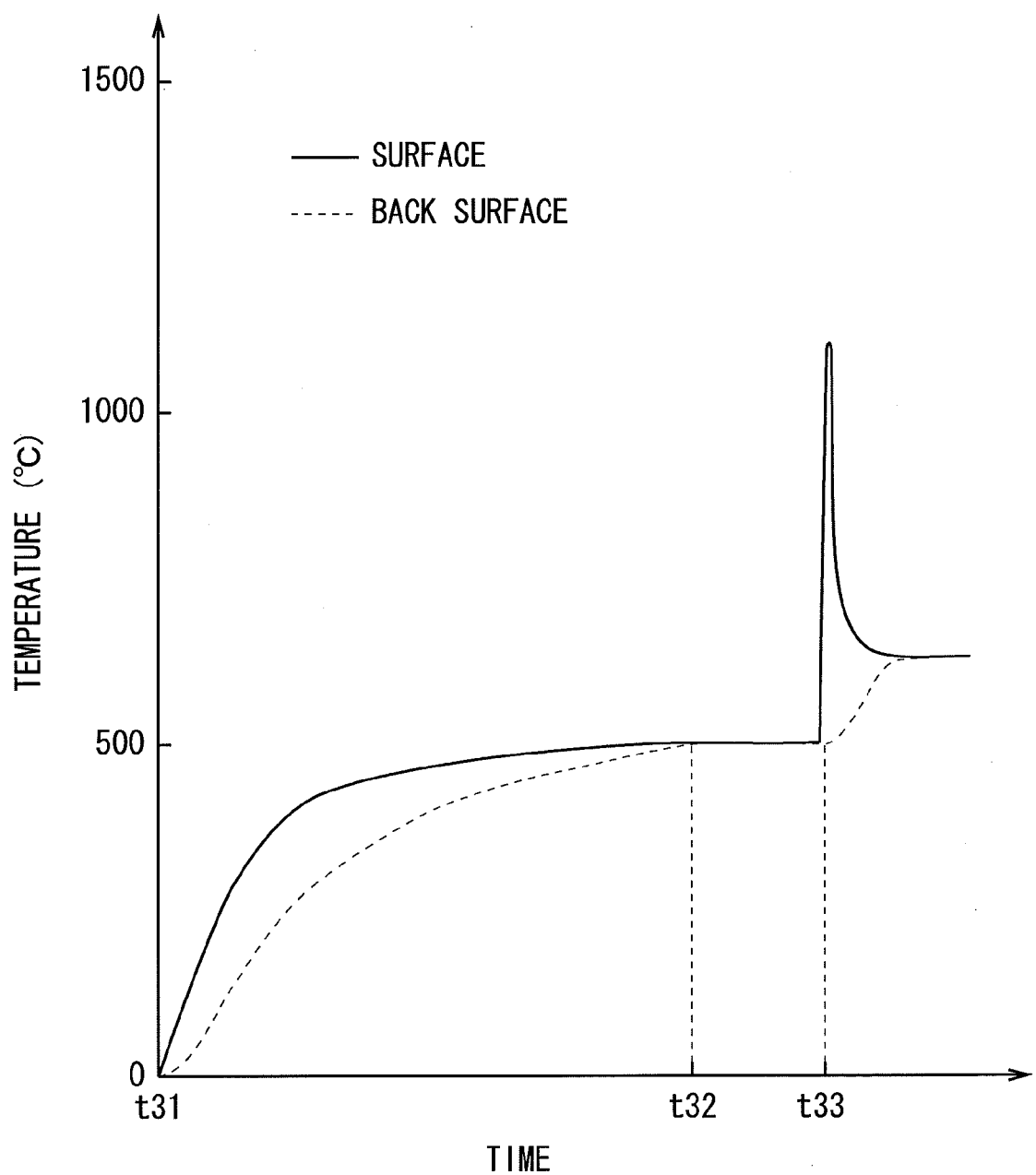

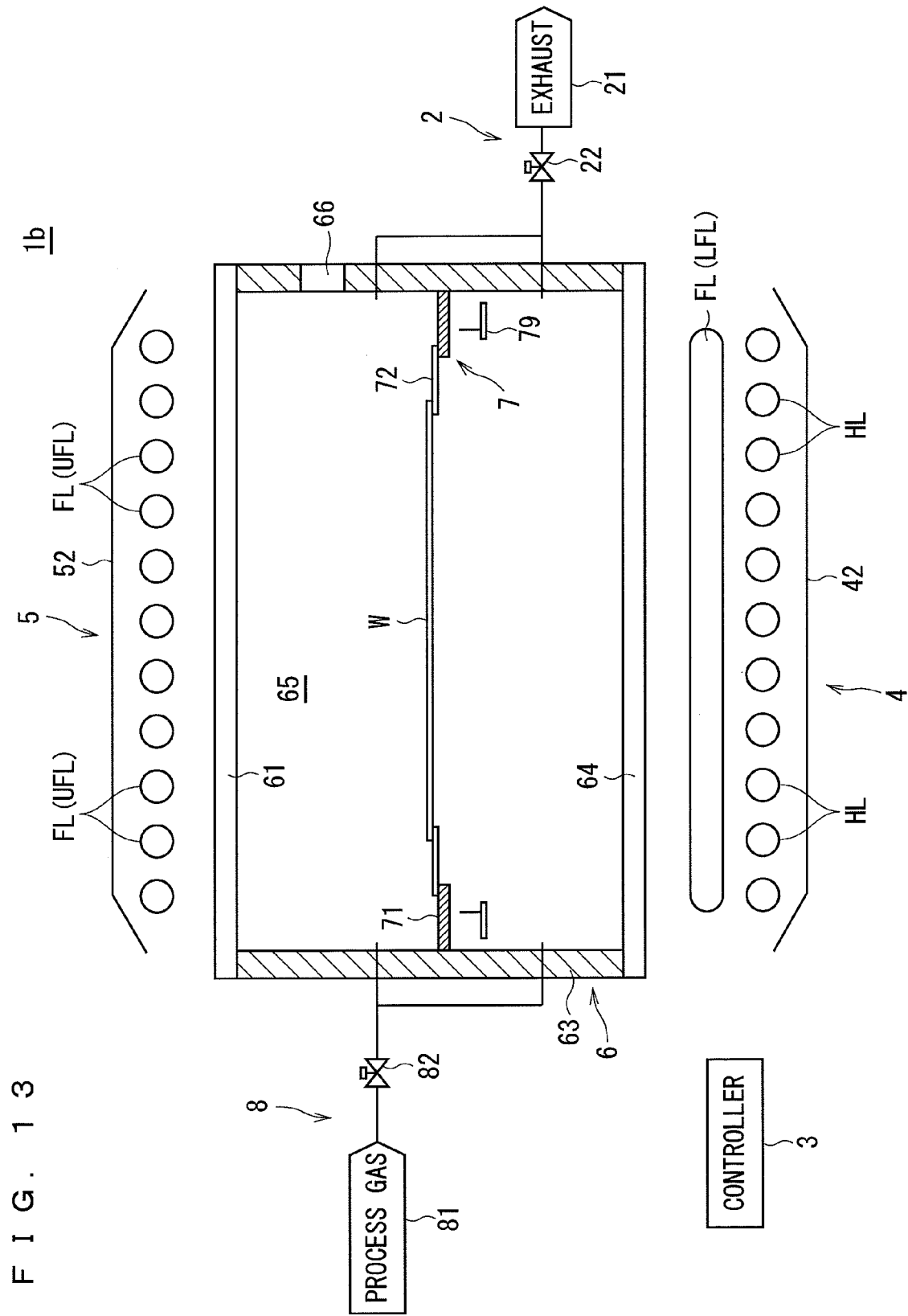
F I G . 1 3

F I G. 1 4
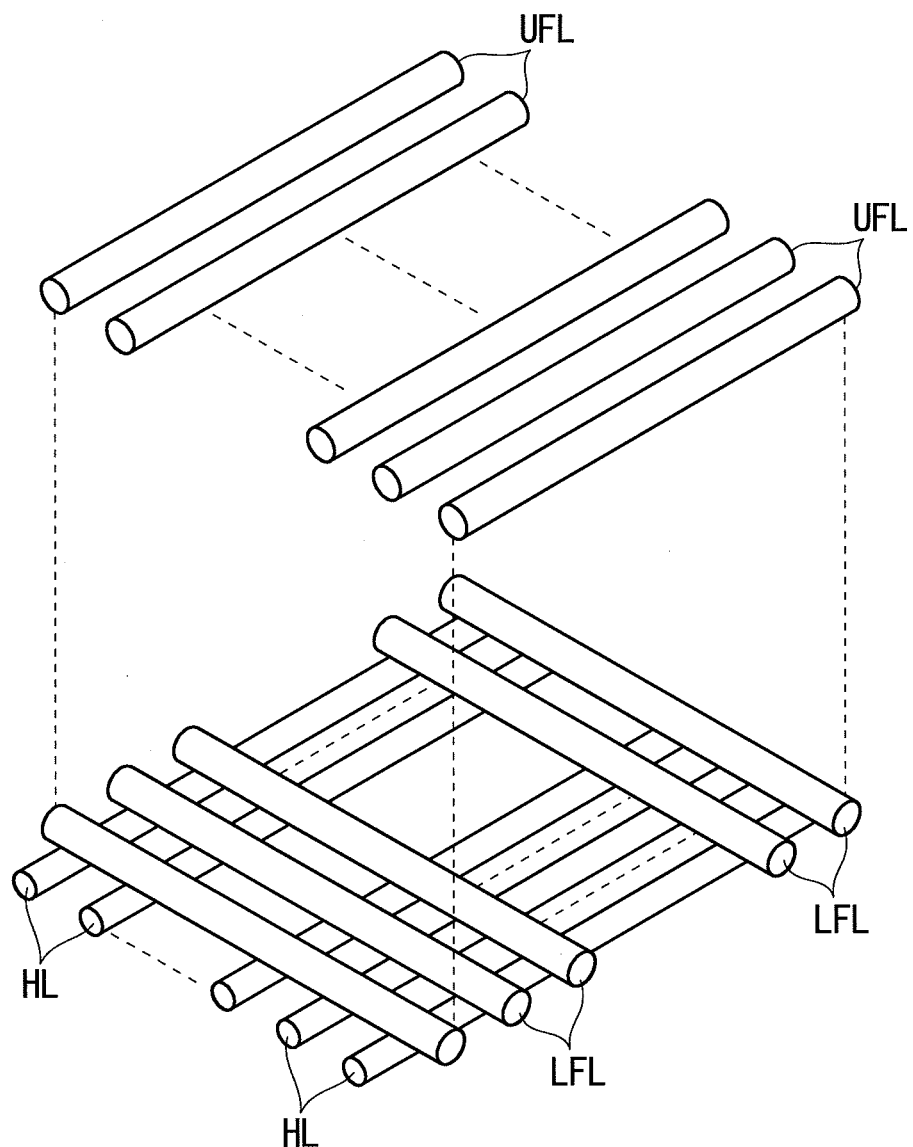

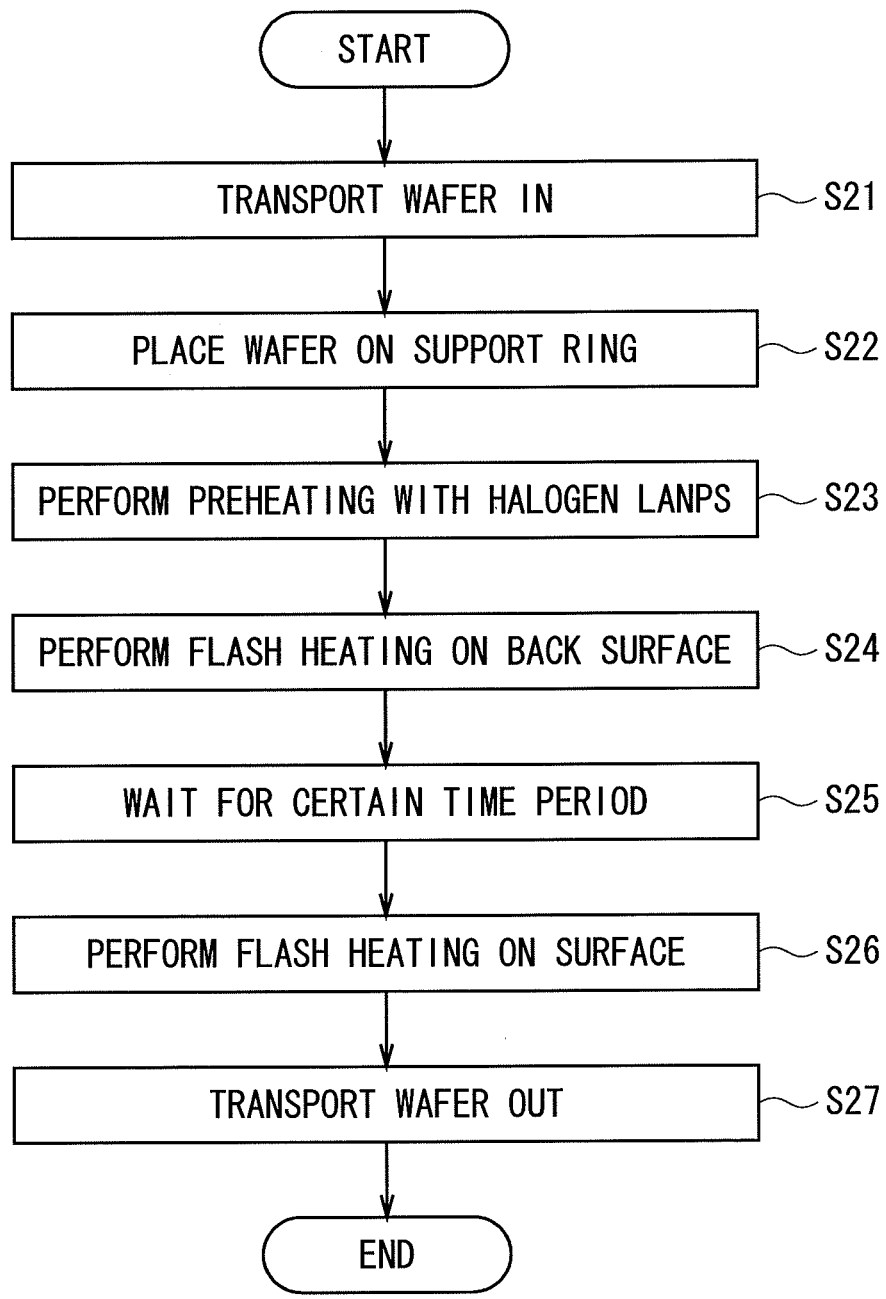
F I G . 1 5

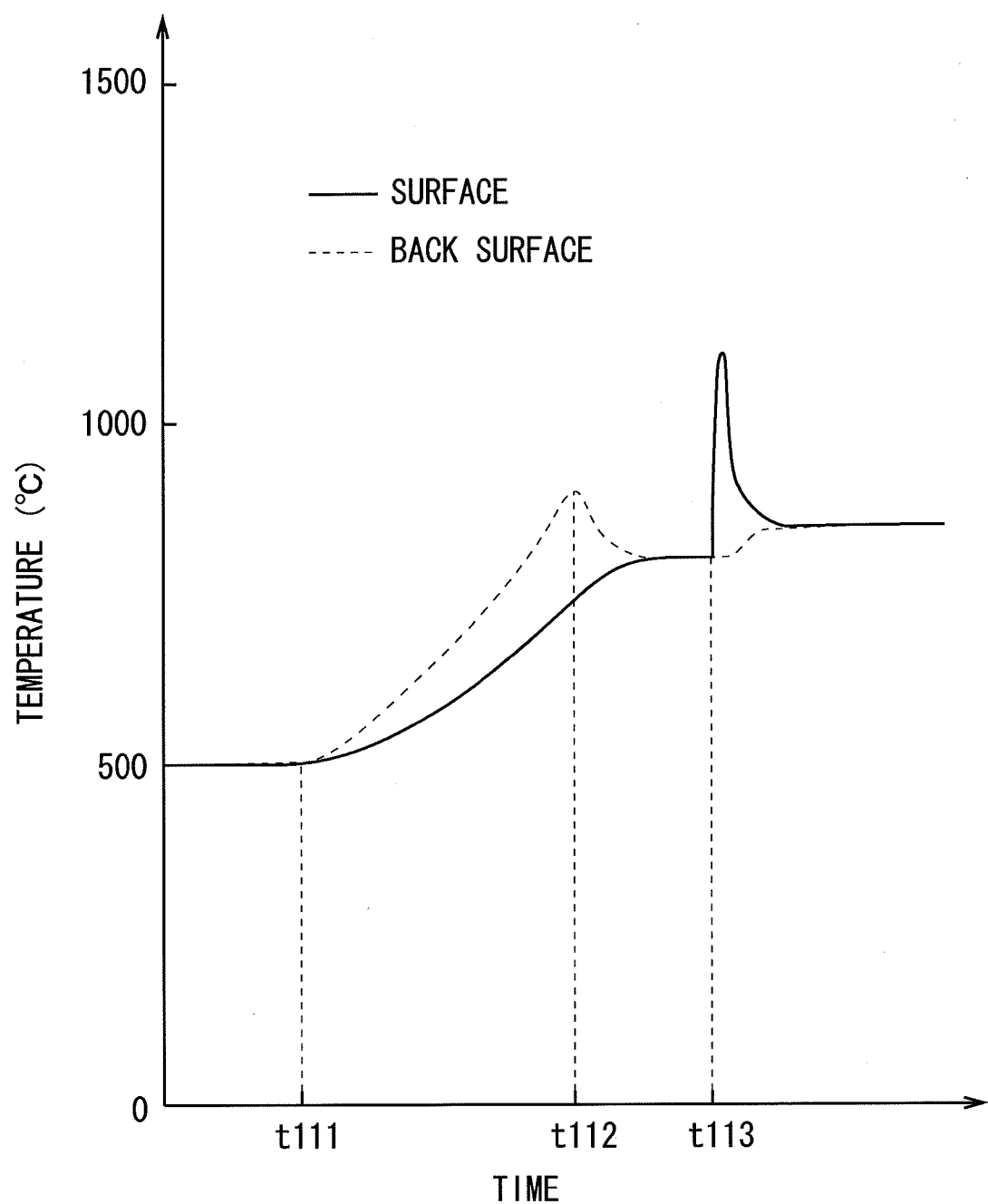
F I G . 1 6

F I G. 2 1
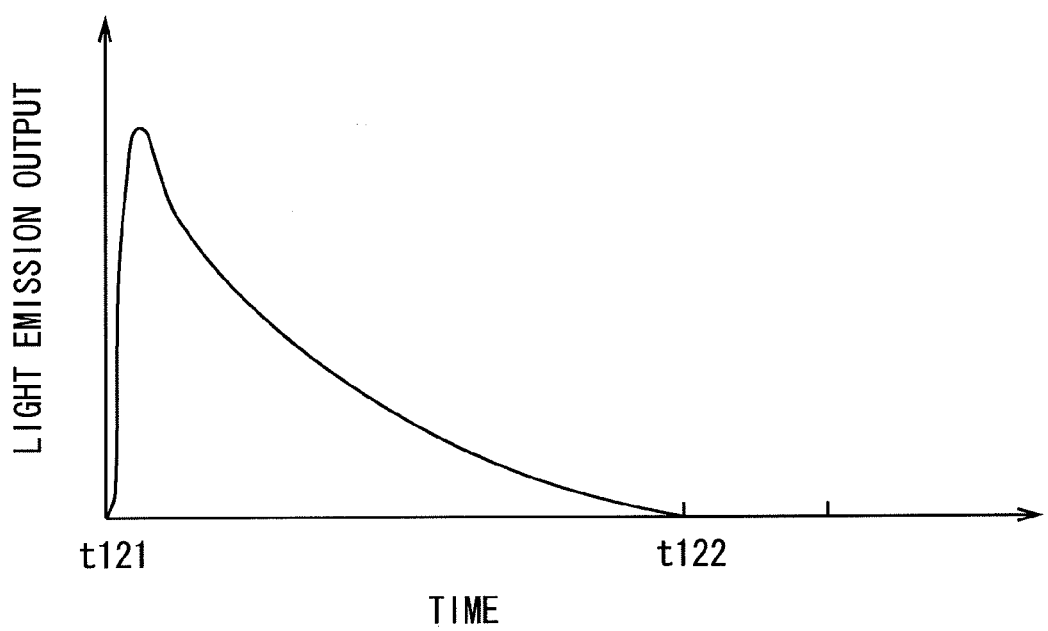
F I G. 2 2
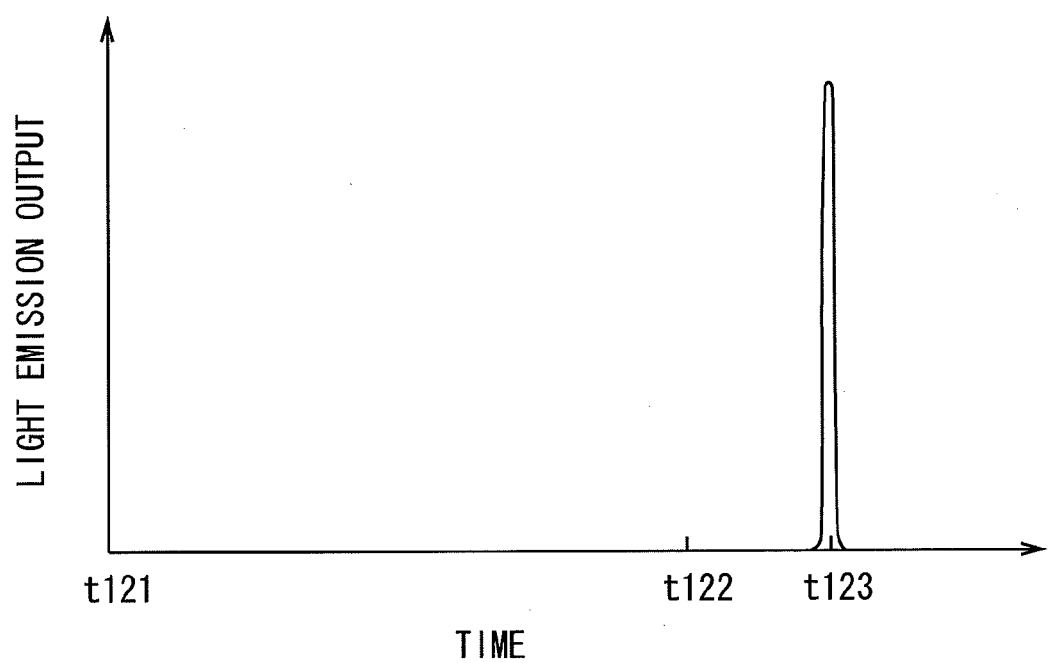

F I G . 2 3
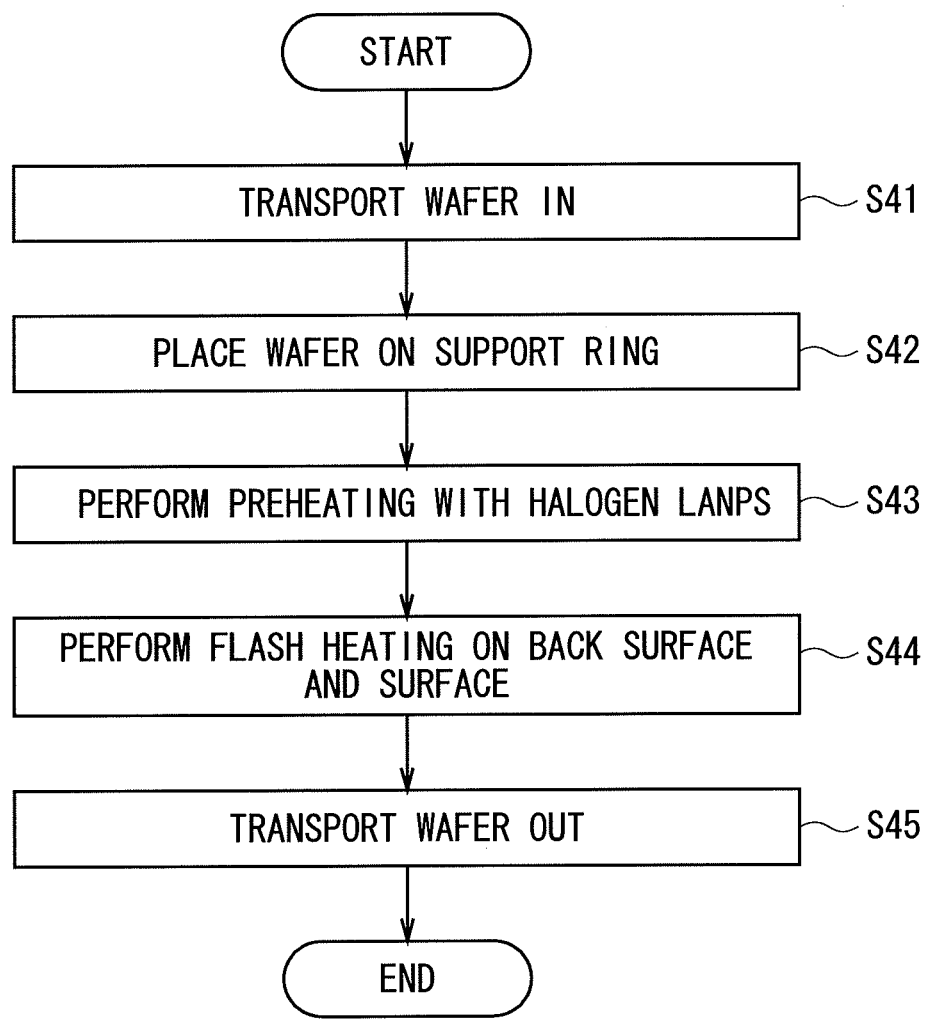

F I G. 3 5
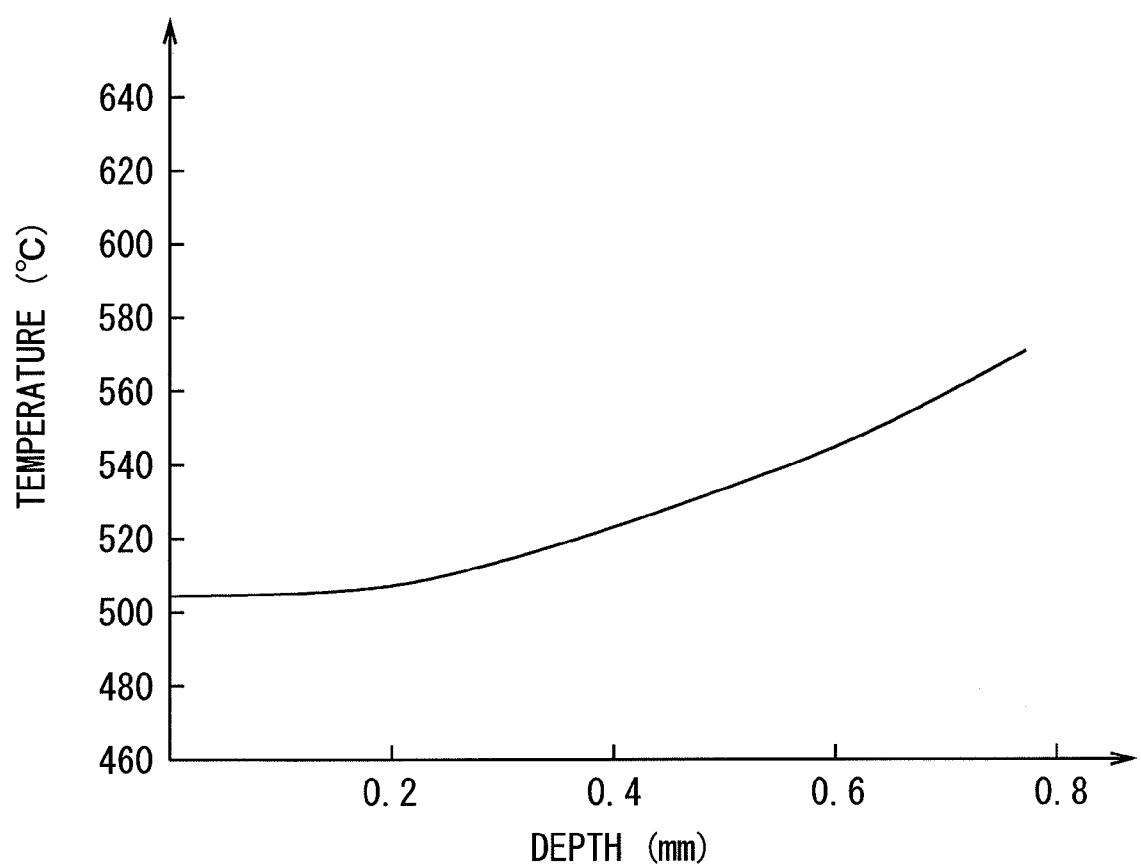

FIG. 40A

SURFACE ─────────────────────────────

BACK SURFACE ----------------------------------

FIG. 40B

SURFACE ─────────────────────────────

BACK SURFACE ----------------------------------

FIG. 40C

SURFACE ─────────────────────────────

BACK SURFACE ----------------------------------

FIG. 41A

SURFACE ─────────────

BACK SURFACE   ------------------------------

FIG. 41B

SURFACE ─────────────

BACK SURFACE   ------------------------------

FIG. 41C

SURFACE ─────────────

BACK SURFACE   ------------------------------

FIG. 42A
SURFACE 
BACK SURFACE 
FIG. 42B
SURFACE 
BACK SURFACE 
FIG. 42C
SURFACE 
BACK SURFACE 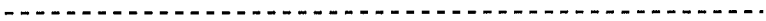

F I G. 4 3
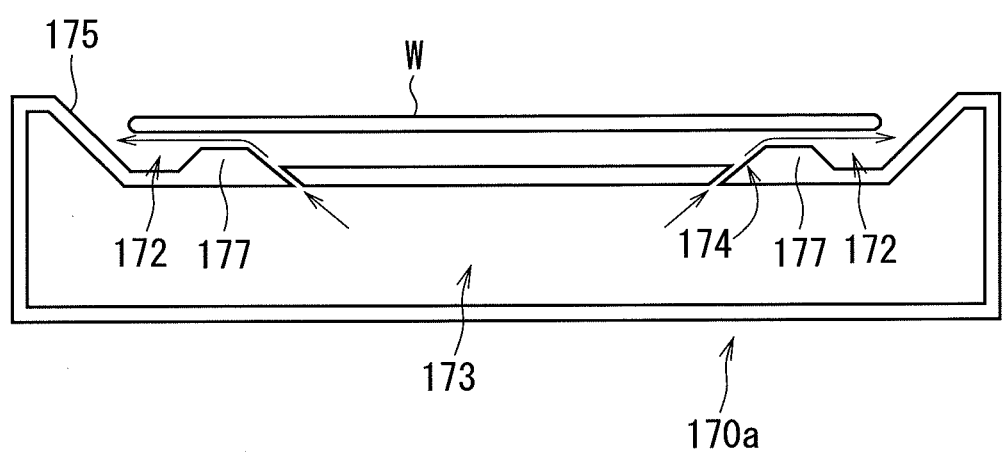

HEAT TREATMENT APPARATUS FOR HEATING SUBSTRATE BY IRRADIATION WITH FLASHES OF LIGHT, AND HEAT TREATMENT METHOD

BACKGROUND OF THE INVENTION

1. Field of the Invention

The present invention relates to a heat treatment apparatus and a heat treatment method for heating a thin plate-like precision electronic substrate (hereinafter, simply referred to as "substrate"), such as a semiconductor wafer and a glass substrate for a liquid crystal display device, by irradiating the substrate with flashes of light.

2. Description of the Background Art

In a process for manufacturing a semiconductor device, impurity doping is an essential step for forming a pn junction in a semiconductor wafer. At present, it is common practice to implement the impurity doping through an ion implantation process and a subsequent annealing process. The ion implantation process is a technique of ionizing impurity elements such as boron (B), arsenic (As), and phosphorus (P) and causing ions of the impurity elements to collide against the semiconductor wafer with a high acceleration voltage, to thereby physically implant the impurities into the semiconductor wafer. The impurities thus implanted are activated through the annealing process. When a length of annealing time in this annealing process is equal to or longer than about several seconds, the implanted impurities are deeply diffused due to heat, and consequently a junction depth is excessively greater than required, which may hinder successful formation of a device.

Accordingly, in recent years, flash lamp annealing (FLA) is attracting attention, which is an annealing technique capable of heating a semiconductor wafer in an extremely short time. The flash lamp annealing is a heat treatment technique in which a xenon flash lamp (hereinafter, simply by the term "flash lamp", a xenon flash lamp is meant) is used to irradiate a surface of a semiconductor wafer with flashes of light, to thereby cause only the surface of the semiconductor wafer implanted with impurities to rise the temperature in an extremely short time (several milliseconds or less).

A spectral distribution of emission from the xenon flash lamp ranges from ultraviolet to near-infrared regions. The wavelength of light emitted from the xenon flash lamp is shorter than that of light emitted from a conventional halogen lamp, and approximately coincides with a fundamental absorption band of a silicon semiconductor wafer. Thus, when a semiconductor wafer is irradiated with flashes of light emitted from the xenon flash lamp, the temperature of the semiconductor wafer can be raised rapidly, with only a small amount of light transmitted through the semiconductor wafer. Also, it has turned out that the irradiation of a semiconductor wafer with flashes of light in an extremely short time of several milliseconds or less allows the temperature to be selectively raised only in the vicinity of a surface of the semiconductor wafer. Therefore, when the temperature is raised in an extremely short time by means of the xenon flash lamp, only the activation of impurities can be achieved without causing deep diffusion of the impurities.

As a heat treatment apparatus using such a xenon flash lamp, US2006/0291835 discloses an apparatus in which a semiconductor wafer is placed on a hot plate and preheated to a predetermined temperature, and then irradiated with flashes of light emitted from flash lamps so that a surface temperature is raised to a desired processing temperature. Also, Japanese Patent Application Laid-Open No. 2009-231676 discloses an apparatus in which flash lamps are arranged on the upper side of a semiconductor wafer while halogen lamps are arranged on the lower side of the semiconductor wafer, so that the semiconductor wafer is preheated by being irradiated with light emitted from the halogen lamps and then a wafer surface is irradiated with flashes of light emitted from the flash lamps. In any case, the preheating is performed up to a temperature that does not cause diffusion of implanted impurities, and then the surface of the semiconductor wafer is irradiated with flashes of light so that the surface to a processing temperature is rapidly heated, to activate the impurities.

In the conventional flash lamp annealing described above, after the preheating, the surface of the semiconductor wafer is irradiated with flashes of light to thereby rapidly raise the surface temperature. In a case of performing the preheating with the hot plate as disclosed in US2006/0291835, a preheating time period of about one minute is required. Also in a case of performing the preheating with the halogen lamps as disclosed in Japanese Patent Application Laid-Open No. 2009-231676, a time length of several seconds to about ten seconds is required. Even though the flash heating is performed only for several milliseconds, the preheating requiring a long time not only lowers the throughput but also raises the temperature of component parts included a chamber that receives the semiconductor wafer therein. As a result, a problem arises that the rate of temperature drop of the semiconductor wafer after the flash heating is lowered.

Additionally, in a case where the surface of the preheated semiconductor wafer is irradiated with flashes of light to rapidly raise the surface temperature, the surface is a portion having the highest temperature with respect to the thickness direction of the semiconductor wafer, and inevitably the back surface is a portion having the lowest temperature with respect to the thickness direction of the semiconductor wafer. This consequently causes a tensile stress to act on the back surface, because large thermal expansion occurs in the surface of the semiconductor wafer while relative small degree of thermal expansion occurs in the back surface.

Particularly, there may be sometimes damage on the back surface of the semiconductor wafer. Such damage is often formed in a step prior to the flash lamp annealing. When the surface of the semiconductor wafer whose back surface has damage is irradiated with flashes of light and heated, a tensile stress acts on the back surface. This causes a problem that wafer cracking originating at the damage of the back surface occurs.

Moreover, normally, a device pattern is formed on the surface of the semiconductor wafer, and the light absorption rate varies depending on the pattern. Therefore, the absorption rate in a plane of the surface is not uniform. Accordingly, when the surface of the semiconductor wafer is irradiated with flashes of light, the temperature of a region where a pattern is formed and therefore the absorption rate is relatively high is higher than the temperature of a surrounding region. Thus, a variation in the temperature distribution occurs. That is, since the light absorption rate in the surface of the semiconductor wafer depends on the pattern, a problem arises that the temperature distribution in a wafer plane is non-uniform during irradiation with flashes of light. Such non-uniformity of the temperature distribution in a plane is more significantly observed as the intensity of irradiation with the flashes of light increases, and causes a variation in the degree of activation of impurities (in a region having a higher temperature, the activation progresses so that the sheet resistance value is lowered).

SUMMARY OF THE INVENTION

The present invention is directed to a heat treatment apparatus for heating a substrate having a pattern formed on a surface thereof by irradiating the substrate with flashes of light.

In an aspect of the present invention, the heat treatment apparatus includes: a chamber configured to receive a substrate; a support member configured to support a substrate within the chamber; a first flash lamp configured to irradiate a back surface of a substrate supported on the support member with flashes of light, to thereby perform a supplementary heating on the substrate; and a second flash lamp configured to irradiate a surface of the substrate having subjected to the supplementary heating with flashes of light, to thereby heat the surface to a predetermined target temperature.

Accordingly, the irradiation with flashes of light is partially performed on the back surface of the substrate in which a distribution of the light absorption rate in a plane is uniform. This can reduce the degree to which the light absorption rate in the surface of the substrate depends on a pattern thereon during irradiation with flashes of light.

In another aspect of the present invention, the heat treatment apparatus includes: a chamber configured to receive a substrate; a support member configured to support a substrate within the chamber; a first flash lamp configured to irradiate a back surface of a substrate supported on the support member with flashes of light, to thereby heat the substrate from the back surface side thereof; and a second flash lamp configured to irradiate a surface of a substrate supported on the support member with flashes of light, to thereby heat the substrate from the surface side thereof. A time period during which the first flash lamp emits flashes of light and a time period during which the second flash lamp emits flashes of light at least partially overlap each other.

Accordingly, during the irradiation with flashes of light, a lowest temperature region occurs inside the substrate with respect to the thickness direction. This prevents cracking of the substrate during the irradiation with flashes of light.

In still another aspect of the present invention, the heat treatment apparatus includes: a chamber configured to receive a substrate; a support member configured to support a substrate within the chamber; a first flash lamp configured to irradiate a substrate supported on the support member with flashes of light, to thereby raise the temperature of a surface of the substrate from a room temperature to an intermediate temperature; and a second flash lamp configured to irradiate the substrate whose temperature has been raised to the intermediate temperature with flashes of light, to thereby raise the temperature of the surface from the intermediate temperature to a target temperature.

Accordingly, since the irradiation with flashes of light is used to raise the temperature of the surface of the substrate from the room temperature to the target temperature, all heat treatments can be completed in a short time.

The present invention is also directed to a heat treatment method for heating a substrate having a pattern formed on a surface thereof by irradiating the substrate with flashes of light.

In an aspect of the present invention, the heat treatment method includes the steps of: (a) irradiating a back surface of a substrate supported on a support member within a chamber with flashes of light, to thereby perform a supplementary heating on said substrate; and (b) irradiating a surface of said substrate having subjected to the (b) supplementary heating with flashes of light, to thereby heat said surface to a predetermined target temperature.

Accordingly, the irradiation with flashes of light is partially performed on the back surface of the substrate in which a distribution of the light absorption rate in a plane is uniform. This can reduce the degree to which the light absorption rate in the surface of the substrate depends on a pattern thereon during irradiation with flashes of light.

In another aspect of the present invention, the heat treatment method includes the steps of: (a) irradiating a back surface of a substrate supported on a support member within a chamber with flashes of light, to thereby heat said substrate from the back surface side thereof; and (b) irradiating a surface of said substrate supported on said support member with flashes of light, to thereby heat said substrate from the surface side thereof. A time period during which the irradiation with flashes of light in said step (a) is performed and a time period during which the irradiation with flashes of light in said step (b) is performed at least partially overlap each other.

Accordingly, during the irradiation with flashes of light, a lowest temperature region occurs inside the substrate with respect to the thickness direction. This prevents cracking of the substrate during the irradiation with flashes of light.

In still another aspect of the present invention, the heat treatment method includes the steps of: (a) irradiating a substrate supported on a support member within a chamber with flashes of light, to thereby raise the temperature of a surface of said substrate from a room temperature to an intermediate temperature; and (b) irradiating said substrate whose temperature has been raised to said intermediate temperature with flashes of light, to thereby raise the temperature of said surface from said intermediate temperature to a target temperature.

Accordingly, since the irradiation with flashes of light is used to raise the temperature of the surface of the substrate from the room temperature to the target temperature, all heat treatments can be completed in a short time.

Therefore, an object of the present invention is to reduce the degree to which the light absorption rate in the surface of the substrate depends on a pattern thereon during irradiation with flashes of light.

Another object of the present invention is to prevent cracking of the substrate during irradiation with flashes of light.

Still another object of the present invention is to complete all heat treatments in a short time.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a configuration of principal parts of a heat treatment apparatus according to a first preferred embodiment;

FIG. 2 is a diagram showing an example of a Bernoulli chuck;

FIG. 3 is a perspective view showing the arrangement relationship between upper flash lamps and lower flash lamps;

FIG. 4 is a diagram showing a driving circuit for the flash lamps;

FIG. 5 is a flowchart showing process steps performed on a semiconductor wafer by the heat treatment apparatus shown in FIG. 1;

FIG. 11 is a diagram showing a configuration of principal parts of a heat treatment apparatus according to a third preferred embodiment;

FIG. 12 is a diagram showing changes in the temperatures of the surface and the back surface of the semiconductor wafer according to the third preferred embodiment;

FIG. 13 is a diagram showing a configuration of principal parts of a heat treatment apparatus according to a fourth preferred embodiment;

FIG. 14 is a perspective view showing the arrangement relationship among upper flash lamps, lower flash lamps, and halogen lamps;

FIG. 15 is a flowchart showing process steps performed on the semiconductor wafer by the heat treatment apparatus shown in FIG. 13;

FIG. 16 is a diagram showing changes in the temperatures of the surface and the back surface of the semiconductor wafer according to the fourth preferred embodiment;

FIG. 21 is a diagram showing a light emission output profile of the lower flash lamp according to the fifth preferred embodiment;

FIG. 22 is a diagram showing a light emission output profile of the upper flash lamp according to the fifth preferred embodiment;

FIG. 23 is a flowchart showing process steps performed on the semiconductor wafer by the heat treatment apparatus according to a sixth preferred embodiment;

FIG. 35 is a diagram showing a temperature distribution in the thickness direction of the semiconductor wafer according to the ninth preferred embodiment;

FIGS. 40A to 40C are timing charts showing an example of time periods during which the upper flash lamps and the lower flash lamps emit flashes of light;

FIGS. 41A to 41C are timing charts showing another example of the time periods during which the upper flash lamps and the lower flash lamps emit flashes of light;

FIGS. 42A to 42C are timing charts showing still another example of the time periods during which the upper flash lamps and the lower flash lamps emit flashes of light; and FIG. 43 is a diagram showing another example of the Bernoulli chuck.

DESCRIPTION OF THE PREFERRED EMBODIMENTS

Figure 6:
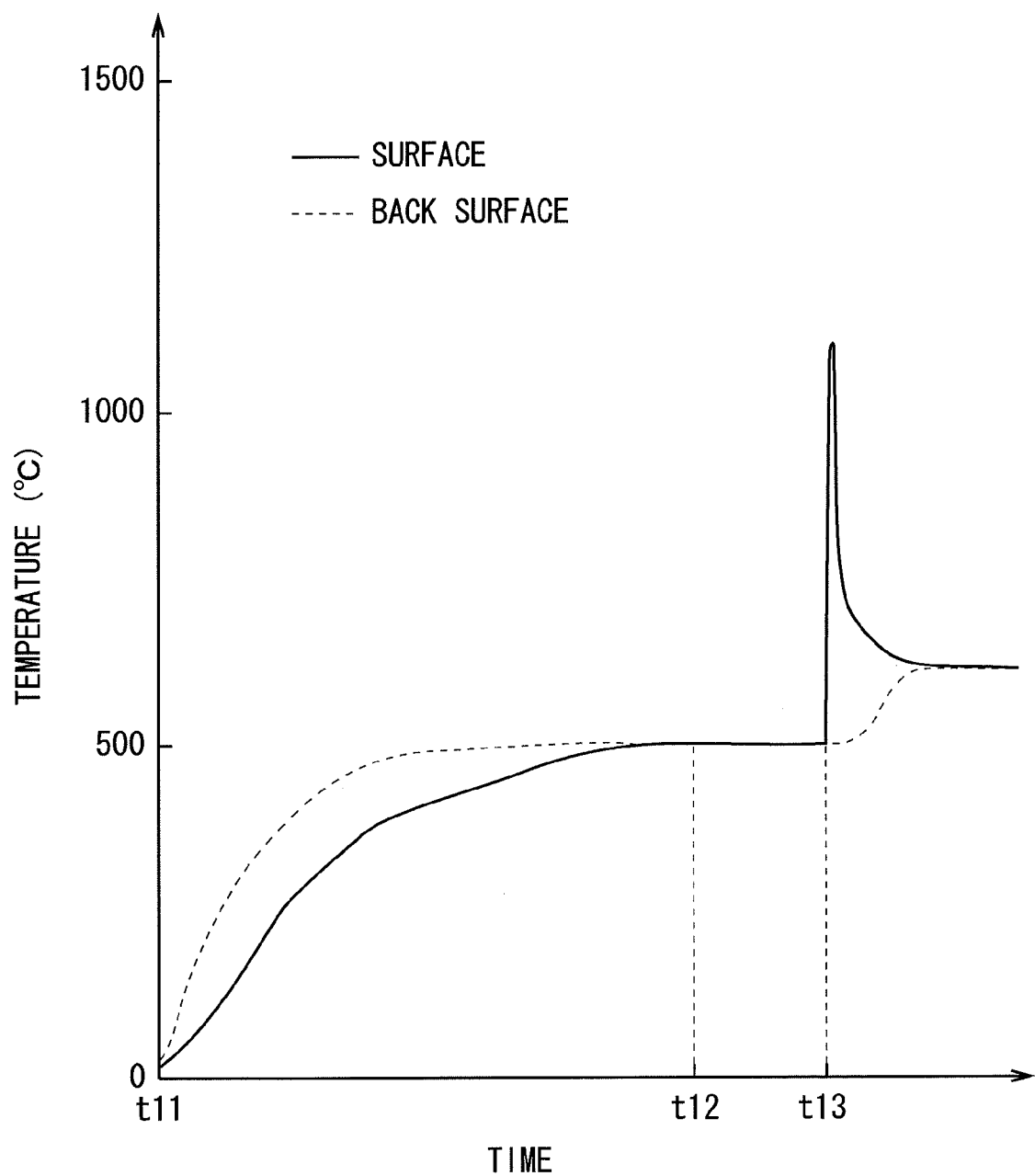
FIG. 6 is a diagram showing changes in the temperatures of a surface and a back surface of the semiconductor wafer according to the first preferred embodiment.

Hereinafter, some preferred embodiments of the present invention will be described in detail with reference to the accompanying drawings.

First Preferred Embodiment

FIG. 1 is a diagram showing a configuration of principal parts of a heat treatment apparatus 1 according to the present invention. The heat treatment apparatus 1 is a flash lamp annealer that performs a heat treatment on a substantially circular semiconductor wafer W serving as a substrate by irradiating the semiconductor wafer W with flashes of light. In FIG. 1 and subsequent Figures, the dimensions of components and the number of components are shown in exaggeration or in simplified form, as appropriate, for the sake of easier understanding.

The heat treatment apparatus 1 principally includes a chamber 6, a holder 7, a transfer part 79, an upper heating part 5, a lower heating part 4, a gas supply part 8, and an exhaust part 2. The chamber 6 has a substantially cylindrical shape, and receives the semiconductor wafer W therein. The holder 7 holds the semiconductor wafer W within the chamber 6. The transfer part 79 exchanges the semiconductor wafer W with the holder 7. The upper heating part 5 is provided above the chamber 6. The lower heating part 4 is provided below the chamber 6. The gas supply part 8 supplies a process gas into the chamber 6. The exhaust part 2 exhausts the chamber 6. The heat treatment apparatus 1 also includes a controller 3 that controls these parts and causes them to perform the heat treatment on the semiconductor wafer W.

The chamber 6 includes a chamber side portion 63 having an inner wall. The inner wall has a substantially cylindrical shape with upper and lower ends thereof being opened. The chamber side portion 63 is made of a metal material (such as stainless steel) with excellent strength and heat resistance. An upper chamber window 61 and a lower chamber window 64 are mounted to an upper opening and a lower opening of the chamber 6, respectively, which are thereby closed. A space surrounded by the chamber side portion 63, the upper chamber window 61, and the lower chamber window 64 is defined as a heat treatment space 65.

The upper chamber window 61, which forms the ceiling of the chamber 6, is a disk-shaped member made of quartz, and functions as a quartz window that allows light emitted from the upper heating part 5 to transmit therethrough into the heat treatment space 65. Likewise, the lower chamber window 64, which forms the floor of the chamber 6, is a disk-shaped member made of quartz, and functions as a quartz window that allows light emitted from the lower heating part 4 to transmit therethrough into the heat treatment space 65.

To maintain the hermeticity of the heat treatment space 65, the upper chamber window 61 and the lower chamber window 64 are sealed to the chamber side portion 63 with O-rings (not shown). To be specific, the O-rings are interposed between a peripheral portion of a lower surface of the upper chamber window 61 and the chamber side portion 63 and between a peripheral portion of an upper surface of the lower chamber window 64 and the chamber side portion 63, to prevent inflow and outflow of any gas through a gap therebetween.

The chamber side portion 63 has a transport opening 66 through which the semiconductor wafer W is transported in and out. The transport opening 66 is openable and closable by means of a gate valve (not shown). When the transport opening 66 is opened, a transport robot outside the apparatus is allowed to transport the semiconductor wafer W into and out of the chamber 6. When the transport opening 66 is closed, the heat treatment space 65 is an enclosed space so that the ventilation between the heat treatment space 65 and the outside is blocked.

The holder 7 provided within the chamber 6 includes a Bernoulli chuck 170 and a light shielding member 71. The light shielding member 71 is fixed to an inside wall surface of the chamber side portion 63. The light shielding member 71 may be made of a material opaque to flashes of light emitted from flash lamps FL, for example, ceramic such as silicon carbide (SiC), aluminum nitride (AlN), and boron nitride (BN). The light shielding member 71 is in the shape of an annular ring protruding from the inner wall of the chamber side portion 63 having the substantially cylindrical shape. The Bernoulli chuck 170 is placed on an inner peripheral portion of an upper surface of the light shielding member 71.

FIG. 2 is a diagram showing an example of the Bernoulli chuck 170. The Bernoulli chuck 170 is made of quartz, which allows the flashes of light emitted from the flash lamps FL to transmit therethrough. The Bernoulli chuck 170 has a hollow portion 173 provided within a wall surface made of quartz. The quartz-made wall surface at the ceiling of the Bernoulli chuck 170 is a circular placement surface 171 for the placement of the semiconductor wafer W thereon. The diameter of the placement surface 171 is smaller than the diameter of the semiconductor wafer W. A recess 172 having an annular ring shape is provided so as to surround the placement surface 171. A guide 175 having an annular ring shape is provided so as to surround the recess 172.

The placement surface 171 has a gas ejection port 174. As shown in FIG. 2, the ejection port 174 extends obliquely upward from the center side of the Bernoulli chuck 170. The ejection port 174 may include a plurality of circular holes provided along a circle concentric with the circular placement surface 171, or may include a plurality of slit-like holes. However, the ejection port 174 should be formed such that the exit thereof is located inside an end edge portion of the semiconductor wafer W held by the Bernoulli chuck 170. The Bernoulli chuck 170 has a through hole (not shown) that allows a pin of the transfer part 79 to pass therethrough. The atmosphere inside the through hole and the atmosphere in the hollow portion 173 are isolated from each other.

A chucking gas supply part 180 supplies a nitrogen gas into the hollow portion 173 of the Bernoulli chuck 170. As shown in FIG. 1, the chucking gas supply part 180 includes a feed pipe 184, a gas supply source 181, a valve 182, and a flow rate control valve 183. One end of the feed pipe 184 is connected in communication with the hollow portion 173 of the Bernoulli chuck 170, and the other end thereof is connected to the gas supply source 181. The valve 182 and the flow rate control valve 183 are provided in the middle of a path of the feed pipe 184. Opening the valve 182 causes a chucking gas (in this preferred embodiment, nitrogen ($N_2$)) to be supplied from the gas supply source 181 to the hollow portion 173 of the Bernoulli chuck 170. The flow rate of nitrogen supplied from the chucking gas supply part 180 to the Bernoulli chuck 170 is controlled by the flow rate control valve 183.

When the valve 182 is opened to supply a nitrogen gas from the chucking gas supply part 180 to the hollow portion 173, the internal pressure of the hollow portion 173 rises so that the nitrogen gas is ejected through the ejection port 174. When the nitrogen gas is supplied from the chucking gas supply part 180 to the hollow portion 173 in a state where the semiconductor wafer W is placed on the placement surface 171 of the Bernoulli chuck 170, the nitrogen gas is ejected through the ejection port 174 toward a peripheral portion of a lower surface of the semiconductor wafer W. Since the ejection port 174 extends obliquely upward, as shown in FIG. 2, the ejected nitrogen gas causes the semiconductor wafer W to float slightly above the placement surface 171. Thus, the ejected nitrogen gas flows through a gap occurring between the peripheral portion of the lower surface of the semiconductor wafer W and the placement surface 171, in a direction toward the recess 172 (that is, in a direction from the central portion toward the end edge portion of the semiconductor wafer W).

Meanwhile, when a fluid such as nitrogen flows, static pressure which is pressure the fluid exerts against the outside is reduced (Bernoulli effect). As the flow rate of nitrogen increases, reduction in the static pressure also increases. Accordingly, pressure in the gap between the lower surface of the semiconductor wafer W and the placement surface 171, through which the nitrogen is flowing, is smaller than the atmospheric pressure. As a result, the semiconductor wafer W receives, from the surrounding atmosphere, the pressure that presses the semiconductor wafer W against the placement surface 171. In other words, ejecting nitrogen obliquely upward through the ejection port 174 causes the semiconductor wafer W to float slightly above the placement surface 171 due to the pressure exerted by the ejection of nitrogen, and additionally causes the pressure that presses the semiconductor wafer W against the placement surface 171 to act on the semiconductor wafer W due to the nitrogen flowing through the gap between the semiconductor wafer W and the placement surface 171 which is formed as a result of the floating. This ejection pressure of nitrogen and the Bernoulli effect of a nitrogen stream cause the Bernoulli chuck 170 to adsorptively hold the semiconductor wafer W in a non-contact fashion.

Preferably, in a state where the semiconductor wafer W is held in a non-contact fashion by the Bernoulli chuck 170, the interval between the end edge portion of the semiconductor wafer W and the recess 172 (the height from the recess 172 to the end edge portion) is 3 mm or longer. This is for preventing the end edge portion from contacting with the recess 172, in a case where deformation of the semiconductor wafer W occurs during irradiation with the flashes of light.

There is a risk that the semiconductor wafer W held in a non-contact fashion due to the Bernoulli effect may slip sideways in a horizontal direction. Therefore, the guide 175 is provided around the recess 172. An upper end of the guide 175 is higher than a height level of the semiconductor wafer W that is held in a non-contact fashion by the ejection of nitrogen. At this height level, the inner diameter of the guide 175 is slightly larger than a the diameter of the semiconductor wafer W. Accordingly, the horizontal position of the semiconductor wafer W held in a non-contact fashion is restricted by the guide 175. To prevent cracking of the semiconductor wafer W which may be caused by the semiconductor wafer W coming into contact with the guide 175 when irradiated with flashes of light, it is preferable that an inside wall surface of the guide 175 is configured as a tapered surface.

The semiconductor wafer W transported into the chamber 6 is, by the Bernoulli chuck 170, held within the chamber 6 in a non-contact fashion and with a horizontal attitude (the attitude in which the normal of a main surface of the semiconductor wafer W extends in the vertical direction). In this preferred embodiment, the light shielding member 71 is made of a material opaque to light emitted from the flash lamps FL. Therefore, in an area around the Bernoulli chuck 170, the upper heating part 5 and the lower heating part 4 are optically isolated from each other.

The transfer part 79 is provided below the holder 7. The transfer part 79 is configured to be movable in the horizontal direction and in the vertical direction by a drive mechanism (not shown). When not performing a transfer operation, the transfer part 79 waits in a standby position located under the light shielding member 71. In a case of transferring the semiconductor wafer W to the holder 7, the transfer part 79 horizontally moves from the standby position to a position under the Bernoulli chuck 170, and then moves up along the vertical direction. As a result, an upper end of the pin of the transfer part 79 protrudes from the placement surface 171 of the Bernoulli chuck 170. After the transfer operation is completed, the transfer part 79 returns to the standby position again.

The gas supply part 8 supplies the process gas into the heat treatment space 65 of the chamber 6. The gas supply part 8 includes the process gas supply source 81 and the valve 82 and, by opening the valve 82, supplies the process gas into the heat treatment space 65. Examples of the process gas supplied by the gas supply part 8 include inert gases of nitrogen ($N_2$), argon (Ar), and helium (He), and reactive gases of oxygen ($O_2$), hydrogen ($H_2$), chlorine ($Cl_2$), water vapor ($H_2O$), hydrogen chloride (HCl), ozone ($O_3$), and ammonia ($NH_3$). The process gas supply source 81 may be configured with a gas tank and a feed pump provided in the heat treatment apparatus 1, or may adopt a utility of a factory where the heat treatment apparatus 1 is installed.

The exhaust part 2 includes an exhaust apparatus 21 and a valve 22 and, by opening the valve 22, exhausts the atmosphere within the chamber 6. As the exhaust apparatus 21, a vacuum pump is adoptable, or an exhaust utility of the factory where the heat treatment apparatus 1 is installed is adoptable. When a vacuum pump is adopted as the exhaust apparatus 21, the pressure within the chamber 6 can be reduced down to a vacuum atmosphere by exhausting the atmosphere of the heat treatment space 65 that is an enclosed space without supplying the process gas from the gas supply part 8. Even when a vacuum pump is not adopted as the exhaust apparatus 21, the pressure within the chamber 6 can be reduced down to pressure lower than the atmospheric pressure by performing exhaust without supplying the process gas from the gas supply part 8.

In this preferred embodiment, while the semiconductor wafer W is held by the holder 7, the atmosphere in the heat treatment space 65 is divided into upper and lower spaces by the light shielding member 71, the Bernoulli chuck 170, and the semiconductor wafer W. Therefore, it is preferable that the gas supply part 8 supplies the process gas to each of the spaces of the heat treatment space 65 above and below the holder 7 while the exhaust part 2 exhausts each of the spaces, as shown in FIG. 1.

The upper heating part 5 is provided above the chamber 6. The upper heating part 5 includes a light source having a plurality of flash lamps FL, and a reflector 52 provided so as to cover the upper side of the light source. The upper heating part 5 irradiates an upper surface of the semiconductor wafer W, which is supported within the chamber 6 by the Bernoulli chuck 170, with flashes of light emitted from the flash lamps FL through the upper chamber window 61 made of quartz.

On the other hand, the lower heating part 4 is provided under the chamber 6. The lower heating part 4 includes a light source having a plurality of flash lamps FL, and a reflector 42 provided so as to cover the lower side of the light source. The lower heating part 4 irradiates a lower surface of the semiconductor wafer W, which is supported within the chamber 6 by the Bernoulli chuck 170, with flashes of light emitted from the flash lamps FL through the lower chamber window 64 made of quartz. Herein, particularly when distinction is necessary between the flash lamps FL of the upper heating part 5 and the flash lamps FL of the lower heating part 4, the flash lamps FL of the upper heating part 5 will be referred to as "upper flash lamps UFL" while the flash lamps FL of the lower heating part 4 will be referred to as "lower flash lamps LFL". The upper flash lamps UFL and the lower flash lamps LFL are different in the arrangement position, but they are rod-like xenon flash lamps that are identical to each other. When no distinction is required therebetween, they will be simply referred to as "flash lamps FL".

FIG. 3 is a perspective view showing the arrangement relationship between the upper flash lamps UFL and the lower flash lamps LFL. Each of the plurality of upper flash lamps UFL is a rod-like lamp having an elongated cylindrical shape. The upper flash lamps UFL are arrayed in a plane such that their longitudinal directions are parallel to one another along the main surface of the semiconductor wafer W held by the holder 7 (that is, along the horizontal direction). Likewise, each of the plurality of lower flash lamps LFL is a rod-like lamp having an elongated cylindrical shape. The lower flash lamps LFL are arrayed in a plane such that their longitudinal directions are parallel to one another along the main surface of the semiconductor wafer W held by the holder 7.

As shown in FIG. 3, the upper flash lamps UFL of the upper heating part 5 and the lower flash lamps LFL of the lower heating part 4 are arranged in directions perpendicular to each other. That is, when seen from the top side of the upper heating part 5, an array of the upper flash lamps UFL and an array of the lower flash lamps LFL are arranged in the form of parallel crosses.

FIG. 4 is a diagram showing a driving circuit for the flash lamps FL. As shown in FIG. 4, a capacitor 93, a coil 94, the flash lamp FL, and an IGBT (Insulated Gate Bipolar Transistor) 96 are connected in series. As shown in FIG. 4, the controller 3 includes a pulse generator 31 and a waveform set part 32, and is connected to an input part 33. Various known input devices such as a keyboard, a mouse, and a touch panel are adoptable as the input part 33. The waveform set part 32 sets a waveform of a pulse signal based on the input given from the input part 33, and the pulse generator 31 generates a pulse signal in accordance with the waveform.

The flash lamp FL includes a rod-like glass tube (discharge tube) 92 and a trigger electrode 91. A xenon gas is sealed within the glass tube 92, and an anode and a cathode are arranged at both end portions of the glass tube 92. The trigger electrode 91 is provided on an outer circumferential surface of the glass tube 92. A power unit 95 applies a predetermined voltage to the capacitor 93, and thereby the capacitor 93 is charged in accordance with the applied voltage (charging voltage). To the trigger electrode 91, a trigger circuit 97 is able to apply a high voltage. A timing when the trigger circuit 97 applies a voltage to the trigger electrode 91 is controlled by the controller 3.

The IGBT 96 is a bipolar transistor having a MOSFET (Metal Oxide Semiconductor Field effect transistor) incorporated in the gate thereof. The IGBT 96 is a switching element suitable for a large amount of power. The pulse generator 31 of the controller 3 applies a pulse signal to the gate of the IGBT 96. When a voltage (High voltage) equal to or greater than a predetermined value is applied to the gate of the IGBT 96, the IGBT 96 is brought into an ON state, and when a voltage (Low voltage) less than the predetermined value is applied to the gate of the IGBT 96, the IGBT 96 is brought into an OFF state. In this manner, the driving circuit including the flash lamp FL is switched on and off by means of the IGBT 96. Switching on and off of the IGBT 96 enables intermissive connection between the flash lamp FL and the corresponding capacitor 93.

Even when, while the capacitor 93 is charged, the IGBT 96 is brought into the ON state so that a high voltage is applied across both electrodes of the glass tube 92, no electricity flows through the glass tube 92 in a normal state because the xenon gas is electrically insulating. However, if the trigger circuit 97 applies a voltage to the trigger electrode 91 to cause an insulation breakdown, an electrical discharge between both electrodes allows a current to instantaneously flow through the glass tube 92. Excitation of atoms or molecules of xenon occurring at that time causes a light emission.

The driving circuit as shown in FIG. 4 is provided individually for each of the plurality of upper flash lamps UFL of the upper heating part 5 and the plurality of lower flash lamps LFL of the lower heating part 4. This makes it possible that the upper flash lamps UFL and the lower flash lamps LFL are controlled in different manners.

Referring to FIG. 1 again, the reflector 52 of the upper heating part 5 is provided above the plurality of upper flash lamps UFL so as to cover the whole of them. A basic function of the reflector 52 is to reflect flashes of light emitted from the plurality of upper flash lamps UFL toward the heat treatment space 65. The reflector 42 of the lower heating part 4 is provided below the plurality of lower flash lamps LFL so as to cover the whole of them. A basic function of the reflector 42 is to reflect light emitted from the plurality of lower flash lamps LFL toward the heat treatment space 65. The reflector 52 and the reflector 42 are formed of aluminum alloy plates, with surfaces thereof (the surfaces facing the flash lamps FL) being roughened through a blast process and thus textured.

The controller 3 controls the above-described various operation mechanisms provided in the heat treatment apparatus 1. A hardware configuration of the controller 3 is identical to that of an ordinary computer. More specifically, the controller 3 includes a CPU for performing various types of computation, a ROM which is a read only memory storing a basic program, a RAM which is a random access memory storing various types of information, and a magnetic disk storing control software and data. The CPU of the controller 3 executes a predetermined processing program, and thereby a process proceeds in the heat treatment apparatus 1. As shown in FIG. 4, the controller 3 includes the pulse generator 31 and the waveform set part 32. As described above, the waveform set part 32 sets a waveform of a pulse signal based on the input given from the input part 33, and in accordance with the waveform, the pulse generator 31 outputs a pulse signal to the gate of the IGBT 96.

Next, a description will be given to process steps performed on the semiconductor wafer W by the heat treatment apparatus 1 having the above-described configuration. FIG. 5 is a flowchart showing process steps on the semiconductor wafer W by the heat treatment apparatus 1. The process steps performed by the heat treatment apparatus 1, which will be described below, are proceeded along with the controller 3 controlling the operation mechanisms of the heat treatment apparatus 1.

Firstly, the gate valve (not shown) is opened so that the transport opening 66 is opened. The transport robot provided outside the apparatus transports the semiconductor wafer W that is a processing object into the chamber 6 through the transport opening 66 (step S11). In the first preferred embodiment, the semiconductor wafer W serving as the processing object is a silicon semiconductor substrate having a pattern formed on a front surface thereof and implanted with impurities. The formation of the pattern and the implantation of the impurities may be implemented by, for example, a photolithography apparatus and an ion implantation apparatus provided independently of the heat treatment apparatus 1.

Such a semiconductor wafer W is held by a hand of the transport robot, and the hand enters the chamber 6 through the transport opening 66 and then stops at a position immediately above the holder 7. Then, the transfer part 79 horizontally moves from the standby position located under the light shielding member 71 to a position located under the Bernoulli chuck 170, and then moves up along the vertical direction. Thus, the pin of the transfer part 79 passes through the through hole of the Bernoulli chuck 170, and protrudes up from the placement surface 171, to receive the semiconductor wafer W from the hand of the transport robot. Then, the hand of the transport robot exits the chamber 6, and at the same time the transport opening 66 is closed to configure the heat treatment space 65 of the chamber 6 as an enclosed space. Then, the transfer part 79 that has received the semiconductor wafer W moves down, and thereby the semiconductor wafer W is transferred from the pin of the transfer part 79 to the Bernoulli chuck 170 and placed on the placement surface 171 (step S12). The transfer part 79 having transferred the semiconductor wafer W to the Bernoulli chuck 170 returns to the standby position.

Here, the front surface of the semiconductor wafer W means a main surface on which a device is to be formed. Hereinafter, the "front surface" is referred to simply by the term "surface". On the surface, as described above, the pattern is formed and the impurities are implanted. In the surface of the semiconductor wafer W, a distribution of the absorption rate in a plane is not uniform, because the light absorption rate varies due to the pattern. On the other hand, the back surface of the semiconductor wafer W means a main surface opposite to the surface. On the back surface of the semiconductor wafer W, normally, neither a film nor a pattern is formed. Here, forming the film on the surface may inevitably requires a thin film, such as an oxide film, a nitride film, or a polysilicon film, to be formed on the back surface, too. In such a case, the film is formed uniform. In any case, in the back surface of the semiconductor wafer W, a distribution of the light absorption rate in a plane is uniform.

In the first preferred embodiment, the semiconductor wafer W is transported into the chamber 6 and placed on the Bernoulli chuck 170 with the surface of the semiconductor wafer W serving as an upper surface. The upper surface of the semiconductor wafer W means the main surface facing upward in the vertical direction, and the lower surface means the surface facing downward. Therefore, in some cases, the surface of the semiconductor wafer W may be the upper surface facing upward, and in other cases, the surface of the semiconductor wafer W may be the lower surface facing downward.

After the transport opening 66 is closed to configure the heat treatment space 65 as an enclosed space, the valve 82 is opened so that the process gas (in this preferred embodiment, a nitrogen gas) is supplied from the gas supply part 8 into the heat treatment space 65. Along with this, the valve 22 is opened, and the exhaust part 2 exhausts the heat treatment space 65. As a result, a stream of nitrogen gas is produced in the heat treatment space 65 of the chamber 6. Thus, a nitrogen atmosphere is created in a region around the semiconductor wafer W held by the holder 7. From the viewpoint of enhancing the efficiency of replacement of the atmosphere in the chamber 6, it is preferable that, without supplying the process gas, the exhaust part 2 exhausts the heat treatment space 65 to once create an atmosphere of reduced pressure that is lower than the atmospheric pressure, and then the process gas is supplied from the gas supply part 8.

Simultaneously with the replacement of the atmosphere in the chamber 6, the valve 182 is opened so that the nitrogen gas is supplied from the chucking gas supply part 180 to the hollow portion 173 of the Bernoulli chuck 170. The nitrogen gas supplied to the hollow portion 173 is ejected obliquely upward through the ejection port 174, and thereby the semiconductor wafer W is adsorptively held in a non-contact fashion by the Bernoulli chuck 170 due to the ejection pressure of nitrogen and the Bernoulli effect of the nitrogen stream (step S13).

After the semiconductor wafer W is held in a non-contact fashion by the Bernoulli chuck 170, a first flash heating is performed in which the plurality of flash lamps FL (lower flash lamps LFL) of the lower heating part 4 irradiate the back surface of the semiconductor wafer W with flashes of light (step S14). That is, in this preferred embodiment, without performing a conventional preheating with a hot plate or halogen lamps, the flash heating performed in which the semiconductor wafer W having the room temperature is irradiated with flashes of light. FIG. 6 is a diagram showing changes in the temperatures of the surface and the back surface of the semiconductor wafer W. In FIG. 6, the solid line indicates the surface temperature of the semiconductor wafer W, and the dotted line indicates the back surface temperature of the semiconductor wafer W.

At a predetermined time point t11, under control by the controller 3, the plurality of flash lamps FL of the lower heating part 4 emit flashes of light. For the irradiation with flashes of light emitted from the flash lamps FL, the power unit 95 preliminarily stores charges in the capacitor 93. Then, in a state where the charges are stored in the capacitor 93, the pulse generator 31 of the controller 3 outputs a pulse signal to the IGBT 96 to perform ON/OFF driving of the IGBT 96.

The waveform of the pulse signal can be defined by inputting, from the input part 33, a recipe that sequentially sets a pulse width time (ON time) and a pulse interval time (OFF time) as parameters. An operator inputs such a recipe from the input part 33 to the control part 3, and thus the waveform set section 32 of the controller 3 sets the pulse waveform that repeats ON and OFF. Then, the pulse generator 31 outputs a pulse signal in accordance with the pulse waveform set by the waveform set part 32. As a result, a pulse signal that repeats ON and OFF is applied to the gate of the IGBT 96, and thereby the ON/OFF driving of the IGBT 96 is controlled. More specifically, when a pulse signal inputted to the gate of the IGBT 96 is ON, the IGBT 96 is brought into the On state so that the circuit including the capacitor 93 and the flash lamp FL is closed, while when the pulse signal is OFF, the IGBT 96 is brought into the OFF state so that the circuit is opened.

The controller 3 controls the trigger circuit 97 to apply a high voltage (trigger voltage) to the trigger electrode 91 in synchronization with a timing when the pulse signal outputted from the pulse generator 31 is brought into ON. The pulse signal is inputted to the gate of the IGBT 96 in a state where the charges are stored in the capacitor 93, and additionally a high voltage is applied to the trigger electrode 91 in synchronization with the timing when the pulse signal is switched on. Thereby, while the pulse signal is ON, a current always flows between both electrodes of the glass tube 92. The excitation of atoms or molecules of xenon occurring at that time causes a light emission.

The controller 3 outputs the pulse signal that repeats ON and OFF to the gate of the IGBT 96, and simultaneously a high voltage is applied to the trigger electrode 91 in synchronization with the timing when the pulse signal is switched on. Thereby, a current intermittently flows through the circuit including the flash lamp FL. In this manner, the IGBT 96 serving as a switching element is connected in the circuit, and the pulse signal that repeats ON and OFF is outputted to the gate of the IGBT 96. Thereby, supply of the charges from the capacitor 93 to the flash lamp FL is made intermittent by the IGBT 96. Thus, the current flowing to the flash lamp FL is controlled. To be specific, the current having a saw-tooth waveform flows through the flash lamp FL. Thus, when the pulse signal inputted to the gate of the IGBT 96 is ON, the value of the current flowing through the glass tube 92 of the flash lamp FL increases, while when the pulse signal inputted to the gate of the IGBT 96 is OFF, the value of the current flowing through the glass tube 92 of the flash lamp FL decreases. Each current waveform corresponding to each pulse is defined by the constant of the coil 94.

The current having such a saw-tooth waveform flows, to cause light emission from the flash lamp FL. The supply of charges from the capacitor 93 to the flash lamp FL is made intermittent by the IGBT 96, and thus the waveform of the current flowing through the flash lamp FL is shaped into a saw-tooth waveform. This, in other words, achieves a chopper control of the light emission from the flash lamp FL. That is, the charges stored in the capacitor 93 are divided and separately consumed, so that the flash lamp FL repeatedly flashes in an extremely short time. However, before the value of the current flowing through the flash lamp FL completely reaches "0", the next pulse is applied to the gate of the IGBT 96 so that the current value increases again. Therefore, even while the flash lamp FL is repeatedly flashing, the light emission output does not completely reach "0". Accordingly, when a pulse signal having a relatively short interval is outputted to the IGBT 96, the flash lamp FL continuously emits light The waveform of the pulse signal can be set in any manner by defining the pulse width time and the pulse interval time. Therefore, the ON/OFF driving of the IGBT 96 can be also arbitrarily controlled. By setting a large number of pulses having a relatively short pulse interval, a time period during which the flash lamps FL emit light can be appropriately set in a range of 10 to 1000 milliseconds.

Figure 7:
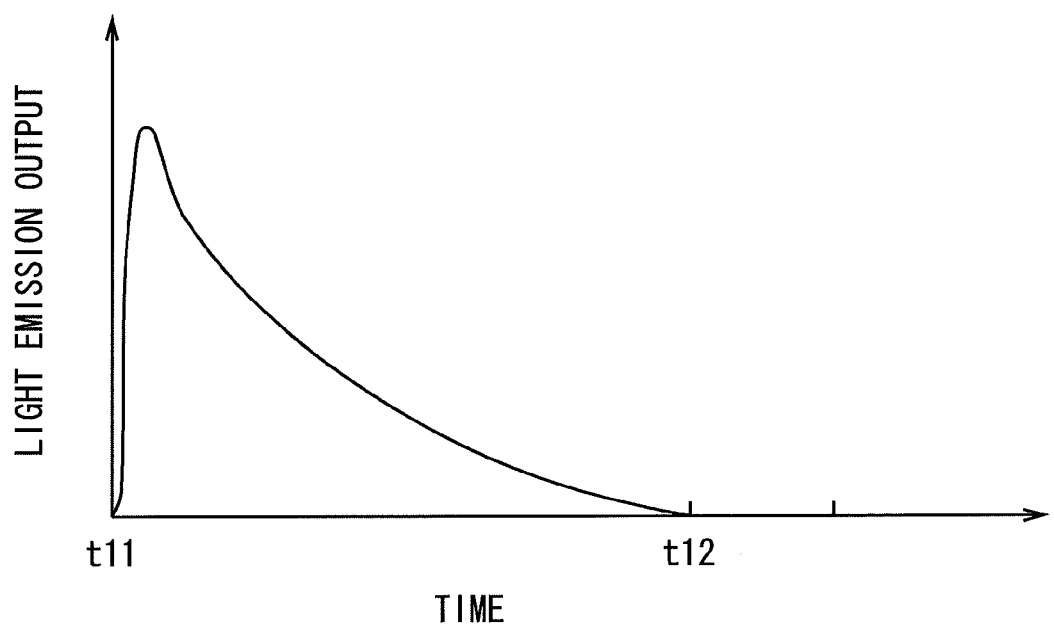
FIG. 7 is a diagram showing a light emission output profile of the lower flash lamp according to the first preferred embodiment.

FIG. 7 is a diagram showing an output waveform (profile) of the light emission output of the lower flash lamp LFL according to the first preferred embodiment. In the first preferred embodiment, the time period during which the lower flash lamps LFL emit light is set to be 80 milliseconds as a time period from the time point t11 to a time point t12. Additionally, the light emission output of the lower flash lamp LFL is set such that, after reaching the peak, it gradually decreases and approaches to zero, until a time point (time point t12) when the first flash heating is completed. More specifically, a pulse signal that sets a plurality of pulses whose pulse width gradually decreases and whose pulse interval gradually increases over the time period from the time point t11 to the time point t12 is outputted to the IGBT 96 corresponding to the lower flash lamp LFL. As a result, the lower flash lamp LFL emits light for 80 milliseconds from the time point t11 to the time point t12, and the light emission output thereof reaches the peak and then gradually decreases and approaches to zero until the time point t12.

The flashes of light emitted from the lower flash lamps LFL transmit through the Bernoulli chuck 170 made of quartz, and is radiated to the back surface of the semiconductor wafer W held in a non-contact fashion by the Bernoulli chuck 170. The back surface of the semiconductor wafer W is irradiated with flashes of light outputted from the lower flash lamp LFL whose light emission output has the profile as shown in FIG. 7. Thereby, prior to the surface of the semiconductor wafer W, the back surface thereof raises its temperature over the time period from the time point t11 to the time point t12, as shown in FIG. 6.

The rate of the temperature rise in the back surface of the semiconductor wafer W, which is caused by irradiation with flashes of light emitted from the lower flash lamps LFL in the first flash heating, is set to be 1000° C. per second or more and 40000° C. per second or less. This rate of the temperature rise can be set by adjusting the pulse width time and the pulse interval time of a pulse signal that is applied to the gate of the IGBT 96. If the rate of the temperature rise in the back surface exceeds 40000° C. per second, there is a risk that a rapid thermal expansion of the back surface may cause cracking of the semiconductor wafer W. If the rate of the temperature rise is less than 1000° C. per second, the implanted impurities may undesirably diffuse. In a case where a high-dielectric film (high-k film) formed on the surface of the semiconductor wafer W is subjected to an annealing process, the rate of the temperature rise being less than 1000° C. per second may undesirably cause an oxide film between a silicon material and the high-dielectric film to grow.

A time period during which the lower flash lamps LFL emit flashes of light in the first flash heating is set to be equal to or shorter than one second but longer than a heat conduction time that is required for heat to be conducted from the back surface to the surface of the semiconductor wafer W. Here, the "heat conduction time" means a time length necessary until the heat generated in the back surface of the semiconductor wafer W as a result of irradiation with flashes of light is conducted to the surface. The heat conduction time is defined by the material and the outer size of the semiconductor wafer W. In a case of a silicon wafer with φ300 mm (the thickness is set at a normal value of 0.775 mm according to the standard) as adopted in this preferred embodiment, the heat conduction time is about 15 milliseconds. The time period during which the lower flash lamps LFL emit flashes of light can also be appropriately set by adjusting the pulse width time and the pulse interval time of a pulse signal that is applied to the gate of the IGBT 96. In the first preferred embodiment, the time period during which the lower flash lamps LFL emit flashes of light in the first flash heating is set to be 80 milliseconds as the time period from the time point t11 to the time point t12, which is equal to or shorter than one second but longer than 15 milliseconds that is the heat conduction time.

The back surface of the semiconductor wafer W is irradiated with flashes of light emitted from the lower flash lamps LFL for a time period longer than the heat conduction time. Thereby, in the course of the first flash heating, the heat is conducted from the back surface to the surface, so that the surface of the semiconductor wafer W, behind the back surface, raises its temperature from the room temperature to a predetermined intermediate temperature (in this preferred embodiment, about 500° C.), as shown in FIG. 6. In this manner, the surface of the semiconductor wafer W having the pattern formed thereon and implanted with impurities is heated. Here, the time period during which the lower flash lamps LFL emit flashes of light in the first flash heating is set to be equal to or shorter than one second, for the purpose of reducing a thermal budget. The technical meaning of the first flash heating in which the back surface of the semiconductor wafer W is irradiated with flashes of light covers the conventional preheating with halogen lamps or the like.

In the first preferred embodiment, the light emission output of the lower flash lamp LFL is set such that, after reaching the peak, it gradually decreases and approaches to zero, until the time point when the first flash heating is completed. This prevents an excessive temperature rise in the back surface of the semiconductor wafer W during the first flash heating, and also allows a temperature difference between the surface and the back surface to gradually decrease in a smooth manner until the time point when the first flash heating is completed. As a result, a thermal stress occurring in the semiconductor wafer W due to the temperature difference between the surface and the back surface can be relieved.

At the time point t12 that is 80 milliseconds after the time point t11, the light emission from the lower flash lamps LFL stops. The temperature difference between the surface and the back surface of the semiconductor wafer W gradually decreases until the time point when the first flash heating is completed. Accordingly, at the time point t12 when the light emission from the lower flash lamps LFL stops, the surface temperature and the back surface temperature are almost equal to each other, at the intermediate temperature (see FIG. 6).

After the light emission from the lower flash lamps LFL stops at the time point t12, a waiting state continues for a certain time period before the time point t13. During this waiting time period, neither the upper flash lamps UFL of the upper heating part 5 nor the lower flash lamps LFL of the lower heating part 4 emit light. At a time point t13 that comes when a predetermined waiting time period elapses, under control by the controller 3, a second flash heating is performed in which the plurality of flash lamps FL of the upper heating part 5 irradiate the surface of the semiconductor wafer W with flashes of light (step S15).

The waiting time period from the time point t12 when a supplementary heating performed by the lower flash lamps LFL is completed to the time point t13 when the upper flash lamps UFL start emitting flashes of light is longer than the heat conduction time that is required for heat to be conducted from the back surface to the surface of the semiconductor wafer W. In this first preferred embodiment, the waiting time period from the time point t12 to the time point t13 is set to be 20 milliseconds, which is longer than the heat conduction time of 15 milliseconds. When the waiting time period from the time point t12 to the time point t13 is set longer than the heat conduction time, heat generated in the back surface of the semiconductor wafer W as a result of irradiation with flashes of light emitted from the lower flash lamps LFL at the time point t12, which is a final time point of the first flash heating, is conducted to the surface before the upper flash lamps UFL start emitting flashes of light. This achieves economical use of the flashes of light emitted from the lower flash lamps LFL.

The control of light emission from the upper flash lamps UFL of the upper heating part 5 is, in a broad sense, the same as the control of light emission from the lower flash lamps LFL described above. That is, the controller 3 outputs a pulse signal to the gate of the IGBT 96, and thereby supply of charges from the capacitor 93 to the upper flash lamp UFL is made intermittent, thus controlling light emission from the upper flash lamp UFL. However, in the first preferred embodiment, a single pulse signal having a predetermined duration is outputted to the gate of the IGBT 96 corresponding to the upper flash lamp UFL. Thus, a time period during which the upper flash lamps UFL emit light is significantly shorter than a time period during which the lower flash lamps LFL emit light.

Figure 8:
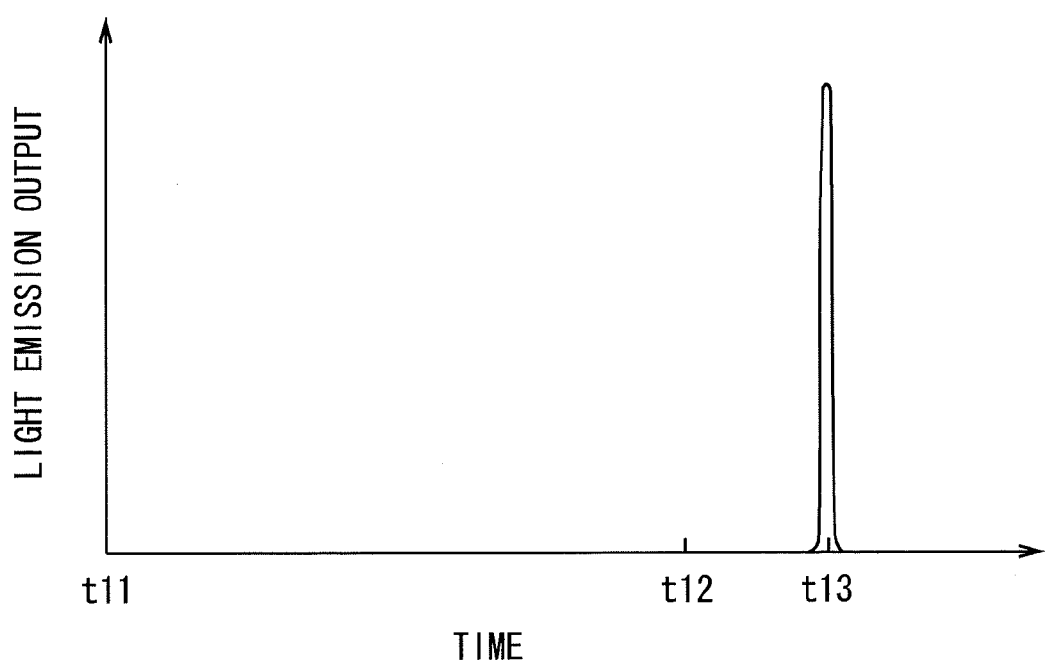
FIG. 8 is a diagram showing a light emission output profile of the upper flash lamp according to the first preferred embodiment.

FIG. 8 is a diagram showing an output waveform of a light emission output of the upper flash lamp UFL. In the first preferred embodiment, the upper flash lamp UFL is caused instantaneously emit light at the time point t13, and a time period of this light emission is about several milliseconds. More specifically, a single pulse signal having a pulse width of several milliseconds is set, and at the time point t13, the single pulse signal is outputted to the IGBT 96 corresponding to the upper flash lamps UFL, thus causing the upper flash lamp UFL to instantaneously emit light at the time point t13. The time period during which the upper flash lamps UFL emit light is significantly shorter than the time period during which the lower flash lamps LFL emit light, but the light emission output of the upper flash lamp UFL is larger than the average value of the light emission output of the lower flash lamp LFL.

The surface of the semiconductor wafer W, whose temperature has been raised from the room temperature to the intermediate temperature by the lower flash lamps LFL, is then irradiated with flashes of light emitted from the upper flash lamps UFL. Thereby, the surface of the semiconductor wafer W is further heated. At this time, the upper flash lamps UFL instantaneously emit flashes of light having a relatively large light emission output. Therefore, as shown in FIG. 6, the surface temperature of the semiconductor wafer W rapidly rises from the intermediate temperature at the time point t13, and reaches a target temperature. The target temperature is equal to or higher than 1000° C., at which activation of the implanted impurities is achieved. In the first preferred embodiment, the target temperature is set to be 1100° C.

Since the time period during which the upper flash lamps UFL emit flashes of light is shorter than the heat conduction time, the semiconductor wafer W itself acts as a heatsink, so that the surface temperature of the semiconductor wafer W having reached the target temperature of 1000° C. or higher rapidly drops. Therefore, a time period during which the surface temperature of the semiconductor wafer W is 1000° C. or higher is extremely short. Thus, diffusion of the impurities is avoided while activation of the impurities is achieved. Since the heat is conducted from the surface to the back surface of the semiconductor wafer W, the back surface temperature slightly rises, too, to make the surface temperature and the back surface temperature equal to each other.

Upon completion of the irradiation with flashes of light emitted from the upper flash lamps UFL, both the upper flash lamps UFL and the lower flash lamps LFL complete light emission. Thus, the temperature of the semiconductor wafer W rapidly drops. After the temperature of the semiconductor wafer W drops to a predetermined temperature or lower, the transfer part 79 horizontally moves from the standby position to the position located under the Bernoulli chuck 170. Then, the transfer part 79 moves up along the vertical direction, and thus the pin of the transfer part 79 lifts the processed semiconductor wafer W so that the semiconductor wafer W is spaced apart from the Bernoulli chuck 170. Then, the transport opening 66 is opened, and the hand of the transport robot enters the chamber 6 and stops at a position immediately below the semiconductor wafer W. Then, the transfer part 79 moves down, to transfer the semiconductor wafer W to the hand of the transport robot. Then, the hand of the transport robot having received the semiconductor wafer W exits the chamber 6. Thereby, the semiconductor wafer W is transported out. Thus, a flash heating treatment in the heat treatment apparatus 1 is completed (step S16). It may be acceptable that, before the transport opening 66 is opened, the atmosphere in the heat treatment space 65 of the chamber 6 is replaced with the atmosphere of atmospheric pressure.

In the first preferred embodiment, the first flash heating is performed in which the back surface of the semiconductor wafer W having the room temperature is irradiated with flashes of light emitted from the lower flash lamps LFL, so that the temperature of the surface of the semiconductor wafer W is raised from the room temperature to the intermediate temperature by means of heat conduction from the back surface to the surface. Then, the second flash heating is performed in which the surface of the semiconductor wafer W is irradiated with flashes of light emitted from the upper flash lamps UFL, so that the temperature of the surface of the semiconductor wafer W is raised from the intermediate temperature to the target temperature to thereby cause activation of the impurities. The first flash heating in the first preferred embodiment covers the technical meaning of the conventional preheating with a hot plate or halogen lamps. That is, before the surface of the semiconductor wafer W is irradiated with flashes of light, the surface temperature of the semiconductor wafer W is raised from the room temperature to the intermediate temperature in the first flash heating.

In this manner, in the first preferred embodiment, the lower flash lamps LFL perform the first flash heating which corresponds to the preheating. Therefore, without performing the conventional preheating with a hot plate, halogen lamps, or the like, only the irradiation with flashes of light emitted from the lower flash lamps LFL and the upper flash lamps UFL is used to raise the temperature of the semiconductor wafer W from the room temperature to the target temperature of 1000° C. or higher. In a case where the temperature of the semiconductor wafer W is raised from the room temperature to the target temperature only by irradiation with flashes of light emitted from the lower flash lamps LFL and the upper flash lamps UFL, all the heat treatments can be completed in an extremely short time of one second or less (in the first preferred embodiment, about 0.1 seconds). Accordingly, a length of processing time in the heat treatment apparatus 1 can be made significantly short, and thus can considerably increase the throughput. When the length of processing time is short, a temperature rise in other members such as the chamber side portion 63, which is undesirable, can be suppressed, and additionally the rate of temperature drop in the semiconductor wafer W after completion of the flash heating can be made high.

Since the transparent Bernoulli chuck 170 holds the semiconductor wafer W in a non-contact fashion due to the Bernoulli effect, almost no heat conduction occurs from the semiconductor wafer W having a raised temperature to the Bernoulli chuck 170. If the semiconductor wafer W is held in contact with the chuck, the heat conduction occurs so that the temperature drops only in a portion near a contacting area, which may result in a non-uniform temperature distribution in a plane. In the first preferred embodiment, almost no heat conduction occurs from the semiconductor wafer W to the Bernoulli chuck 170. Therefore, such a local temperature drop does not occur. Thus, a temperature distribution in a plane of the semiconductor wafer W can be made more uniform.

Since the Bernoulli chuck 170 causes the Bernoulli effect by ejecting nitrogen through the ejection port 174 toward the peripheral portion of the lower surface of the semiconductor wafer W, a temperature drop may occur in the peripheral portion of the semiconductor wafer W due to the stream caused by the ejection. However, in the first preferred embodiment, all the heat treatments are completed within one second only by irradiation with flashes of light. In such an extremely short time, a temperature drop caused by the ejection stream has almost no influence.

The semiconductor wafer W is held in a non-contact fashion while floating above the Bernoulli chuck 170. Accordingly, even if the semiconductor wafer W is deformed due to a rapid temperature change during irradiation with flashes of light, any stress that restricts the deformation does not act. Therefore, cracking of the semiconductor wafer W during irradiation with flashes of light is also prevented.

Moreover, the upper flash lamps UFL of the upper heating part 5 and the lower flash lamps LFL of the lower heating part 4 are arranged in directions perpendicular to each other. This enables an illuminance dispersion in the array of the rod-like upper flash lamps UFL and an illuminance dispersion in the array of the rod-like lower flash lamps LFL to cancel each other. Thus, a temperature distribution in a plane of the semiconductor wafer W can be made more uniform.

Second Preferred Embodiment

Next, a second preferred embodiment of the present invention will be described. A configuration of a heat treatment apparatus according to the second preferred embodiment is exactly the same as that of the first preferred embodiment. The second preferred embodiment is different from the first preferred embodiment in terms of a timing when the flash lamp FL emits light.

In the second preferred embodiment, until the irradiation with flashes of light (that is, until step S13 of FIG. 5), the same process steps as those of the first preferred embodiment are performed on the semiconductor wafer W. More specifically, the semiconductor wafer W serving as the processing object is transported into the chamber 6 and adsorptively held in a non-contact fashion by the Bernoulli chuck 170. The gas supply part 8 and the exhaust part 2 create a nitrogen atmosphere in the heat treatment space 65 of the chamber 6.

Figure 9:
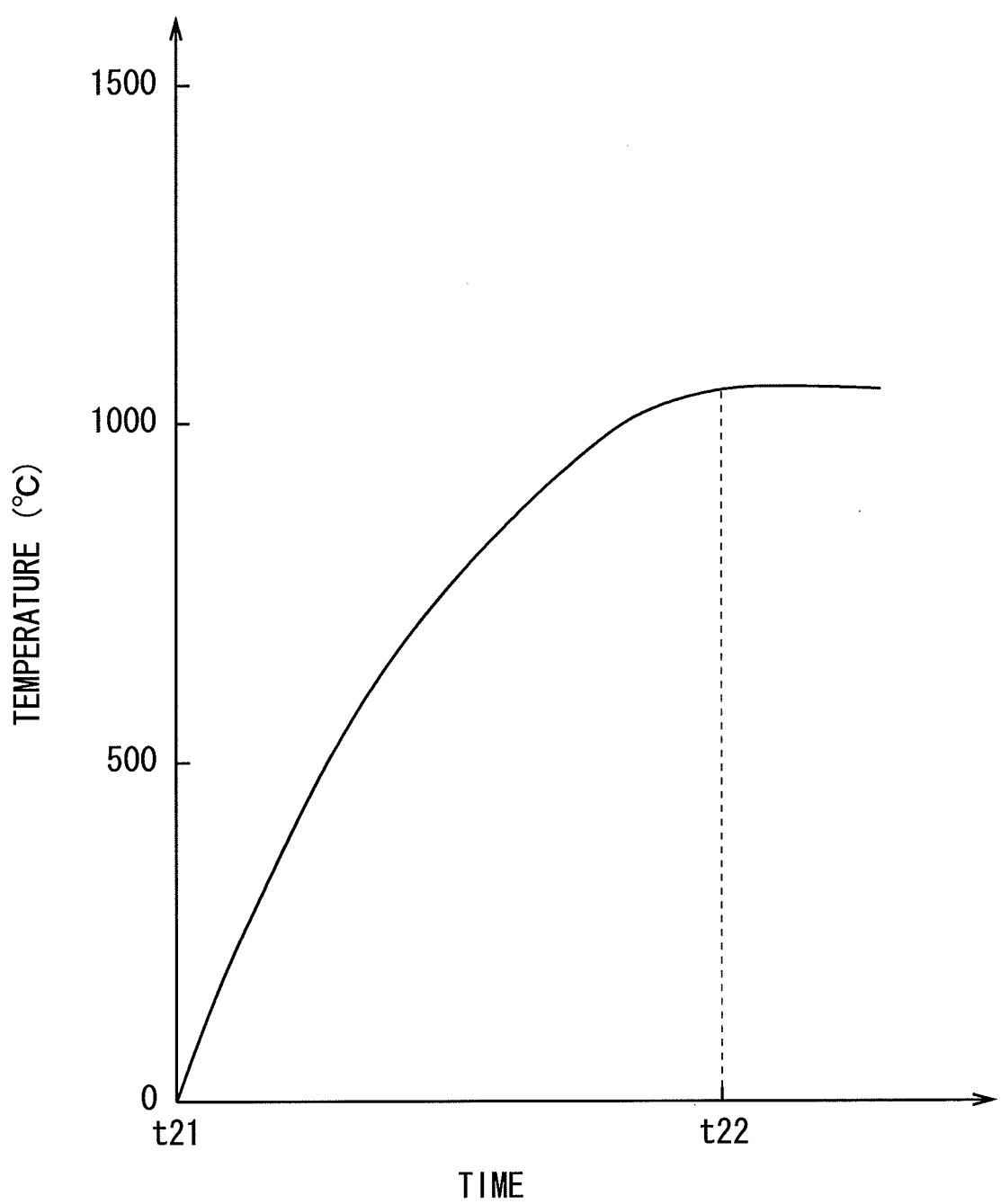
FIG. 9 is a diagram showing changes in the temperatures of the surface and the back surface of the semiconductor wafer according to a second preferred embodiment.

After the semiconductor wafer W is held in a non-contact fashion by the Bernoulli chuck 170, a flash heating is performed in which the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light. Thus, in the second preferred embodiment, the upper flash lamps UFL and the lower flash lamps LFL simultaneously emit light to perform the flash heating. FIG. 9 is a diagram showing changes in the temperatures of the surface and the back surface of the semiconductor wafer W according to the second preferred embodiment.

At a predetermined time point t21, under control by the controller 3, the plurality of lower flash lamps LFL of the lower heating part 4 and the plurality of upper flash lamps UFL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 10:
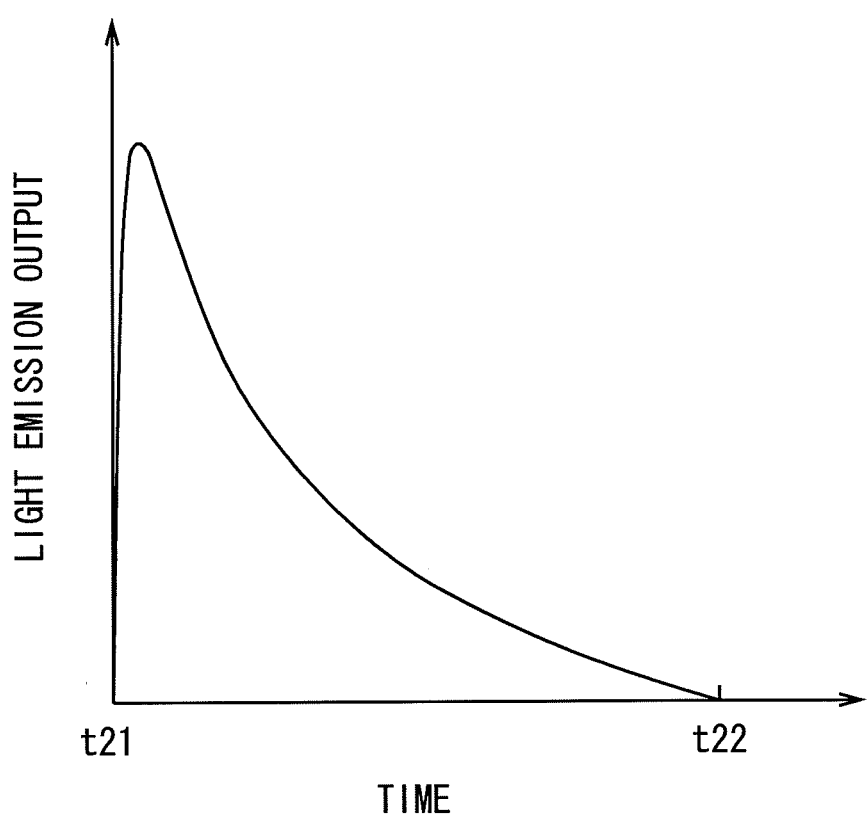
FIG. 10 is a diagram showing light emission output profiles of the lower flash lamp and the upper flash lamp according to the second preferred embodiment.

FIG. 10 is a diagram showing output waveforms (profiles) of light emission outputs of the lower flash lamp LFL and the upper flash lamp UFL according to the second preferred embodiment. In the second preferred embodiment, the lower flash lamps LFL and the upper flash lamps UFL simultaneously start light emission at the time point t21, and simultaneously complete the light emission at a time point t22. The light emission output of the lower flash lamp LFL and the light emission output of the upper flash lamp UFL have the same output waveform. Thus, the same pulse signal is outputted to the IGBT 96 corresponding to the lower flash lamp LFL and to the IGBT 96 corresponding to the upper flash lamp UFL, and thereby the lower flash lamps LFL and the upper flash lamps UFL are caused to simultaneously emit light at equivalent output levels. A time period from the time point t21 to the time point t22, during which the flash lamps FL emit light, is set to be 80 milliseconds.

Additionally, the light emission outputs of the lower flash lamp LFL and the upper flash lamp UFL are set such that, after reaching the peak, they gradually decrease and approach to zero until the time point (time point t22) when the light emission is completed. More specifically, a pulse signal that sets a plurality of pulses whose pulse width gradually decreases and whose pulse interval gradually increases over the time period from the time point t21 to the time point t22 is outputted to the IGBTs 96 corresponding to the lower flash lamps LFL and the upper flash lamps UFL. As a result, the lower flash lamps LFL and the upper flash lamps UFL emit light for 80 milliseconds from the time point t21 to the time point t22, and the light emission output thereof reaches the peak and then gradually decreases and approaches to zero until the time point t22.

The surface and the back surface of the semiconductor wafer W held in a non-contact fashion by the Bernoulli chuck 170 are simultaneously irradiated with flashes of light at equivalent output levels. Thereby, the flash heating is performed on the semiconductor wafer W from both the front and back sides thereof. The flashes of light emitted from the lower flash lamps LFL transmit through the Bernoulli chuck 170 made of quartz, and is radiated to the back surface of the semiconductor wafer W held in a non-contact fashion by the Bernoulli chuck 170. Such a flash heating from both the front and back surfaces causes the temperatures of the surface and the back surface of the semiconductor wafer W to rapidly rise and reach the target temperature (in the second preferred embodiment, 1050° C.) over the time period from the time point t21 to the time point t22, as shown in FIG. 9. The rate of the temperature rise in the surface and the back surface of the semiconductor wafer W, which is caused by the flash heating, is set to be 1000° C. per second or more and 40000° C. per second or less.

After, at the time point t22, the irradiation with flashes of light emitted from the upper flash lamps UFL and the lower flash lamps LFL, which has been simultaneously performed at the same output level, is completed, the temperatures of the surface and the back surface of the semiconductor wafer W drop. After the temperature of the semiconductor wafer W drops to a predetermined temperature or lower, the transfer part 79 and the transport robot transport the processed semiconductor wafer W out from the chamber 6. Thus, the flash heating treatment is completed.

In the second preferred embodiment, the surface and the back surface of the semiconductor wafer W having the room temperature are simultaneously irradiated with flashes of light from the upper flash lamps UFL and the lower flash lamps LFL, respectively, at equivalent output levels. Thereby, over the time period from the time point t21 to the time point t22, the temperatures of the surface and the back surface of the semiconductor wafer W are raised from the room temperature to the target temperature, thus achieving activation of the impurities.

In the second preferred embodiment, too, without performing the conventional preheating with a hot plate, halogen lamps, or the like, only the irradiation with flashes of light emitted from the lower flash lamps LFL and the upper flash lamps UFL is used to raise the temperature of the semiconductor wafer W from the room temperature to the target temperature of 1000° C. or higher. In a case where the temperature of the semiconductor wafer W is raised from the room temperature to the target temperature only by irradiation with flashes of light emitted from the lower flash lamps LFL and the upper flash lamps UFL, all the heat treatments can be completed in an extremely short time of one second or less (in the second preferred embodiment, about 80 milliseconds). Accordingly, a length of processing time in the heat treatment apparatus 1 can be made significantly short, and thus can considerably increase the throughput. When the length of processing time is short, a temperature rise in other members such as the chamber side portion 63, which is undesirable, can be suppressed, and additionally the rate of temperature drop in the semiconductor wafer W after completion of the flash heating can be made high Moreover, similarly to the first preferred embodiment, since the transparent Bernoulli chuck 170 holds the semiconductor wafer W in a non-contact fashion, a temperature distribution in a plane of the semiconductor wafer W during irradiation with flashes of light can be made uniform, and additionally cracking is prevented.

Third Preferred Embodiment

Next, a third preferred embodiment of the present invention will be described. FIG. 11 is a diagram showing a configuration of principal parts of a heat treatment apparatus 1*a* according to the third preferred embodiment. In FIG. 11, the same elements as those of the first preferred embodiment shown in FIG. 1 are denoted by the same corresponding reference numerals. The third preferred embodiment is different from the first preferred embodiment, in that only the upper heating part 5 provided above the chamber 6 serves as a heat source.

In the third preferred embodiment, the lower opening of the chamber 6 is closed with a disk-shaped member made of the same metal material as that of the chamber side portion 63. In the upper opening of the chamber 6, the upper chamber window 61 similar to that of the first preferred embodiment is mounted.

The upper heating part 5 is configured in the same manner as in the first preferred embodiment. To be specific, the upper heating part 5 includes a light source having a plurality of flash lamps FL, and the reflector 52 provided so as to cover the upper side of the light source. Each of the plurality of flash lamps FL is controlled by the driving circuit as shown in FIG. 4. The other parts of the configuration of the heat treatment apparatus 1*a* according to the third preferred embodiment are the same as those of the heat treatment apparatus 1 according to the first preferred embodiment.

In the third preferred embodiment, until the irradiation with flashes of light (that is, until step S13 of FIG. 5), the same process steps as those of the first preferred embodiment are performed on the semiconductor wafer W. More specifically, the semiconductor wafer W serving as the processing object is transported into the chamber 6 and adsorptively held in a non-contact fashion by the Bernoulli chuck 170. The gas supply part 8 and the exhaust part 2 create a nitrogen atmosphere in the heat treatment space 65 of the chamber 6.

After the semiconductor wafer W is held in a non-contact fashion by the Bernoulli chuck 170, a flash heating is performed in which the plurality of flash lamps FL of the upper heating part 5 irradiate the surface of the semiconductor wafer W with flashes of light. In a conceptual sense, the light emission from the plurality of flash lamps FL at this time may be controlled in the same manner as in the first preferred embodiment or in the same manner as in the second preferred embodiment.

In a case of controlling the light emission in the same manner as in the first preferred embodiment, the plurality of flash lamps FL of the upper heating part 5 is divided into two lamp group, and a first flash lamp group is caused to emit light in the same manner as the upper flash lamps UFL while a second flash lamp group is caused to emit light in the same manner as the lower flash lamps LFL. In other words, the surface of the semiconductor wafer W is subjected to both of the first flash heating for raising the temperature of the surface of the semiconductor wafer W from the room temperature to the intermediate temperature and the second flash heating for raising the temperature thereof from the intermediate temperature to the target temperature.

FIG. 12 is a diagram showing changes in the temperatures of the surface and the back surface of the semiconductor wafer W according to the third preferred embodiment. In a time period from a predetermined time point t31 to a time point t32, under control by the controller 3, the first flash lamp group among the plurality of flash lamps FL of the upper heating part 5 irradiate the surface of the semiconductor wafer W with flashes of light. An output waveform of the light emission output of the first flash lamp group is the same as that shown in FIG. 7. Thereby, in the time period from a predetermined time point t31 to a time point t32, the first flash heating is performed in which the temperature of the surface of the semiconductor wafer W is raised from the room temperature to the intermediate temperature. In the third preferred embodiment, as shown in FIG. 12, the temperature of the back surface of the semiconductor wafer W is raised behind the temperature of the surface thereof.

The light emission from the first flash lamp group stops at the time point t32, and then at a time point t33, under control by the controller 3, the second flash lamp group among the plurality of flash lamps FL of the upper heating part 5 irradiate the surface of the semiconductor wafer W with flashes of light. An output waveform of the light emission output of the second flash lamp group is the same as that shown in FIG. 8. Thereby, the second flash heating is performed at the time point t33, in which the temperature of the surface of the semiconductor wafer W is raised from the intermediate temperature to the target temperature.

In this manner as well as the first preferred embodiment, without performing the preheating with a hot plate, halogen lamps, or the like, only the irradiation with flashes of light emitted from the flash lamps FL is used to raise the temperature of the surface of the semiconductor wafer W from the room temperature to the target temperature. Therefore, all the heat treatments can be completed in an extremely short time of one second or less. In order to achieve a uniform distribution of the illuminance of flashes of light, it is preferable that, for example, the plurality of flash lamps FL of the upper heating part 5 are classified alternately into the first flash lamp group and the second flash lamp group along the horizontal array. It may be also acceptable that the first flash lamp group and the second flash lamp group are arranged in two stages.

In a case of controlling the light emission in the same manner as in the second preferred embodiment, all the plurality of flash lamps FL of the upper heating part 5 are caused to emit light with the same output waveform as that shown in FIG. 10. In other words, in the third preferred embodiment, only the surface of the semiconductor wafer W is irradiated with flashes of light, while in the second preferred embodiment, the surface and the back surface of the semiconductor wafer W are simultaneously irradiated with the flashes of light at equivalent output levels. In this case as well, the temperature of the surface of the semiconductor wafer W can be raised from the room temperature to the target temperature only by irradiation with flashes of light emitted from the flash lamps FL. Thus, all the heat treatments can be completed in an extremely short time of one second or less. In a case where the surface temperature is raised from the room temperature to the intermediate temperature only by radiation of flashes of light to the surface of the semiconductor wafer W, it is preferable that a time period during which the flash lamps FL emit light is set as long as it is equal to or less than one second, in order to prevent cracking which may be caused by a rapid thermal expansion of the surface.

Fourth Preferred Embodiment

Next, a fourth preferred embodiment of the present invention will be described. FIG. 13 is a diagram showing a configuration of principal parts of a heat treatment apparatus 1*b* according to the fourth preferred embodiment. The heat treatment apparatus 1*b* is a flash lamp annealer that performs a heat treatment by irradiating a substantially circular semiconductor wafer W serving as a substrate with flashes of light. In FIG. 13, the same elements as those shown in FIG. 1 are denoted by the same corresponding reference numerals.

The heat treatment apparatus 1*b* principally includes a chamber 6, a holder 7, a transfer part 79, an upper heating part 5, a lower heating part 4, a gas supply part 8, and an exhaust part 2. The chamber 6 has a substantially cylindrical shape, and receives the semiconductor wafer W therein. The holder 7 holds the semiconductor wafer W within the chamber 6. The transfer part 79 exchanges the semiconductor wafer W with the holder 7. The upper heating part 5 is provided above the chamber 6. The lower heating part 4 is provided below the chamber 6. The gas supply part 8 supplies a process gas into the chamber 6. The exhaust part 2 exhausts the chamber 6. The heat treatment apparatus 1*b* also includes a controller 3 that controls these parts and causes them to perform the heat treatment on the semiconductor wafer W. The heat treatment apparatus 1*b* according to the fourth preferred embodiment is different from the heat treatment apparatus 1 according to the first preferred embodiment (FIG. 1), in that the Bernoulli chuck 170 is not provided in the holder 7 and halogen lamps HL are provided in the lower heating part 4.

The chamber 6 serving as a housing, the gas supply part 8, and the exhaust part 2 are configured in exactly the same manner as in the first preferred embodiment. In the fourth preferred embodiment, the holder 7 includes a support ring 72 and a light shielding member 71. The light shielding member 71 is fixed to the inside wall surface of the chamber side portion 63. The light shielding member 71 may be made of a material opaque to light emitted from the flash lamps FL and the halogen lamps HL, for example, ceramic such as silicon carbide (SiC), aluminum nitride (AlN), and boron nitride (BN). The light shielding member 71 is in the shape of an annular ring protruding from the inner wall of the chamber side portion 63 having the substantially cylindrical shape. The support ring 72 is placed on an inner peripheral portion of an upper surface of the light shielding member 71. That is, the light shielding member 71 is provided around the support ring 72.

The support ring 72 is a plate-like member having an annular ring shape. The support ring 72 is made of, for example, silicon carbide. The outer diameter of the support ring 72 having the annular ring shape is larger than the diameter (in this preferred embodiment, φ300 mm) of the semiconductor wafer W. The inner diameter of the support ring 72 is slightly smaller than the diameter of the semiconductor wafer W. Accordingly, the support ring 72 is configured to support, on an inner peripheral portion thereof, the peripheral portion of the semiconductor wafer W.

The semiconductor wafer W transported into the chamber 6 is, by the support ring 72, supported within the chamber 6 with a horizontal attitude (the attitude in which the normal of the main surface of the semiconductor wafer W extends in the vertical direction). In this preferred embodiment, both the support ring 72 and the light shielding member 71 are made of a material opaque to light emitted from the flash lamps FL and the halogen lamps HL. Therefore, in an area around the semiconductor wafer W supported on the support ring 72, the upper heating part 5 and the lower heating part 4 are optically isolated from each other. That is, light emitted from the upper heating part 5 does not travel at the lateral sides of the peripheral portion of the semiconductor wafer W and therefore does not reach the peripheral portion of the lower surface thereof. Likewise, light emitted from the lower heating part 4 does not reach the peripheral portion of the upper surface of the semiconductor wafer W.

The transfer part 79 is provided below the holder 7. The transfer part 79 is configured to be movable in the horizontal direction and in the vertical direction by a drive mechanism (not shown). When not performing a transfer operation, the transfer part 79 waits in a standby position located under the light shielding member 71. In a case of transferring the semiconductor wafer W to the holder 7, the transfer part 79 horizontally moves from the standby position to a position located inside the inner circumference of the support ring 72, and then moves up along the vertical direction. As a result, an upper end of the pin of the transfer part 79 protrudes from an upper surface of the support ring 72. After the transfer operation is completed, the transfer part 79 returns to the standby position again.

In the fourth preferred embodiment, while the semiconductor wafer W is held by the holder 7, the atmosphere in the heat treatment space 65 is divided into upper and lower spaces by the light shielding member 71, the support ring 72, and the semiconductor wafer W. Therefore, it is preferable that the gas supply part 8 supplies the process gas to each of the spaces of the heat treatment space 65 above and below the holder 7 while the exhaust part 2 exhausts each of the spaces, as shown in FIG. 13.

The upper heating part 5 is exactly identical to that of the first preferred embodiment. The lower heating part 4 is provided below the chamber 6. The lower heating part 4 includes a light source and a reflector 42 provided so as to cover the lower side of the light source. The light source has a plurality of flash lamps FL and a plurality of halogen lamps HL. The lower heating part 4 irradiates the lower surface of the semiconductor wafer W supported within the chamber 6 on the support ring 72 with light emitted from the flash lamps FL or the halogen lamps HL through the lower chamber window 64 made of quartz. Similarly to the first preferred embodiment, particularly when distinction is necessary between the flash lamps FL of the upper heating part 5 and the flash lamps FL of the lower heating part 4, the flash lamps FL of the upper heating part 5 will be referred to as "upper flash lamps UFL" while the flash lamps FL of the lower heating part 4 will be referred to as "lower flash lamps LFL". The upper flash lamps UFL and the lower flash lamps LFL are different in the arrangement position, but they are rod-like xenon flash lamps that are identical to each other. When no distinction is required therebetween, they will be simply referred to as "flash lamps FL".

FIG. 14 is a perspective view showing the arrangement relationship among the upper flash lamps UFL, the lower flash lamps LFL, and the halogen lamps HL. Each of the plurality of upper flash lamps UFL is a rod-like lamp having an elongated cylindrical shape. The upper flash lamps UFL are arrayed in a plane such that their longitudinal directions are parallel to one another along the main surface of the semiconductor wafer W supported on the support ring 72 (that is, along the horizontal direction). Likewise, each of the plurality of lower flash lamps LFL is a rod-like lamp having an elongated cylindrical shape. The lower flash lamps LFL are arrayed in a plane such that their longitudinal directions are parallel to one another along the main surface of the semiconductor wafer W supported on the support ring 72.

As shown in FIG. 14, the upper flash lamps UFL of the upper heating part 5 and the lower flash lamps LFL of the lower heating part 4 are arranged in directions perpendicular to each other. That is, when seen from the top side of the upper heating part 5, an array of the upper flash lamps UFL and an array of the lower flash lamps LFL are arranged in the form of parallel crosses.

A driving circuit for the flash lamps FL is the same as that of the first preferred embodiment (see FIG. 4). The driving circuit as shown in FIG. 4 is provided individually for each of the plurality of upper flash lamps UFL of the upper heating part 5 and the plurality of lower flash lamps LFL of the lower heating part 4. This makes it possible that the upper flash lamps UFL and the lower flash lamps LFL are controlled in different manners.

Each of the plurality of halogen lamps HL of the lower heating part 4 is a rod-like lamp having an elongated cylindrical shape. The halogen lamps HL are arrayed in a plane such that their longitudinal directions are parallel to one another along the main surface of the semiconductor wafer W supported on the support ring 72. As shown in FIG. 14, the lower flash lamps LFL and the halogen lamp HL are arranged in directions perpendicular to each other. As a result, the upper flash lamps UFL and the halogen lamps HL are parallel to each other.

In the lower heating part 4, a plane in which the lower flash lamps LFL are arrayed is located above a plane in which the halogen lamps HL are arrayed. In other words, the lower flash lamps LFL are arranged at a position closer to the support ring 72 provided in the chamber 6 than the halogen lamps HL are. Accordingly, light emitted from the halogen lamps HL partially transmits through the flash lamps FL before entering the chamber 6.

The halogen lamp HL is a filament type light source in which a filament arranged within a glass tube is electrically conducted and thereby caused to glow so that a light is emitted. A gas obtained by introducing a very small amount of a halogen element (such as iodine or bromine) into an inert gas such as a nitrogen gas or an argon gas is sealed within the glass tube. The introduction of the halogen element enables the temperature of the filament to be set to a high temperature while suppressing a break damage to the filament. Accordingly, the halogen lamp HL has a feature that it has a longer lifetime than a normal incandescent lamp and can continuously emits light with high intensity.

Next, a description will be given to process steps performed on the semiconductor wafer W by the heat treatment apparatus 1b having the above-described configuration. FIG. 15 is a flowchart showing process steps on the semiconductor wafer W by the heat treatment apparatus 1. The process steps performed by the heat treatment apparatus 1b, which will be described below, are proceeded along with the controller 3 controlling the operation mechanisms of the heat treatment apparatus 1b.

Firstly, the gate valve (not shown) is opened so that the transport opening 66 is opened. The transport robot provided outside the apparatus transports the semiconductor wafer W that is a processing object into the chamber 6 through the transport opening 66 (step S21). In the fourth preferred embodiment, the semiconductor wafer W serving as the processing object is a silicon semiconductor substrate having a pattern formed on a surface thereof and implanted with impurities. The formation of the pattern and the implantation of the impurities may be implemented by, for example, a photolithography apparatus and an ion implantation apparatus provided independently of the heat treatment apparatus 1b.

Such a semiconductor wafer W is held by a hand of the transport robot, and the hand enters the chamber 6 through the transport opening 66 and then stops at a position immediately above the holder 7 (and to be precise, a position at which the central axis of the semiconductor wafer W coincides with the central axis of the support ring 72). Then, the transfer part 79 horizontally moves from the standby position located under the light shielding member 71 to a position located inside the inner circumference of the support ring 72, and then moves up along the vertical direction. Thus, the pin of the transfer part 79 protrudes up from the support ring 72, to receive the semiconductor wafer W from the hand of the transport robot. Then, the hand of the transport robot exits the chamber 6, and at the same time the transport opening 66 is closed to configure the heat treatment space 65 of the chamber 6 as an enclosed space. Then, the transfer part 79 that has received the semiconductor wafer W moves down, and thereby the semiconductor wafer W is transferred from the pin of the transfer part 79 to the support ring 72 (step S22). The semiconductor wafer W is supported such that the central axis thereof is coincident with the central axis of the support ring 72. Accordingly, the support ring 72 supports a lower surface of the peripheral portion of the semiconductor wafer W throughout the circumference of the semiconductor wafer W. The transfer part 79 having transferred the semiconductor wafer W to the support ring 72 returns to the standby position.

Here, the surface of the semiconductor wafer W means a main surface on which a device is to be formed. On the surface, as described above, the pattern is formed and the impurities are implanted. In the surface of the semiconductor wafer W, a distribution of the absorption rate in a plane is not uniform, because the light absorption rate varies due to the pattern. On the other hand, the back surface of the semiconductor wafer W means a main surface opposite to the surface. On the back surface of the semiconductor wafer W, normally, neither a film nor a pattern is formed. Here, forming the film on the surface may inevitably requires a thin film, such as an oxide film, a nitride film, or a polysilicon film, to be formed on the back surface, too. In such a case, the film is formed uniform. In any case, in the back surface of the semiconductor wafer W, a distribution of the light absorption rate in a plane is uniform.

In the fourth preferred embodiment, the semiconductor wafer W is transported into the chamber 6 and supported on the support ring 72 with the surface of the semiconductor wafer W serving as an upper surface facing upward. The upper surface of the semiconductor wafer W means the main surface facing upward in the vertical direction, and the lower surface means the surface facing downward. Therefore, in some cases, the surface of the semiconductor wafer W may be the upper surface facing upward, and in other cases, the surface of the semiconductor wafer W may be the lower surface facing downward.

After the transport opening 66 is closed to configure the heat treatment space 65 as an enclosed space, the valve 82 is opened so that the process gas (in this preferred embodiment, a nitrogen gas) is supplied from the gas supply part 8 into the heat treatment space 65. Along with this, the valve 22 is opened, and the exhaust part 2 exhausts the heat treatment space 65. As a result, a stream of nitrogen gas is produced in the heat treatment space 65 of the chamber 6. Thus, a nitrogen atmosphere is created in a region around the semiconductor wafer W held by the holder 7. From the viewpoint of enhancing the efficiency of replacement of the atmosphere in the chamber 6, it is preferable that, without supplying the process gas, the exhaust part 2 exhausts the heat treatment space 65 to once create an atmosphere of reduced pressure that is lower than the atmospheric pressure, and then the process gas is supplied from the gas supply part 8.

After the semiconductor wafer W is placed and supported on the support ring 72 of the holder 7, under control by the controller 3, the plurality of halogen lamps HL of the lower heating part 4 are concurrently turned on, to start a preheating (step S23). Halogen light emitted from the halogen lamps HL transmits through the lower chamber window 64 made of quartz, and thereby the semiconductor wafer W supported on the support ring 72 is irradiated from the back surface side thereof. As a result of being irradiated with light from the halogen lamps HL, the temperature of the semiconductor wafer W rises. Since the transfer part 79 is retracted to the standby position located under the light shielding member 71, the transfer part 79 does not hinder the preheating performed by the halogen lamps HL. The light emitted from the halogen lamps HL partially transmits through the flash lamps FL before it is radiated to the back surface of the semiconductor wafer W. This also causes no hindrance of the preheating, because the flash lamps FL have no filament.

By the light emission from the halogen lamps HL, the temperature of the semiconductor wafer W is raised up to a preheating temperature that has been set in advance. The preheating temperature is 300° C. or higher and 800° C. or lower, and in the fourth preferred embodiment, set to be 500° C. After the temperature of the semiconductor wafer W reaches the preheating temperature, the controller 3 keeps the output of the halogen lamps HL so as to maintain the semiconductor wafer W at this preheating temperature for a while. More specifically, the temperature of the semiconductor wafer W is measured by an unillustrated temperature sensor (a contact-type thermometer or a radiation thermometer) and, at a time point when the temperature of the semiconductor wafer W measured by this temperature sensor reaches the preheating temperature, the controller 3 controls the output of the halogen lamps HL so as to maintain the semiconductor wafer W almost at the preheating temperature. A time period taken for the temperature of the semiconductor wafer W to rise from the room temperature to the preheating temperature is about several seconds, and a time period during which the semiconductor wafer W is maintained at the preheating temperature is also about several seconds.

Then, after the semiconductor wafer W is maintained at the preheating temperature for a predetermined time period, the plurality of flash lamps FL (lower flash lamps LFL) of the lower heating part 4 irradiate the back surface of the semiconductor wafer W with flashes of light, to perform a supplementary heating (step S24). FIG. 16 is a diagram showing changes in the temperatures of the surface and the back surface of the semiconductor wafer W. In FIG. 16, the solid line indicates the surface temperature of the semiconductor wafer W, and the dotted line indicates the back surface temperature of the semiconductor wafer W.

At a time point t111 that comes when a predetermined time period elapses after the temperature of the semiconductor wafer W reaches the preheating temperature (in this preferred embodiment, 500° C.), under control by the controller 3, the plurality of flash lamps FL of the lower heating part 4 emit flashes of light. The control of light emission from the flash lamps FL is almost the same as that of the first preferred embodiment. To be specific, the controller 3 outputs a pulse signal to the gate of the IGBT 96, and thereby supply of charges from the capacitor 93 to the flash lamp FL is made intermittent, thus achieving a chopper control of the light emission from the plurality of flash lamps FL.

Figure 17:
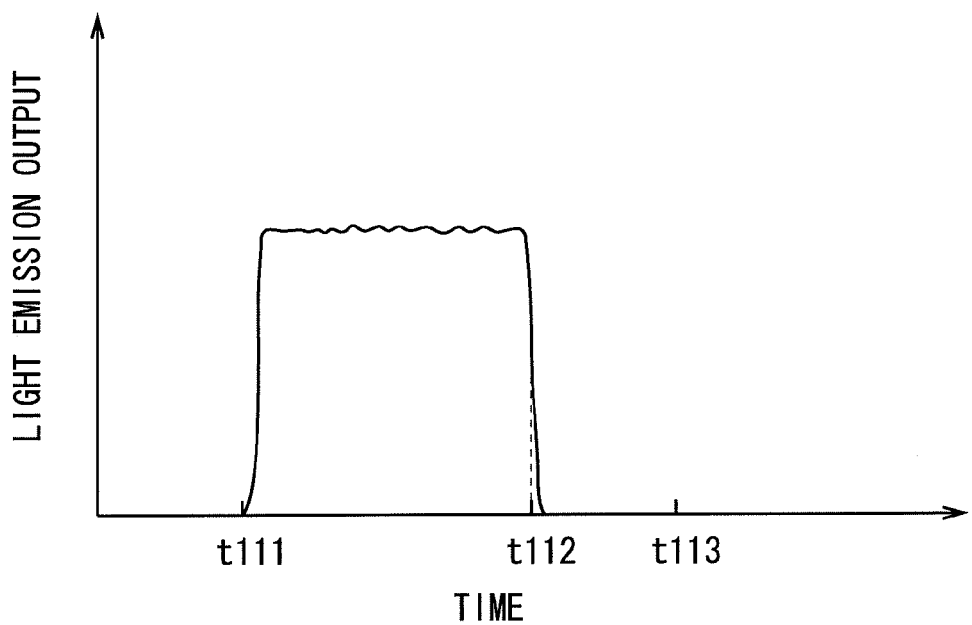
FIG. 17 is a diagram showing a light emission output profile of the lower flash lamp according to the fourth preferred embodiment.

FIG. 17 is a diagram showing an output waveform (profile) of a light emission output of the lower flash lamp LFL according to the fourth preferred embodiment. In the fourth preferred embodiment, a time period during which the lower flash lamps LFL emit light is set to be 40 milliseconds as a time period from the time point t111 to a time point t112. More specifically, for 40 milliseconds from the time point t111 to the time point t112, a pulse signal that sets a large number of pulses having relatively short pulse intervals is outputted to the IGBT 96 corresponding to the lower flash lamps LFL. As a result, the lower flash lamp LFL emits light for 40 milliseconds from the time point t111 to the time point t112.

The back surface of the semiconductor wafer W supported on the support ring 72 is irradiated with flashes of light emitted from the lower flash lamps LFL for 40 milliseconds. Thereby, the supplementary heating is performed on the semiconductor wafer W. At this time, as shown in FIG. 16, in the back surface of the semiconductor wafer W that is directly irradiated with flashes of light emitted from the lower flash lamps LFL, the temperature rapidly rises over the time period from the time point t111 to the time point t112. The rate of the temperature rise in the back surface of the semiconductor wafer W, which is caused by irradiation with flashes of light emitted from the lower flash lamps LFL in the supplementary heating stage, is set to be 1000° C. per second or more and 40000° C. per second or less. This rate of the temperature rise can be set by adjusting the pulse width time and the pulse interval time of the pulse signal to be applied to the gate of the IGBT 96. If the rate of the temperature rise in the back surface exceeds 40000° C. per second, there is a risk that a rapid thermal expansion of the back surface may cause cracking of the semiconductor wafer W. If the rate of the temperature rise is less than 1000° C. per second, the implanted impurities may undesirably diffuse. In a case where a high-dielectric film (high-k film) formed on the surface of the semiconductor wafer W is subjected to an annealing process, the rate of the temperature rise being less than 1000° C. per second may undesirably cause an oxide film between a silicon material and the high-dielectric film to grow.

The time period during which the lower flash lamps LFL emit flashes of light in the supplementary heating stage is set to be equal to or shorter than one second but longer than the heat conduction time that is required for heat to be conducted from the back surface to the surface of the semiconductor wafer W. Here, the "heat conduction time" means a time length necessary until the heat generated in the back surface of the semiconductor wafer W as a result of irradiation with flashes of light is conducted to the surface. In a case of a silicon wafer with φ300 mm, the heat conduction time is about 15 milliseconds. The time period during which the lower flash lamps LFL emit flashes of light can also be appropriately set by adjusting the pulse width time and the pulse interval time of a pulse signal that is applied to the gate of the IGBT 96. In the fourth preferred embodiment, the time period during which the lower flash lamps LFL emit flashes of light in the supplementary heating stage is set to be 40 milliseconds as the time period from the time point t1 to the time point t112, which is equal to or shorter than one second but longer than 15 milliseconds that is the heat conduction time.

The back surface of the semiconductor wafer W is irradiated with flashes of light emitted from the lower flash lamps LFL for a time period longer than the heat conduction time. Thereby, in the course of the supplementary heating stage, the heat is conducted from the back surface to the surface, so that the surface of the semiconductor wafer W, behind the back surface, raises its temperature from the room temperature to a predetermined intermediate temperature (in the fourth preferred embodiment, about 800° C.), as shown in FIG. 16. In this manner, the surface of the semiconductor wafer W having the pattern formed thereon and implanted with impurities is heated. Here, the time period during which the lower flash lamps LFL emit flashes of light in the supplementary heating stage is set to be equal to or shorter than one second, for the purpose of reducing a thermal budget.

As already described, neither a film nor a pattern is formed on the back surface of the semiconductor wafer W. Even though an unintended film may be formed thereon, such a film is uniformly formed over the entire back surface. Therefore, in the back surface of the semiconductor wafer W, a distribution of the light absorption rate in a plane is uniform. Thus, when the back surface of the semiconductor wafer W is irradiated with flashes of light in the supplementary heating stage, the entire back surface can be uniformly heated irrespective of the pattern on the surface.

At the time point t112 that comes when 40 milliseconds elapse after the time point t111, the light emission from the lower flash lamps LFL stops. As a result of the stop of the irradiation with flashes of light emitted from the lower flash lamps LFL, the back surface temperature of the semiconductor wafer W slightly drops (see FIG. 16). On the other hand, in the surface of the semiconductor wafer W, as of the time point t112 at which the light emission from the lower flash lamps LFL stops, the heat conduction from the back surface is continuing, and therefore the temperature is continuously rising.

After the light emission from the lower flash lamps LFL stops at the time point t112, a waiting state continues for a certain time period before a time point t113 (step S25). During this waiting time period, neither the upper flash lamps UFL of the upper heating part 5 nor the lower flash lamps LFL of the lower heating part 4 emit light, but the halogen lamps HL may continue the light emission. At the time point t113 that comes when a predetermined waiting time period elapses, under control by the controller 3, the plurality of flash lamps FL of the upper heating part 5 emit flashes of light, to heat the semiconductor wafer W from the surface side thereof (step S26).

The waiting time period from the time point t112 when the supplementary heating performed by the lower flash lamps LFL is completed to the time point t113 when the upper flash lamps UFL start emitting flashes of light is longer than the heat conduction time that is required for heat to be conducted from the back surface to the surface of the semiconductor wafer W. In the fourth preferred embodiment, the waiting time period from the time point t112 to the time point t113 is set to be 20 milliseconds, which is longer than the heat conduction time of 15 milliseconds. When the waiting time period from the time point t112 to the time point t113 is set longer than the heat conduction time, heat generated in the back surface of the semiconductor wafer W as a result of irradiation with flashes of light emitted from the lower flash lamps LFL at the time point t112, which is a final time point of the supplementary heating stage, is conducted to the surface before the upper flash lamps UFL start emitting flashes of light. This achieves economical use of the flashes of light emitted from the lower flash lamps LFL.

As shown in FIG. 16, in the waiting time period from the time point t112 to the time point t113, the heat conduction causes the surface temperature and the back surface temperature of the semiconductor wafer W to be equal to each other. That is, after the supplementary heating performed by the lower flash lamps LFL is completed and then a temperature difference between the surface and the back surface of the semiconductor wafer W decreases to 10° C. or less, the upper flash lamps UFL starts emitting flashes of light. Heat conduction between the surface and the back surface does not occur during a time period from when the surface temperature and the back surface temperature of the semiconductor wafer W become equal to each other to the time point t113 when the upper flash lamps UFL start emitting flashes of light.

In the fourth preferred embodiment, a single pulse signal having a predetermined duration is outputted to the gate of the IGBT 96 corresponding to the upper flash lamp UFL. Thus, the time period during which the upper flash lamps UFL emit light is significantly shorter than the time period during which the lower flash lamps LFL emit light.

Figure 18:
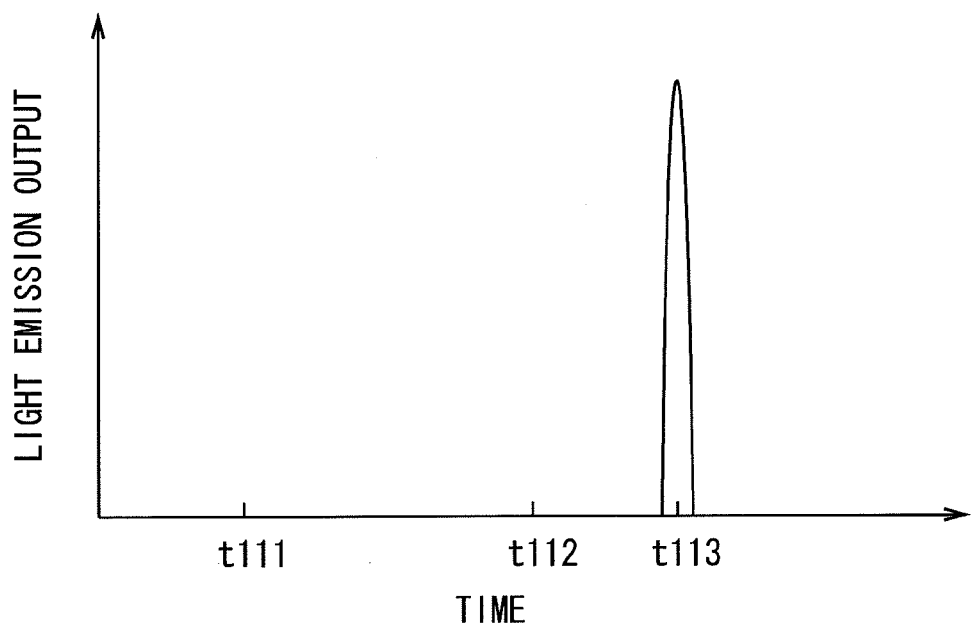
FIG. 18 is a diagram showing a light emission output profile of the upper flash lamp according to the fourth preferred embodiment.

FIG. 18 is a diagram showing an output waveform of a light emission output of the upper flash lamp UFL. In the fourth preferred embodiment, the upper flash lamps UFL are caused to instantaneously emit light at the time point t113, and this light emission time period is set to be about several milliseconds. To be specific, a single pulse signal having a pulse width of several milliseconds is set and, at the time point t113, outputted to the IGBT 96 corresponding to the upper flash lamp UFL, thereby causing the upper flash lamps UFL to instantaneously emit light at the time point t113. The time period during which the upper flash lamps UFL emit light is significantly shorter than the time period during which the lower flash lamps LFL emit light, but the light emission output of the upper flash lamp UFL is larger than the average value of the light emission output of the lower flash lamp LFL.

The surface of the semiconductor wafer W having subjected to the supplementary heating by the lower flash lamps LFL is irradiated with flashes of light emitted from the upper flash lamps UFL. Thereby, the flash heating is performed on the surface of the semiconductor wafer W. At this time, the upper flash lamps UFL instantaneously emit flashes of light having a relatively large light emission output. Therefore, as shown in FIG. 16, the surface temperature of the semiconductor wafer W rapidly rises at the time point t113, and reaches a temperature of 1000° C. or higher (in this preferred embodiment, about 1100° C.), at which activation of the impurities is achieved. However, since the time period during which the upper flash lamps UFL emit flashes of light is shorter than the heat conduction time, the semiconductor wafer W itself acts as a heatsink, so that the surface temperature of the semiconductor wafer W having reached 1000° C. or higher rapidly drops. Therefore, a time period during which the surface temperature of the semiconductor wafer W is 1000° C. or higher is extremely short. Thus, diffusion of the impurities is avoided while activation of the impurities is achieved. Since the heat is conducted from the surface to the back surface of the semiconductor wafer W, the back surface temperature slightly rises, too, to make the surface temperature and the back surface temperature equal to each other.

Upon completion of the irradiation with flashes of light emitted from the upper flash lamps UFL, both the upper flash lamps UFL and the lower flash lamps LFL complete light emission. Thus, the temperature of the semiconductor wafer W rapidly drops. Then, at a time point that comes when a predetermined period (several seconds) elapses, the halogen lamps HL of the lower heating part 4 are also turned off. As a result, the temperature of the semiconductor wafer W drops to a temperature lower than the preheating temperature.

After the temperature of the semiconductor wafer W drops to a predetermined temperature or lower, the transfer part 79 horizontally moves from the standby position to the position located inside the inner circumference of the support ring 72. Then, the transfer part 79 moves up along the vertical direction, and thus the pin of the transfer part 79 lifts the processed semiconductor wafer W so that the semiconductor wafer W is spaced apart from the support ring 72. Then, the transport opening 66 is opened, and the hand of the transport robot enters the chamber 6 and stops at the position immediately below the semiconductor wafer W. Then, the transfer part 79 moves down, to transfer the processed semiconductor wafer W to the hand of the transport robot. Then, the hand of the transport robot having received the semiconductor wafer W exits the chamber 6. Thereby, the semiconductor wafer W is transported out. Thus, the flash heating treatment in the heat treatment apparatus 1*b* is completed (step S27). It may be acceptable that, before the transport opening 66 is opened, the atmosphere in the heat treatment space 65 of the chamber 6 is replaced with the atmosphere of atmospheric pressure.

In the fourth preferred embodiment, the supplementary heating is performed in which the back surface of the semiconductor wafer W whose temperature has been raised up to the preheating temperature by the halogen lamps HL is irradiated with flashes of light emitted from the lower flash lamps LFL, and then the surface of the semiconductor wafer W is irradiated with flashes of light emitted from the upper flash lamps UFL, thereby causing the surface to reach the target temperature. That is, a heat treatment with irradiation with flashes of light is divided into two stages, namely, the supplementary heating and the main heating. In the supplementary heating, the temperature is raised up to the intermediate temperature by irradiating the back surface of the semiconductor wafer W with flashes of light. In the main heating, the surface of the semiconductor wafer W is irradiated with flashes of light.

A distribution of the light absorption rate in a plane is uniform in the back surface of the semiconductor wafer W.

Therefore, irradiation of the back surface with flashes of light can uniformly heat the entire back surface without receiving any influence from the pattern formed on the surface. Although irradiation of the surface with flashes of light is influenced by the pattern, the flash heating is partially assigned to the supplementary heating in which the back surface is irradiated with flashes of light. This can reduce the degree to which the light absorption rate in the surface of the semiconductor wafer W depends on the pattern during irradiation with flashes of light in the total heating step in the heat treatment apparatus 1b. As a result, the surface of the semiconductor wafer W can be more uniformly heated, thus achieving a uniform temperature distribution in a plane.

When the back surface of the semiconductor wafer W is irradiated with flashes of light, time period during which the lower flash lamps LFL emit flashes of light is longer than the heat conduction time that is required for heat to be conducted from the back surface to the surface of the semiconductor wafer W. This enables the surface to be also heated by the irradiation of the back surface with flashes of light. Moreover, the waiting time period from when the lower flash lamps LFL complete the supplementary heating to when the upper flash lamps UFL start emitting flashes of light is set longer than the heat conduction time. This enables all the flashes of light emitted to the back surface to contribute to heating of the surface without waste.

In the fourth preferred embodiment, the upper flash lamps UFL of the upper heating part 5 and the lower flash lamps LFL of the lower heating part 4 are arranged in directions perpendicular to each other. This enables an illuminance dispersion in the array of the rod-like upper flash lamps UFL and an illuminance dispersion in the array of the rod-like lower flash lamps LFL to cancel each other. Thus, a temperature distribution in a plane of the semiconductor wafer W can be made more uniform.

Since the lower flash lamps LFL are arranged at a position closer to the support ring 72 provided in the chamber 6 than the halogen lamps HL are. Accordingly, light emitted from the halogen lamps HL partially transmits through the flash lamps FL before entering the chamber 6. If, vice versa, the halogen lamps HL are arranged at a position closer to the support ring 72 than the lower flash lamps LFL are, there is a risk that filaments of the halogen lamps HL may hinder radiation of flashes of light from the lower flash lamps LFL. In the fourth preferred embodiment, the lower flash lamps LFL having no filament are arranged upper than the halogen lamps HL. Therefore, the lower flash lamps LFL cause no hindrance of light emission from the halogen lamps HL.

Furthermore, both the support ring 72 and the light shielding member 71 are made of a material opaque to light emitted from the flash lamps FL and the halogen lamps HL. Accordingly, light emitted from the upper heating part 5 does not travel at the lateral sides of the peripheral portion of the semiconductor wafer W and therefore does not reach the peripheral portion of the lower surface thereof. Thus, the peripheral portion is not heated. Likewise, light emitted from the lower heating part 4 does not travel at the lateral sides of the peripheral portion of the semiconductor wafer W and therefore does not reach the peripheral portion of the upper surface thereof. Thus, the peripheral portion is not heated. Therefore, a temperature distribution in a plane of the semiconductor wafer W can be made more uniform.

Fifth Preferred Embodiment

Next, a fifth preferred embodiment of the present invention will be described. A configuration of a heat treatment apparatus according to the fifth preferred embodiment is exactly the same as that of the heat treatment apparatus 1 according to the first preferred embodiment. To be specific, the heat treatment apparatus according to the fifth preferred embodiment is configured such that the holder 7 includes the Bernoulli chuck 170 and the lower heating part 4 includes only the flash lamps FL as a light source.

Figure 19:
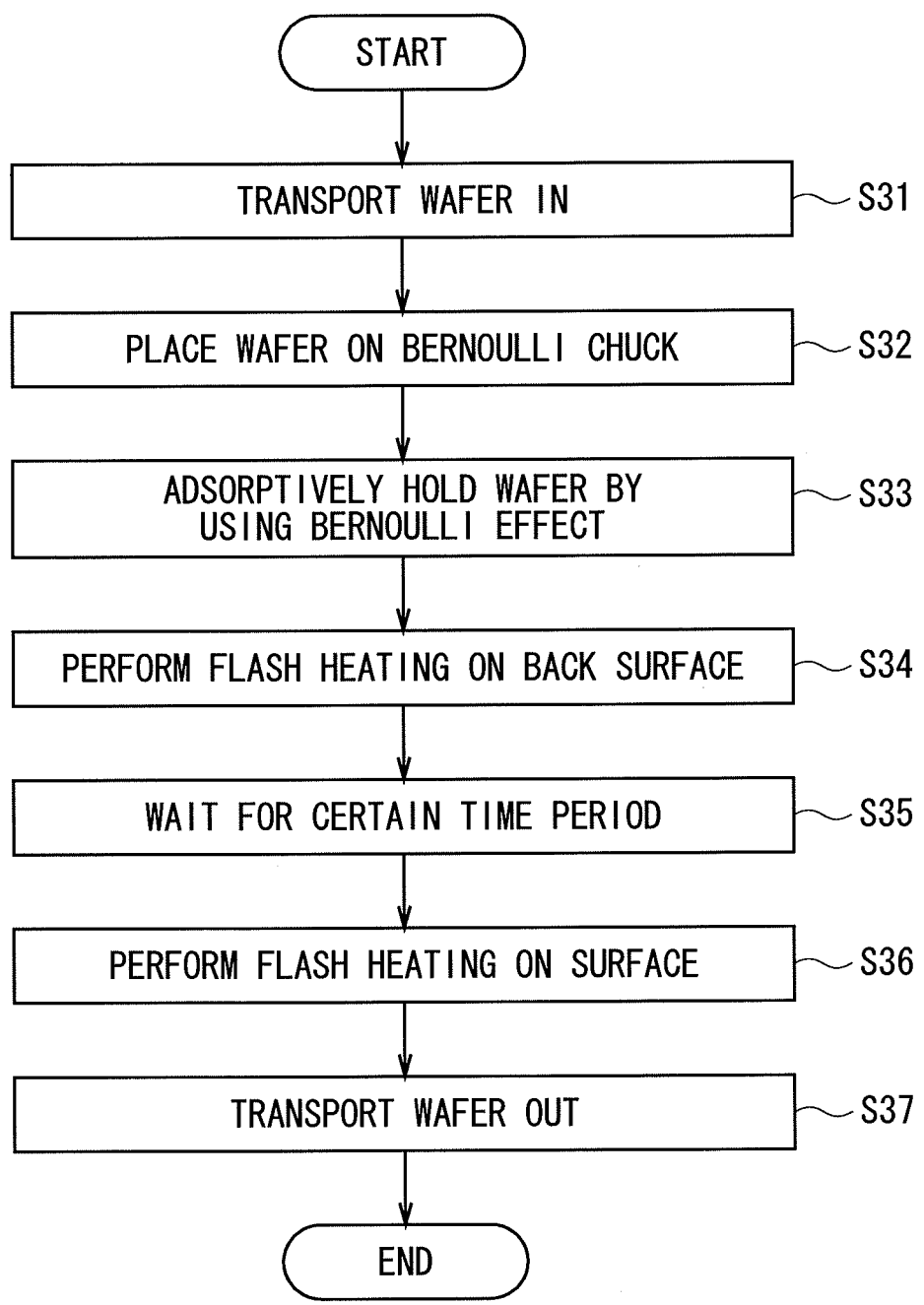
FIG. 19 is a flowchart showing process steps performed on the semiconductor wafer by a heat treatment apparatus according to a fifth preferred embodiment.

FIG. 19 is a flowchart showing process steps performed on the semiconductor wafer W by the heat treatment apparatus 1 according to the fifth preferred embodiment. Firstly, the transport opening 66 is opened, and the transport robot provided outside the apparatus transports the semiconductor wafer W that is a processing object into the chamber 6 (step S31). In the fifth preferred embodiment as well, the semiconductor wafer W serving as the processing object is a silicon semiconductor substrate having a pattern formed on a surface thereof and implanted with impurities.

The hand of the transport robot holding the semiconductor wafer W enters the chamber 6 through the transport opening 66 and then stops at a position immediately above the holder 7. Then, the transfer part 79 horizontally moves from the standby position located under the light shielding member 71 to a position located under the Bernoulli chuck 170, and then moves up along the vertical direction. Thus, the pin of the transfer part 79 passes through the through hole of the Bernoulli chuck 170, and protrudes up from the placement surface 171, to receive the semiconductor wafer W from the hand of the transport robot. Then, the hand of the transport robot exits the chamber 6, and at the same time the transport opening 66 is closed to configure the heat treatment space 65 of the chamber 6 as an enclosed space. Then, the transfer part 79 that has received the semiconductor wafer W moves down, and thereby the semiconductor wafer W is transferred from the pin of the transfer part 79 to the Bernoulli chuck 170 and placed on the placement surface 171 (step S32). The transfer part 79 having transferred the semiconductor wafer W to the Bernoulli chuck 170 returns to the standby position. In the fifth preferred embodiment as well, the semiconductor wafer W is transported into the chamber 6 and placed on the Bernoulli chuck 170 while the surface of the semiconductor wafer W having the pattern formed thereon and implanted with impurities serves as the upper surface facing upward.

Then, after the transport opening 66 is closed to configure the heat treatment space 65 as an enclosed space, the valve 82 is opened so that the process gas (in the fifth preferred embodiment, a nitrogen gas) is supplied from the gas supply part 8 into the heat treatment space 65. Along with this, valve 22 is opened, and the exhaust part 2 exhausts the heat treatment space 65. Simultaneously, the valve 182 is opened so that the nitrogen gas is supplied from the chucking gas supply part 180 to the hollow portion 173 of the Bernoulli chuck 170. The nitrogen gas supplied to the hollow portion 173 is ejected obliquely upward through the ejection port 174, and thereby the semiconductor wafer W is adsorptively held in a non-contact fashion by the Bernoulli chuck 170 due to the ejection pressure of nitrogen and the Bernoulli effect of the nitrogen stream (step S33).

Figure 20:
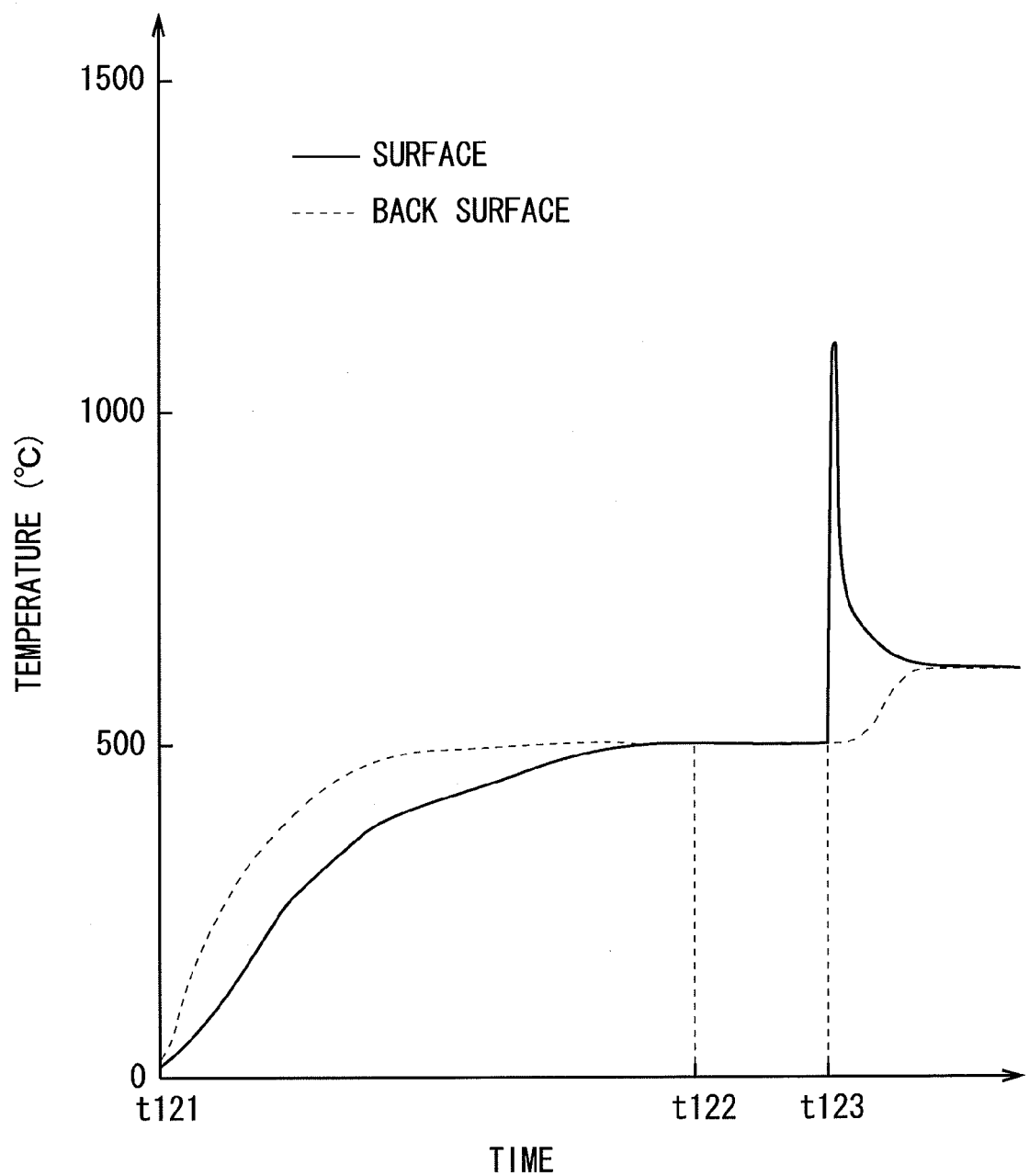
FIG. 20 is a diagram showing changes in the temperatures of the surface and the back surface of the semiconductor wafer according to the fifth preferred embodiment.

After the semiconductor wafer W is held in a non-contact fashion by the Bernoulli chuck 170, the supplementary heating is performed in which the plurality of flash lamps FL (lower flash lamps LFL) of the lower heating part 4 irradiate the back surface of the semiconductor wafer W with flashes of light (step S34). That is, in the fifth preferred embodiment, without performing the preheating with halogen lamps, the supplementary heating is performed in which the back surface of the semiconductor wafer W having the room temperature is irradiated with flashes of light emitted from the lower flash lamps LFL. FIG. 20 is a diagram showing changes in the temperatures of the surface and the back surface of the semiconductor wafer W according to the fifth preferred embodiment. In FIG. 20 as well as FIG. 6, the solid line indicates the surface temperature of the semiconductor wafer W, and the dotted line indicates the back surface temperature of the semiconductor wafer W.

At a predetermined time point t121, under control by the controller 3, the plurality of flash lamps FL of the lower heating part 4 emit flashes of light. This control of light emission from the lower flash lamps LFL is almost the same as that of the first preferred embodiment. To be specific, the controller 3 outputs a pulse signal to the gate of the IGBT 96, and thereby supply of charges from the capacitor 93 to the lower flash lamp LFL is made intermittent, thus achieving a chopper control of the light emission from the lower flash lamps LFL.

FIG. 21 is a diagram showing an output waveform (profile) of a light emission output of the lower flash lamp LFL according to the fifth preferred embodiment. In the fifth preferred embodiment, a time period during which the lower flash lamps LFL emit light is set to be 80 milliseconds as a time period from the time point t121 to a time point t122. Additionally, the light emission output of the lower flash lamp LFL is set such that, after reaching the peak, it gradually decreases and approaches to zero until the time point (time point t122) when the supplementary heating is completed. More specifically, a pulse signal that sets a plurality of pulses whose pulse width gradually decreases and whose pulse interval gradually increases over the time period from the time point t121 to the time point t122 is outputted to the IGBT 96 corresponding to the lower flash lamp LFL. As a result, the lower flash lamp LFL emits light for 80 milliseconds from the time point t121 to the time point t122, and the light emission output thereof reaches the peak and then gradually decreases and approaches to zero until the time point t122.

The flashes of light emitted from the lower flash lamps LFL transmit through the Bernoulli chuck 170 made of quartz, and is radiated to the back surface of the semiconductor wafer W held in a non-contact fashion by the Bernoulli chuck 170. The back surface of the semiconductor wafer W is irradiated with flashes of light outputted from the lower flash lamp LFL whose light emission output has the profile as shown in FIG. 21. Thereby, the supplementary heating is performed on the semiconductor wafer W. The rate of the temperature rise in the back surface of the semiconductor wafer W, which is caused by irradiation with flashes of light emitted from the lower flash lamps LFL in the supplementary heating stage, is set to be 1000° C. per second or more and 40000° C. per second or less. The time period during which the lower flash lamps LFL emit flashes of light in the supplementary heating stage (in the fifth preferred embodiment, 80 milliseconds) is set to be equal to or shorter than one second but longer than the heat conduction time that is required for heat to be conducted from the back surface to the surface of the semiconductor wafer W. As a result of this supplementary heating, as shown in FIG. 20, the temperature of the back surface of the semiconductor wafer W rises over the time period from the time point t121 to the time point t122, and behind it, the temperature of the surface also rises up to the predetermined intermediate temperature (in the fifth preferred embodiment, about 500° C.). The technical meaning of the supplementary heating according to the fifth preferred embodiment, in which the back surface is irradiated with flashes of light, covers the preheating with the halogen lamps HL according to the fourth preferred embodiment.

Moreover, in the fifth preferred embodiment, the light emission output of the lower flash lamp LFL is set such that, after reaching the peak, it gradually decreases and approaches to zero until the time point when the supplementary heating is completed. This prevents an excessive temperature rise in the back surface of the semiconductor wafer W during the supplementary heating stage, and also allows a temperature difference between the surface and the back surface to gradually decrease in a smooth manner until the time point when the supplementary heating is completed. As a result, a thermal stress occurring in the semiconductor wafer W due to the temperature difference between the surface and the back surface can be relieved.

At the time point t122 that is 80 milliseconds after the time point t121, the light emission from the lower flash lamps LFL stops. In the fifth preferred embodiment, the temperature difference between the surface and the back surface of the semiconductor wafer W gradually decreases until the time point when the supplementary heating is completed. Accordingly, at the time point t122 when the light emission from the lower flash lamps LFL stops, the surface temperature and the back surface temperature are almost equal to each other, at the intermediate temperature.

After the light emission from the lower flash lamps LFL stops at the time point t122, a waiting state continues for a certain time period before a time point t123 (step S35). During this waiting time period, neither the upper flash lamps UFL of the upper heating part 5 nor the lower flash lamps LFL of the lower heating part 4 emit light. At the time point t123 that comes when a predetermined waiting time period elapses, under control by the controller 3, the plurality of flash lamps FL of the upper heating part 5 emit flashes of light, to heat the semiconductor wafer W from the surface side thereof (step S36).

The waiting time period from the time point t122 when the supplementary heating performed by the lower flash lamps LFL is completed to the time point t123 when the upper flash lamps UFL start emitting flashes of light is longer than the heat conduction time that is required for heat to be conducted from the back surface to the surface of the semiconductor wafer W. In the fifth preferred embodiment, the waiting time period from the time point t122 to the time point t123 is set to be 20 milliseconds, which is longer than the heat conduction time of 15 milliseconds.

The control of light emission from the upper flash lamps UFL of the upper heating part 5 is the same as that of the first preferred embodiment. To be specific, a single pulse signal having a predetermined duration is outputted to the gate of the IGBT 96 corresponding to the upper flash lamp UFL. Thus, the time period during which the upper flash lamps UFL emit light is significantly shorter than the time period during which the lower flash lamps LFL emit light.

FIG. 22 is a diagram showing an output waveform of a light emission output of the upper flash lamp UFL according to the fifth preferred embodiment. In the fifth preferred embodiment as well, the upper flash lamps UFL are caused to instantaneously emit light at the time point t123, and this light emission time period is set to be about several milliseconds. To be specific, a single pulse signal having a pulse width of several milliseconds is set and, at the time point t123, outputted to the IGBT 96 corresponding to the upper flash lamp UFL, thereby causing the upper flash lamps UFL to instantaneously emit light at the time point t123.

The surface of the semiconductor wafer W having subjected to the supplementary heating by the lower flash lamps LFL is irradiated with flashes of light emitted from the upper flash lamps UFL. Thereby, the flash heating is performed on the surface of the semiconductor wafer W. At this time, the upper flash lamps UFL instantaneously emit flashes of light having a relatively large light emission output. Therefore, as shown in FIG. 20, the surface temperature of the semiconductor wafer W rapidly rises at the time point t123, and reaches a temperature of 1000° C. or higher (in this preferred embodiment, about 1100° C.), at which activation of the impurities is achieved. However, since the time period during which the upper flash lamps UFL emit flashes of light is shorter than the heat conduction time, the semiconductor wafer W itself acts as a heatsink, so that the surface temperature of the semiconductor wafer W having reached 1000° C. or higher rapidly drops. Therefore, a time period during which the surface temperature of the semiconductor wafer W is 1000° C. or higher is extremely short. Thus, diffusion of the impurities is avoided while activation of the impurities is achieved. Since the heat is conducted from the surface to the back surface of the semiconductor wafer W, the back surface temperature slightly rises, too, to make the surface temperature and the back surface temperature equal to each other.

Upon completion of the irradiation with flashes of light emitted from the upper flash lamps UFL, both the upper flash lamps UFL and the lower flash lamps LFL complete light emission. Thus, the temperature of the semiconductor wafer W rapidly drops. After the temperature of the semiconductor wafer W drops to a predetermined temperature or lower, the transfer part 79 horizontally moves from the standby position to the position located under the Bernoulli chuck 170. Then, the transfer part 79 moves up along the vertical direction, and thus the pin of the transfer part 79 lifts the processed semiconductor wafer W so that the semiconductor wafer W is spaced apart from the Bernoulli chuck 170. Then, the transport opening 66 is opened, and the hand of the transport robot enters the chamber 6 and stops at the position immediately below the semiconductor wafer W. Then, the transfer part 79 moves down, to transfer the processed semiconductor wafer W to the hand of the transport robot. Then, the hand of the transport robot having received the semiconductor wafer W exits the chamber 6. Thereby, the semiconductor wafer W is transported out. Thus, the flash heating treatment in the heat treatment apparatus 1 is completed (step S37).

In the fifth preferred embodiment, the supplementary heating is performed in which the back surface of the semiconductor wafer W having the room temperature is irradiated with flashes of light emitted from the lower flash lamps LFL to thereby heat the semiconductor wafer W from the back surface side thereof, and then the surface of the semiconductor wafer W is irradiated with flashes of light emitted from the upper flash lamps UFL, thereby causing the surface to reach the target temperature. The supplementary heating according to the fifth preferred embodiment covers the technical meaning of the conventional preheating with a hot plate or halogen lamps. More specifically, if the temperature of the surface of the semiconductor wafer W is rapidly raised from the room temperature to a temperature of 1000° C. or higher by irradiating the surface of the semiconductor wafer W with flashes of light, there is a risk that cracking may occur in the wafer W. In this respect, a heat treatment with irradiation with flashes of light is divided into two stages, namely, the supplementary heating and the main heating. In the supplementary heating, the temperature is raised up to the intermediate temperature by irradiating the back surface of the semiconductor wafer W with flashes of light. In the main heating, the surface of the semiconductor wafer W is irradiated with flashes of light.

A distribution of the light absorption rate in a plane is uniform in the back surface of the semiconductor wafer W. Therefore, irradiation of the back surface with flashes of light can uniformly heat the entire back surface without receiving any influence from the pattern formed on the surface. Although irradiation of the surface with flashes of light is influenced by the pattern, the flash heating is partially assigned to the supplementary heating in which the back surface is irradiated with flashes of light. This can reduce the degree to which the light absorption rate in the surface of the semiconductor wafer W depends on the pattern during irradiation with flashes of light in the total heating step in the heat treatment apparatus 1. As a result, the surface of the semiconductor wafer W can be more uniformly heated, thus achieving a uniform temperature distribution in a plane.

Sixth Preferred Embodiment

Next, a sixth preferred embodiment of the present invention will be described. A configuration of a heat treatment apparatus according to the sixth preferred embodiment is exactly the same as that of the fourth preferred embodiment. To be specific, the heat treatment apparatus according to the sixth preferred embodiment is configured such that the lower heating part 4 includes the halogen lamps HL and the semiconductor wafer W is supported on the support ring 72

FIG. 23 is a flowchart showing process steps performed on the semiconductor wafer W according to the sixth preferred embodiment. The process steps which will be described below are proceeded along with the controller 3 controlling the operation mechanisms of the heat treatment apparatus 1b.

Firstly, the gate valve (not shown) is opened so that the transport opening 66 is opened. The transport robot provided outside the apparatus transports the semiconductor wafer W that is a processing object into the chamber 6 through the transport opening 66 (step S41). In the sixth preferred embodiment, the semiconductor wafer W serving as the processing object is a silicon semiconductor substrate having a pattern formed on a surface thereof and implanted with impurities. The formation of the pattern and the implantation of the impurities may be implemented by, for example, a photolithography apparatus and an ion implantation apparatus provided independently of the heat treatment apparatus 1b.

Such a semiconductor wafer W is held by a hand of the transport robot, and the hand enters the chamber 6 through the transport opening 66 and then stops at a position immediately above the holder 7 (and to be precise, a position at which the central axis of the semiconductor wafer W coincides with the central axis of the support ring 72). Then, the transfer part 79 horizontally moves from the standby position located under the light shielding member 71 to a position located inside the inner circumference of the support ring 72, and then moves up along the vertical direction. Thus, the pin of the transfer part 79 protrudes up from the support ring 72, to receive the semiconductor wafer W from the hand of the transport robot. Then, the hand of the transport robot exits the chamber 6, and at the same time the transport opening 66 is closed to configure the heat treatment space 65 of the chamber 6 as an enclosed space. Then, the transfer part 79 that has received the semiconductor wafer W moves down, and thereby the semiconductor wafer W is transferred from the pin of the transfer part 79 to the support ring 72 (step S42). The semiconductor wafer W is supported such that the central axis thereof is coincident with the central axis of the support ring 72. Accordingly, the support ring 72 supports a lower surface of the peripheral portion of the semiconductor wafer W throughout the circumference of the semiconductor wafer W. The transfer part 79 having transferred the semiconductor wafer W to the support ring 72 returns to the standby position.

Here, the surface of the semiconductor wafer W means a main surface on which a device is to be formed. On the surface, as described above, the pattern is formed and the impurities are implanted. In the surface of the semiconductor wafer W, a distribution of the absorption rate in a plane is not uniform, because the light absorption rate varies due to the pattern. On the other hand, the back surface of the semiconductor wafer W means a main surface opposite to the surface. On the back surface of the semiconductor wafer W, normally, neither a film nor a pattern is formed. Here, forming the film on the surface may inevitably requires a thin film, such as an oxide film, a nitride film, or a polysilicon film, to be formed on the back surface, too. In such a case, the film is formed uniform. In any case, in the back surface of the semiconductor wafer W, a distribution of the light absorption rate in a plane is uniform. The back surface of the semiconductor wafer W may sometimes have damage that has been caused by the photolithography apparatus and the ion implantation apparatus in the previous step.

In the sixth preferred embodiment, the semiconductor wafer W is transported into the chamber 6 and supported on the support ring 72 with the surface of the semiconductor wafer W serving as an upper surface facing upward. The upper surface of the semiconductor wafer W means the main surface facing upward in the vertical direction, and the lower surface means the surface facing downward. Therefore, in some cases, the surface of the semiconductor wafer W may be the upper surface facing upward, and in other cases, the surface of the semiconductor wafer W may be the lower surface facing downward.

After the transport opening 66 is closed to configure the heat treatment space 65 as an enclosed space, the valve 82 is opened so that the process gas (in this preferred embodiment, a nitrogen gas) is supplied from the gas supply part 8 into the heat treatment space 65. Along with this, the valve 22 is opened, and the exhaust part 2 exhausts the heat treatment space 65. As a result, a stream of nitrogen gas is produced in the heat treatment space 65 of the chamber 6. Thus, a nitrogen atmosphere is created in a region around the semiconductor wafer W held by the holder 7. From the viewpoint of enhancing the efficiency of replacement of the atmosphere in the chamber 6, it is preferable that, without supplying the process gas, the exhaust part 2 exhausts the heat treatment space 65 to once create an atmosphere of reduced pressure that is lower than the atmospheric pressure, and then the process gas is supplied from the gas supply part 8.

After the semiconductor wafer W is placed and supported on the support ring 72 of the holder 7, under control by the controller 3, the plurality of halogen lamps HL of the lower heating part 4 are concurrently turned on, to start a preheating (step S43). Halogen light emitted from the halogen lamps HL transmits through the lower chamber window 64 made of quartz, and the back surface of the semiconductor wafer W supported on the support ring 72 is irradiated. As a result of being irradiated with light from the halogen lamps HL, the temperature of the semiconductor wafer W rises. Since the transfer part 79 is retracted to the standby position located under the light shielding member 71, the transfer part 79 does not hinder the preheating performed by the halogen lamps HL. The light emitted from the halogen lamps HL partially transmits through the flash lamps FL before it is radiated to the back surface of the semiconductor wafer W. This also causes no hindrance of the preheating, because the flash lamps FL have no filament.

By the light emission from the halogen lamps HL, the temperature of the semiconductor wafer W is raised up to a preheating temperature that has been set in advance. The preheating temperature is 300° C. or higher and 800° C. or lower, and in the sixth preferred embodiment, set to be 500° C. After the temperature of the semiconductor wafer W reaches the preheating temperature, the controller 3 keeps the output of the halogen lamps HL so as to maintain the semiconductor wafer W at this preheating temperature for a while. More specifically, the temperature of the semiconductor wafer W is measured by an unillustrated temperature sensor (a contact-type thermometer or a radiation thermometer) and, at a time point when the temperature of the semiconductor wafer W measured by this temperature sensor reaches the preheating temperature, the controller 3 controls the output of the halogen lamps HL so as to maintain the semiconductor wafer W almost at the preheating temperature. A time period taken for the temperature of the semiconductor wafer W to rise from the room temperature to the preheating temperature is about several seconds, and a time period during which the semiconductor wafer W is maintained at the preheating temperature is also about several seconds.

Figure 24:
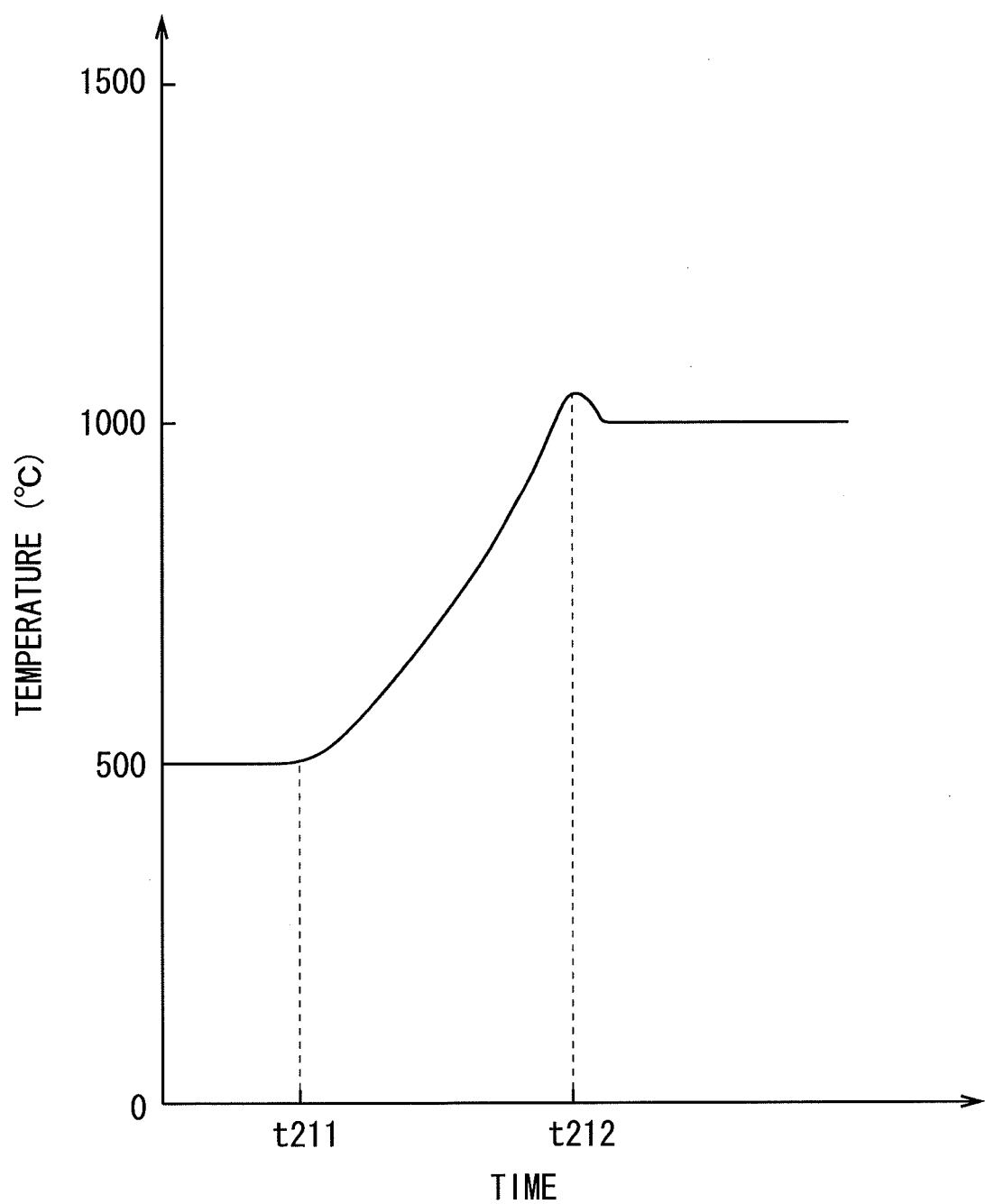
FIG. 24 is a diagram showing changes in the temperatures of the surface and the back surface of the semiconductor wafer according to the sixth preferred embodiment.

Then, after the semiconductor wafer W is maintained at the preheating temperature for a predetermined time period, the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light, to perform a flash heating (step S44). FIG. 24 is a diagram showing changes in the temperatures of the surface and the back surface of the semiconductor wafer W.

At a time point t211 that comes when a predetermined time period elapses after the temperature of the semiconductor wafer W reaches the preheating temperature (in this preferred embodiment, 500° C.), under control by the controller 3, the plurality of flash lamps FL of the lower heating part 4 and the plurality of flash lamps FL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 25:
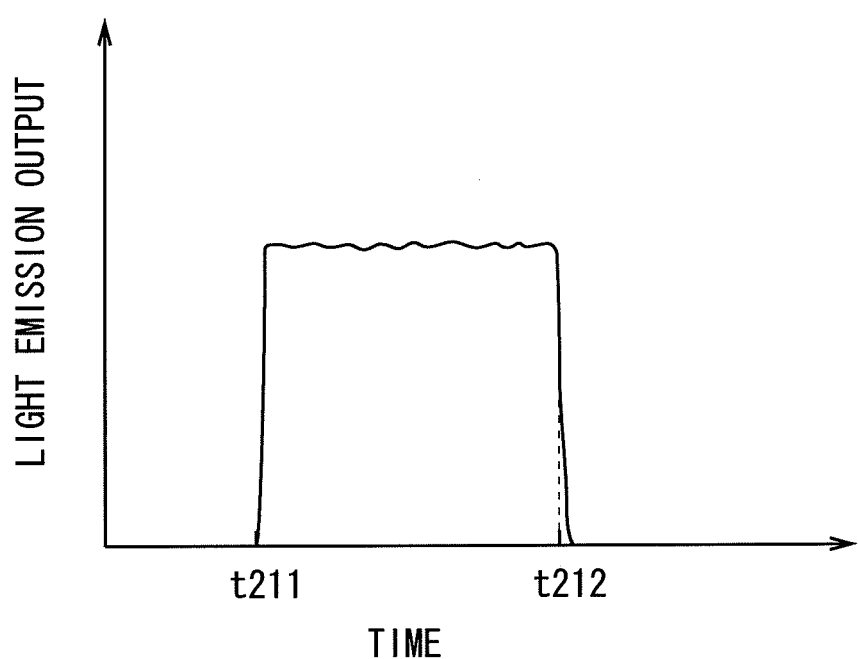
FIG. 25 is a diagram showing light emission output profiles of the lower flash lamp and the upper flash lamp according to the sixth preferred embodiment.

FIG. 25 is a diagram showing output waveforms (profiles) of light emission outputs of the lower flash lamp LFL and the upper flash lamp UFL. In the sixth preferred embodiment, the lower flash lamps LFL and the upper flash lamps UFL simultaneously start light emission at the time point t211, and simultaneously complete the light emission at a time point t212. The light emission output of the lower flash lamp LFL and the light emission output of the upper flash lamp UFL have the same output waveform. Thus, the same pulse signal is outputted to the IGBT 96 corresponding to the lower flash lamp LFL and to the IGBT 96 corresponding to the upper flash lamp UFL, and thereby the lower flash lamps LFL and the upper flash lamps UFL are caused to simultaneously emit light at equivalent output levels. A time period from the time point t211 to the time point t212, during which the flash lamps FL emit light, is set to be 40 milliseconds.

The surface and the back surface of the semiconductor wafer W supported on the support ring 72 are simultaneously irradiated with flashes of light at equivalent output levels. Thereby, the flash heating is performed on the semiconductor wafer W from both the front and back sides thereof. This causes the temperatures of the surface and the back surface of the semiconductor wafer W to rapidly rise and reach the target temperature over the time period from the time point t211 to the time point t212, as shown in FIG. 24. The target temperature is equal to or higher than 1000° C., at which activation of the implanted impurities is achieved. In the sixth preferred embodiment, the target temperature is set to be 1050° C.

The rate of the temperature rise in the surface and the back surface of the semiconductor wafer W, which is caused by the flash heating, is set to be 1000° C. per second or more and 40000° C. per second or less. This rate of the temperature rise can be set by adjusting the pulse width time and the pulse interval time of a pulse signal that is applied to the gate of the IGBT 96. If the rate of the temperature rise in the surface and the back surface exceeds 40000° C. per second, there is a risk that a rapid thermal expansion may cause cracking of the semiconductor wafer W. If the rate of the temperature rise is less than 1000° C. per second, the implanted impurities may undesirably diffuse. In a case where a high-dielectric film (high-k film) formed on the surface of the semiconductor wafer W is subjected to an annealing process, the rate of the temperature rise being less than 1000° C. per second may undesirably cause an oxide film between a silicon material and the high-dielectric film to grow.

Figure 26:
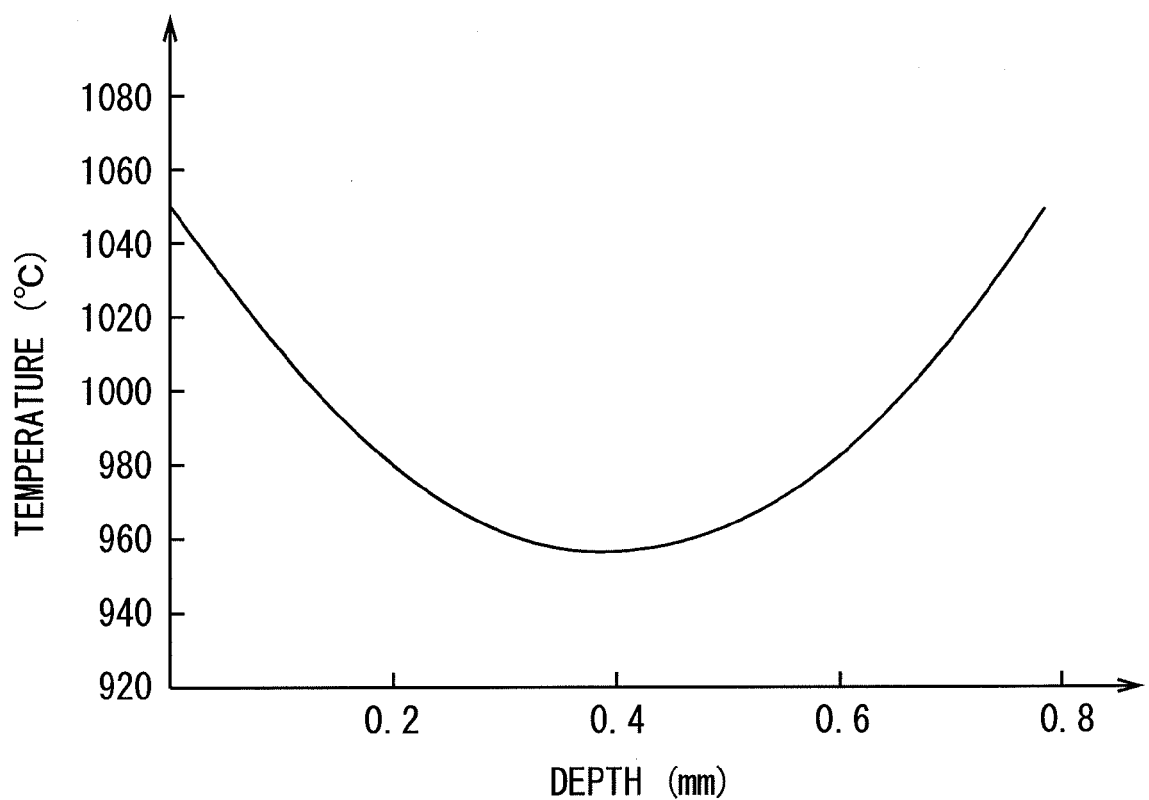
FIG. 26 is a diagram showing a temperature distribution in the thickness direction of the semiconductor wafer according to the sixth preferred embodiment.

FIG. 26 is a diagram showing a temperature distribution in the thickness direction of the semiconductor wafer W. The temperature distribution shown in FIG. 26 is the one obtained at the time point t212 when the surface and the back surface of the semiconductor wafer W reaches the target temperature (1050° C.). In FIG. 26, the horizontal axis indicates the depth from the surface of the semiconductor wafer W. In the sixth preferred embodiment, the semiconductor wafer W is a silicon wafer of φ300 mm, and the thickness thereof is set at a normal value of 0.775 mm according to the standard. Therefore, when the depth is 0 mm, it means the surface of the semiconductor wafer W, and when the depth is 0.775 mm, it means the back surface of the semiconductor wafer W.

At the time point t212, the surface and the back surface of the semiconductor wafer W simultaneously reach the target temperature. Heat generated in the surface of the semiconductor wafer W as a result of irradiation of flashes of light is conducted to the back surface while heat generated in the back surface is conducted to the surface. This results in a temperature distribution in which, as shown in FIG. 26, the surface and the back surface of the semiconductor wafer W become equal to each other at the highest temperature, while a middle portion with respect to the thickness direction has the lowest temperature. Accordingly, the same decree of thermal expansion occurs in the surface and the back surface of the semiconductor wafer W, so that a tensile stress acts in a region near the middle portion of the semiconductor wafer W with respect to the thickness direction which has the lowest temperature.

After the simultaneous irradiation with flashes of light emitted from the upper flash lamps UFL and the lower flash lamps LFL with the same output is completed at the time point t212, the temperatures of both the surface and the back surface of the semiconductor wafer W drop. Then, at a time point that comes when a predetermined period (several seconds) elapses, the halogen lamps HL of the lower heating part 4 are also turned off. As a result, the temperature of the semiconductor wafer W drops to a temperature lower than the preheating temperature.

After the temperature of the semiconductor wafer W drops to a predetermined temperature or lower, the transfer part 79 horizontally moves from the standby position to the position located inside the inner circumference of the support ring 72. Then, the transfer part 79 moves up along the vertical direction, and thus the pin of the transfer part 79 lifts the processed semiconductor wafer W so that the semiconductor wafer W is spaced apart from the support ring 72. Then, the transport opening 66 is opened, and the hand of the transport robot enters the chamber 6 and stops at the position immediately below the semiconductor wafer W. Then, the transfer part 79 moves down, to transfer the processed semiconductor wafer W to the hand of the transport robot. Then, the hand of the transport robot having received the semiconductor wafer W exits the chamber 6. Thereby, the semiconductor wafer W is transported out. Thus, the flash heating treatment in the heat treatment apparatus 1b is completed (step S45). It may be acceptable that, before the transport opening 66 is opened, the atmosphere in the heat treatment space 65 of the chamber 6 is replaced with the atmosphere of atmospheric pressure.

In the sixth preferred embodiment, the surface and the back surface of the preheated semiconductor wafer W are simultaneously irradiated with flashes of light at equivalent output levels. Accordingly, the temperatures of the surface and the back surface of the semiconductor wafer W rise in the same manner over the time period from the time point t211 to the time point t212, and reach the target temperature that is the highest temperature. Then, in a period during which flashes of light are emitted, a temperature distribution occurs in which the surface and the back surface of the semiconductor wafer W are constantly kept at the highest temperature while the middle portion with respect to the thickness direction is constantly kept at the lowest temperature. Therefore, the same degree of thermal expansion occurs in the surface and the back surface of the semiconductor wafer W. A tensile stress caused by the thermal expansion of one of them does not act on the other of them. On the other hand, a tensile stress caused by the thermal expansion of the surface and the back surface acts on the region near the middle portion of the semiconductor wafer W with respect to the thickness direction which has the lowest temperature.

Accordingly, even if damage has occurred on the back surface of the semiconductor wafer W in the previous step, almost no tensile stress acts on the back surface. This can avoid occurrence of cracking of the semiconductor wafer W originating at the damage during irradiation with flashes of light.

Since the surface and the back surface of the semiconductor wafer W are simultaneously irradiated with flashes of light, a temperature difference between the highest temperature and the lowest temperature with respect to the thickness direction of the semiconductor wafer W is reduced as compared with the conventional case in which only the surface of the semiconductor wafer W is irradiated with flashes of light. This also contributes to suppression of cracking of the semiconductor wafer W during irradiation with flashes of light.

In the sixth preferred embodiment, the upper flash lamps UFL of the upper heating part 5 and the lower flash lamps LFL of the lower heating part 4 are arranged in directions perpendicular to each other. This enables an illuminance dispersion in the array of the rod-like upper flash lamps UFL and an illuminance dispersion in the array of the rod-like lower flash lamps LFL to cancel each other. Thus, a temperature distribution in a plane of the semiconductor wafer W can be made more uniform.

Moreover, both the support ring 72 and the light shielding member 71 are made of a material opaque to light emitted from the flash lamps FL and the halogen lamps HL. Accordingly, light emitted from the upper heating part 5 does not travel at the lateral sides of the peripheral portion of the semiconductor wafer W and therefore does not reach the peripheral portion of the lower surface thereof. Thus, the peripheral portion is not heated. Likewise, light emitted from the lower heating part 4 does not travel at the lateral sides of the peripheral portion of the semiconductor wafer W and therefore does not reach the peripheral portion of the upper surface thereof. Thus, the peripheral portion is not heated. Therefore, a temperature distribution in a plane of the semiconductor wafer W can be made more uniform.

Furthermore, as compared with irradiating only the surface of the semiconductor wafer W with flashes of light, the light emission output of the flash lamps FL required to cause the surface of the semiconductor wafer W to reach the target temperature can be reduced. Accordingly, the current that flows through the flash lamp FL during irradiation with flashes of light is made small. Thus, a load on the flash lamp FL is reduced. Particularly, the lifetime of the flash lamp FL decreases as the current flowing therethrough increases. Therefore, the sixth preferred embodiment can prolong the lifetime of the flash lamp FL.

Seventh Preferred Embodiment

Next, a seventh preferred embodiment of the present invention will be described. A configuration of a heat treatment apparatus according to the seventh preferred embodiment is exactly the same as that of the fourth preferred embodiment (or that of the sixth preferred embodiment). Process steps performed on the semiconductor wafer W according to the seventh preferred embodiment are almost the same as those of the sixth preferred embodiment. The seventh preferred embodiment is different from the sixth preferred embodiment, in terms of the light emission output of the flash lamp FL.

Figure 27:
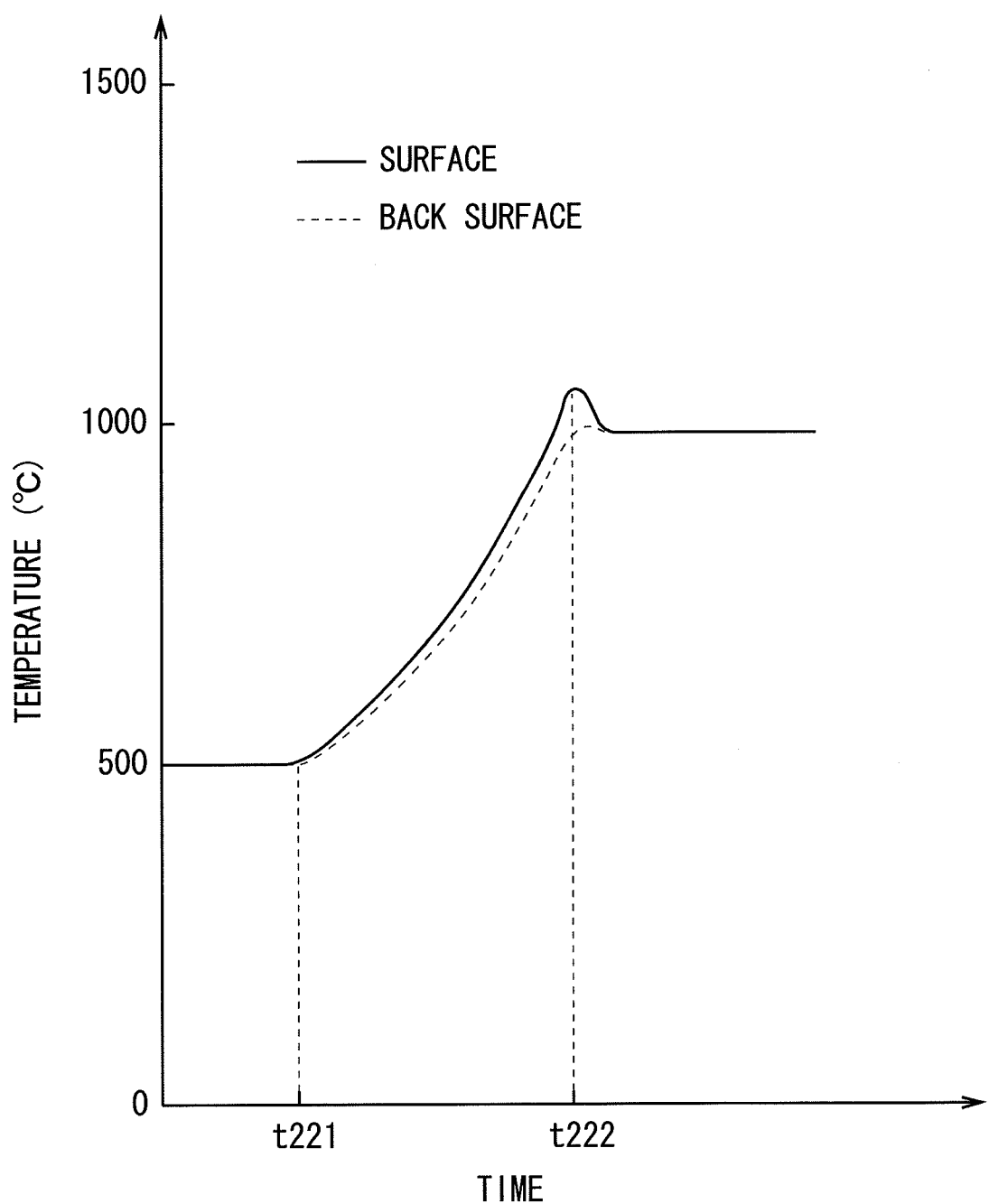
FIG. 27 is a diagram showing changes in the temperatures of the surface and the back surface of the semiconductor wafer according to a seventh preferred embodiment.

In the seventh preferred embodiment as well, after the semiconductor wafer W is preheated, the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light, to thereby perform the flash heating. FIG. 27 is a diagram showing changes in the temperatures of the surface and the back surface of the semiconductor wafer W according to the seventh preferred embodiment. In FIG. 27, the solid line indicates the surface temperature of the semiconductor wafer W, and the dotted line indicates the back surface temperature of the semiconductor wafer W.

At a time point t221 that comes when a predetermined time period elapses after the temperature of the semiconductor wafer W reaches the preheating temperature (500° C.), under control by the controller 3, the plurality of flash lamps FL of the lower heating part 4 and the plurality of flash lamps FL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 28:
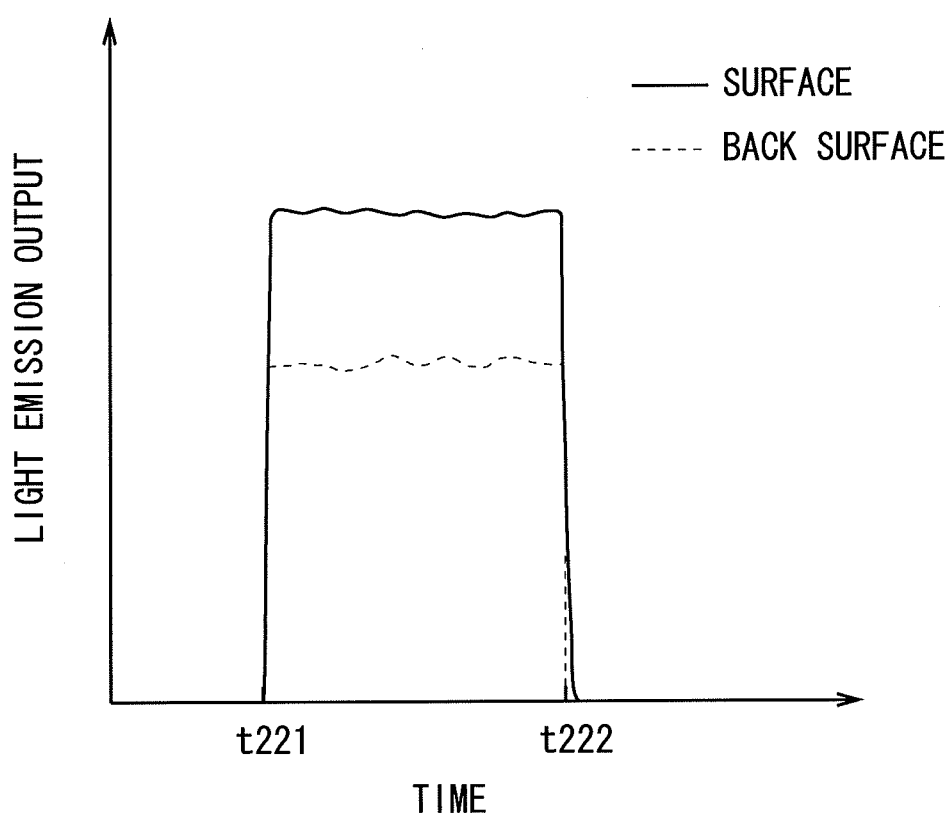
FIG. 28 is a diagram showing light emission output profiles of the lower flash lamp and the upper flash lamp according to the seventh preferred embodiment.

FIG. 28 is a diagram showing output waveforms (profiles) of light emission outputs of the lower flash lamp LFL and the upper flash lamp UFL according to the seventh preferred embodiment. In FIG. 28, the solid line indicates the light emission output profile of the upper flash lamp UFL that irradiates the surface of the semiconductor wafer W, and the dotted line indicates the light emission output profile of the lower flash lamp LFL that irradiates the back surface. In the seventh preferred embodiment, the upper flash lamps UFL and the lower flash lamps LFL simultaneously start light emission at the time point t221, and simultaneously complete the light emission at a time point t222. Here, in the seventh preferred embodiment, as shown in FIG. 28, the light emission output of the upper flash lamp UFL that irradiates the surface of the semiconductor wafer W is set larger than the light emission output of the lower flash lamp LFL that irradiates the back surface. More specifically, a plurality of pulses having a relatively long pulse width are set for a pulse signal to be outputted to the IGBT 96 corresponding to the upper flash lamp UFL, while a plurality of pulses having a relatively short pulse width are set for a pulse signal to be outputted to the IGBT 96 corresponding to the lower flash lamp LFL. This increases the total ON time of the IGBT 96 corresponding to the upper flash lamp UFL, so that the light emission output of the upper flash lamp UFL is made larger than that of the lower flash lamp LFL. A time period during which the flash lamps FL emit light in a time period from the time point t221 to the time point t222 is set to be 40 milliseconds.

The surface and the back surface of the semiconductor wafer W supported on the support ring 72 are simultaneously irradiated with flashes of light. Thereby, the flash heating is performed on the semiconductor wafer W from both the front and back sides thereof. This causes the temperatures of the surface and the back surface of the semiconductor wafer W to rapidly rise over the time period from the time point t221 to the time point t222, as shown in FIG. 27.

In the seventh preferred embodiment, the light emission output of the upper flash lamp UFL is larger than the light emission output of the lower flash lamp LFL, though the timing and period of the light emission thereof are the same. Accordingly, the intensity of flashes of light emitted to the surface of the semiconductor wafer W is higher than the intensity of flashes of light emitted to the back surface. Thus, the temperature of the surface rises up to a higher temperature at a higher rate. In the seventh preferred embodiment, the surface of the semiconductor wafer W is caused to reach 1050° C., which is the target temperature, at the time point t222. The rate of the temperature rise in the surface of the semiconductor wafer W, which is caused by the flash heating, is set to be 1000° C. per second or more and 40000° C. per second or less. In the seventh preferred embodiment, the back surface of the semiconductor wafer W does not reach the target temperature, 1050° C.

Figure 29:
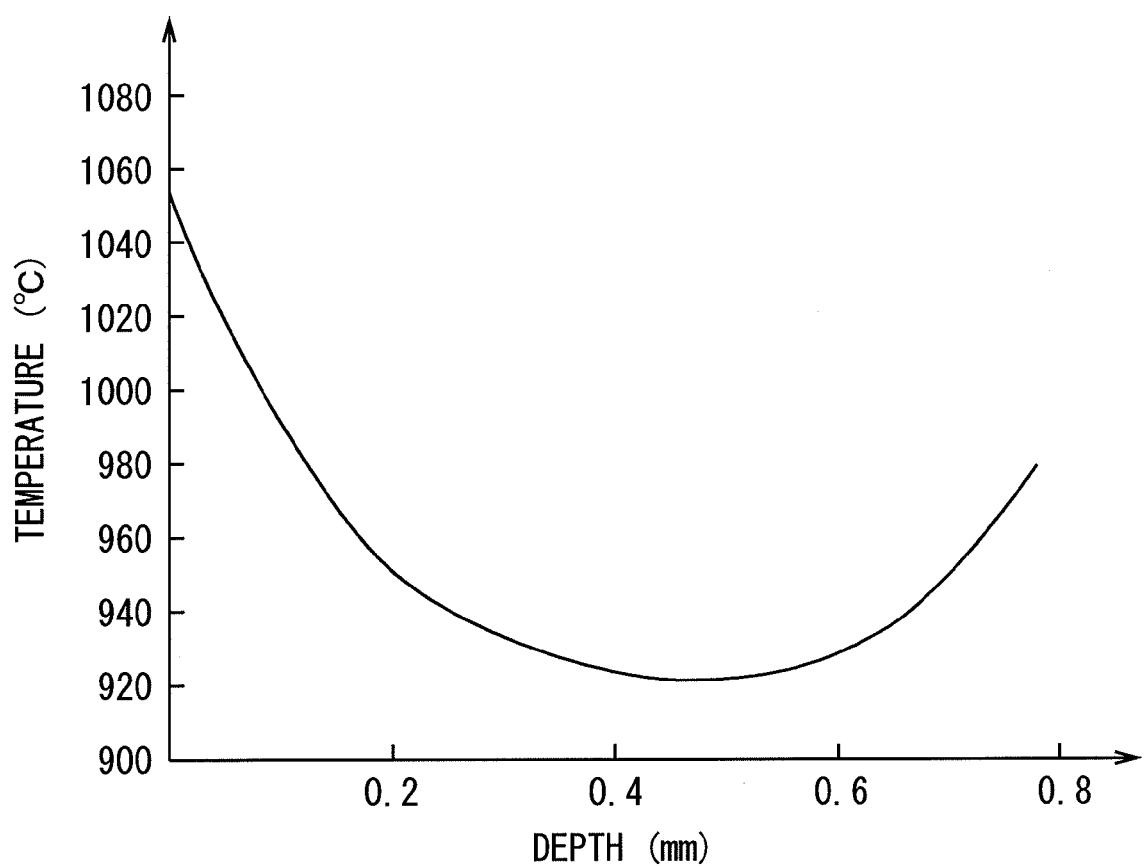
FIG. 29 is a diagram showing a temperature distribution in the thickness direction of the semiconductor wafer according to the seventh preferred embodiment.

FIG. 29 is a diagram showing a temperature distribution in the thickness direction of the semiconductor wafer W according to the seventh preferred embodiment. The temperature distribution shown in FIG. 29 is the one obtained at the time point t222 when the surface of the semiconductor wafer W reaches the target temperature. In FIG. 29, similarly to the sixth preferred embodiment, the horizontal axis indicates the depth from the surface of the semiconductor wafer W.

At the time point t222, the surface of the semiconductor wafer W reaches the target temperature. In the seventh preferred embodiment, flashes of light emitted to the surface has a higher intensity, and therefore, at the time point t222, the back surface temperature of the semiconductor wafer W is lower than the target temperature. Similarly to the sixth preferred embodiment, heat generated in the surface of the semiconductor wafer W as a result of irradiation with flashes of light is conducted to the back surface, and heat generated in the back surface is conducted to the surface. Consequently, as shown in FIG. 29, a lowest temperature region occurs at a position slightly shifted to the back surface side from the middle portion of the semiconductor wafer W with respect to the thickness direction. A tensile stress caused by the thermal expansion of the surface and the back surface of the semiconductor wafer W acts on the lowest temperature region.

In this manner, in the seventh preferred embodiment as well as the sixth preferred embodiment, the surface and the back surface of the preheated semiconductor wafer W are simultaneously irradiated with flashes of light. However, the intensity of flashes of light emitted to the surface of the semiconductor wafer W is higher than the intensity of flashes of light emitted to the back surface. Thus, in a period during which flashes of light are emitted, the lowest temperature region occurs at the position shifted to the back surface side from the middle portion of the semiconductor wafer W with respect to the thickness direction, but nevertheless the lowest temperature does not occur in the surface or the back surface. Accordingly, a tensile stress caused by the thermal expansion of the surface and the back surface of the semiconductor wafer W acts on the lowest temperature region located at the position slightly shifted to the back surface side from the middle portion with respect to the thickness direction.

Therefore, similarly to the sixth preferred embodiment, even if damage has occurred on the back surface of the semiconductor wafer W in the previous step, almost no tensile stress acts on the back surface. This can avoid occurrence of cracking of the semiconductor wafer W originating at the damage during irradiation with flashes of light. Additionally, similarly to the sixth preferred embodiment, a temperature difference between the highest temperature and the lowest temperature with respect to the thickness direction of the semiconductor wafer W is reduced. This also contributes to suppression of cracking of the semiconductor wafer W during irradiation with flashes of light. Moreover, the current that flows through the flash lamp FL during irradiation with flashes of light is made small. Thus, a load on the flash lamp FL is reduced.

In the seventh preferred embodiment, the intensity of flashes of light emitted to the back surface of the semiconductor wafer W is relatively low, so that the maximum temperature reached by the back surface is less than the target temperature. Therefore, the temperature of the entire semiconductor wafer W reached after the flash heating is relatively low. This can increase the rate of temperature drop. However, in the seventh preferred embodiment, the intensity of flashes of light emitted to the surface of the semiconductor wafer W is relatively high. Therefore, in a case where a distribution of the light absorption rate in a plane is non-uniform because of the pattern formed on the surface, an influence thereof results in a non-uniform temperature distribution in a plane of the surface. Thus, the seventh preferred embodiment is suitable for a case where the flash heating is performed on such a semiconductor wafer W that the non-uniformity of a distribution of the absorption rate in a plane, which is caused by the pattern formed on the surface, is relatively small.

Eighth Preferred Embodiment

Next, an eighth preferred embodiment of the present invention will be described. A configuration of a heat treatment apparatus according to the eighth preferred embodiment is exactly the same as that of the fourth preferred embodiment (or that of the sixth preferred embodiment). Process steps performed on the semiconductor wafer W according to the eighth preferred embodiment are almost the same as those of the sixth preferred embodiment. The eighth preferred embodiment is different from the sixth preferred embodiment, in terms of the light emission output of the flash lamp FL.

Figure 30:
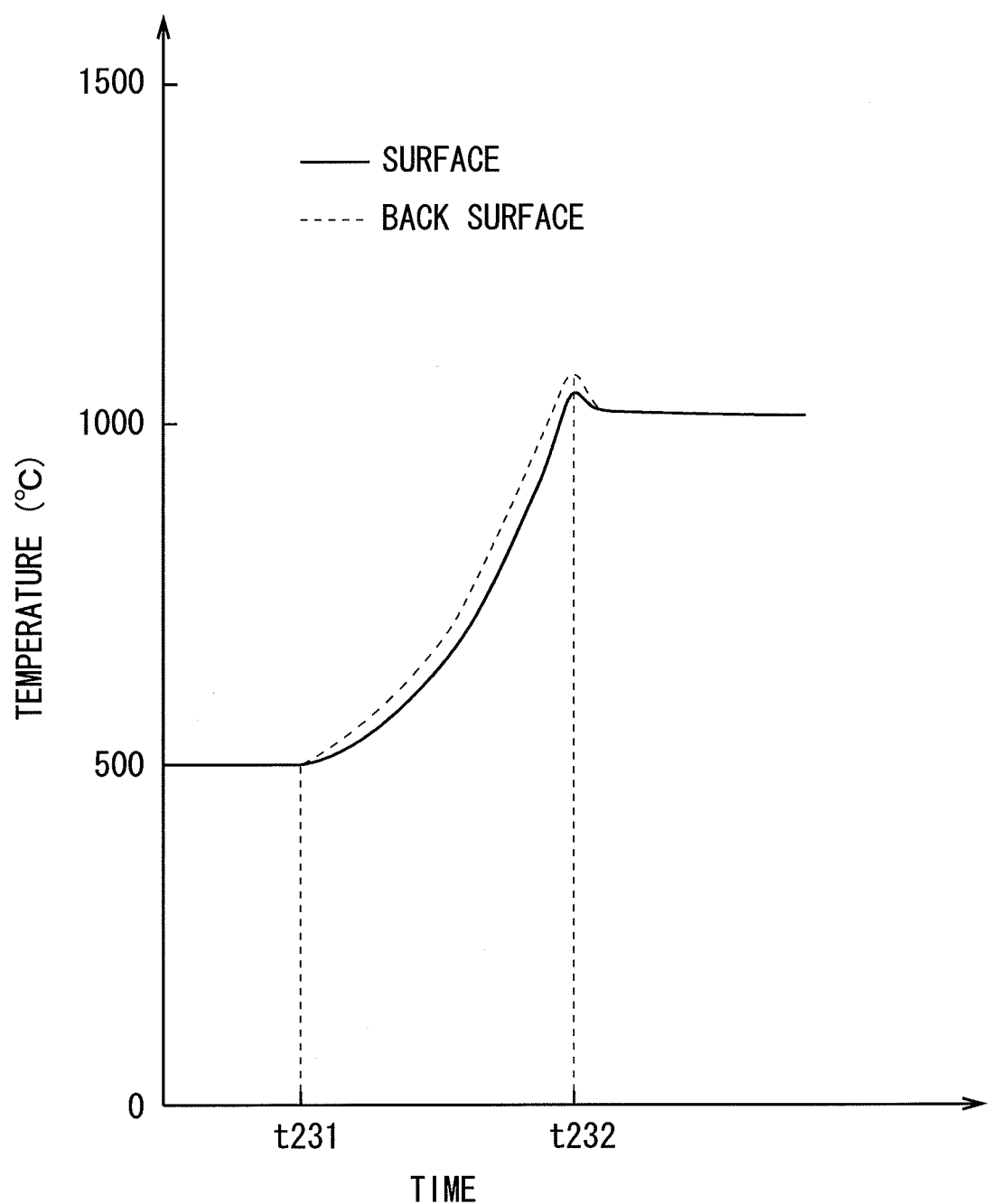
FIG. 30 is a diagram showing changes in the temperatures of the surface and the back surface of the semiconductor wafer according to an eighth preferred embodiment.

In the eighth preferred embodiment as well, after the semiconductor wafer W is preheated, the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light, to thereby perform the flash heating. FIG. 30 is a diagram showing changes in the temperatures of the surface and the back surface of the semiconductor wafer W according to the eighth preferred embodiment. In FIG. 30, the solid line indicates the surface temperature of the semiconductor wafer W, and the dotted line indicates the back surface temperature of the semiconductor wafer W.

At a time point t231 that comes when a predetermined time period elapses after the temperature of the semiconductor wafer W reaches the preheating temperature (500° C.), under control by the controller 3, the plurality of flash lamps FL of the lower heating part 4 and the plurality of flash lamps FL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 31:
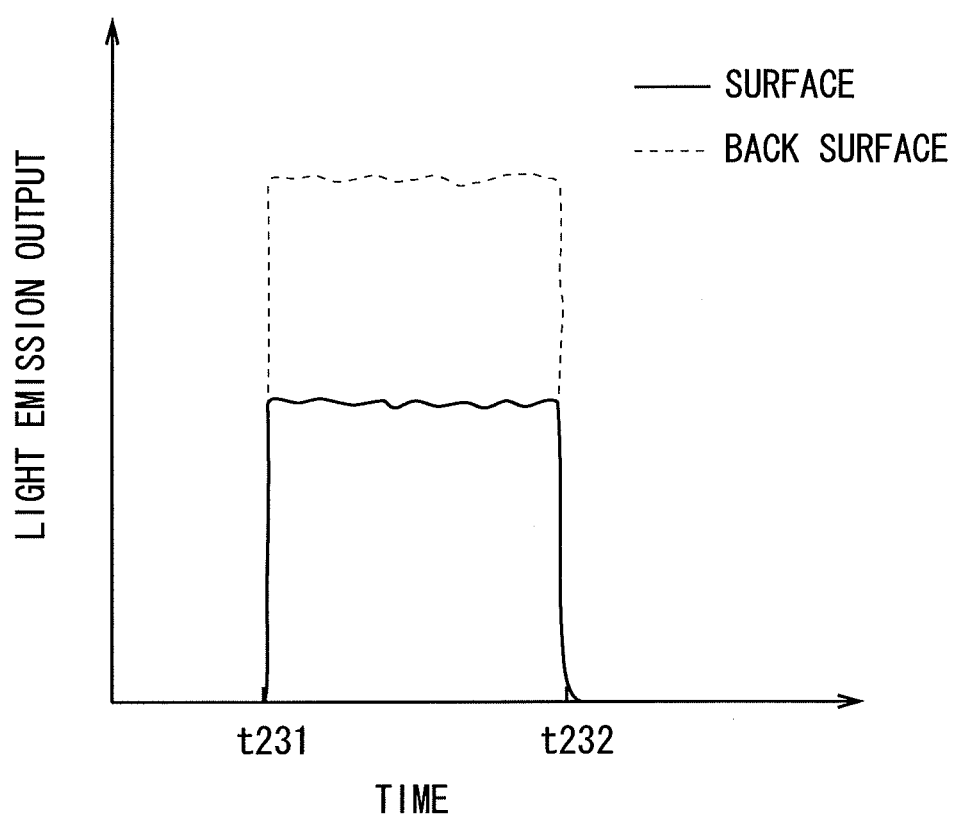
FIG. 31 is a diagram showing light emission output profiles of the lower flash lamp and the upper flash lamp according to the eighth preferred embodiment.

FIG. 31 is a diagram showing output waveforms (profiles) of light emission outputs of the lower flash lamp LFL and the upper flash lamp UFL according to the eighth preferred embodiment. In FIG. 31, the solid line indicates the light emission output profile of the upper flash lamp UFL that irradiates the surface of the semiconductor wafer W, and the dotted line indicates the light emission output profile of the lower flash lamp LFL that irradiates the back surface. In the eighth preferred embodiment, the upper flash lamps UFL and the lower flash lamps LFL simultaneously start light emission at the time point t221, and simultaneously complete the light emission at a time point t232. Here, in the eighth preferred embodiment, in contrast to the seventh preferred embodiment, as shown in FIG. 31, the light emission output of the upper flash lamp UFL that irradiates the surface of the semiconductor wafer W is set smaller than the light emission output of the lower flash lamp LFL that irradiates the back surface. More specifically, a plurality of pulses having a relatively short pulse width are set for a pulse signal to be outputted to the IGBT 96 corresponding to the upper flash lamp UFL, while a plurality of pulses having a relatively long pulse width are set for a pulse signal to be outputted to the IGBT 96 corresponding to the lower flash lamp LFL. This shortens the total ON time of the IGBT 96 corresponding to the upper flash lamp UFL, so that the light emission output of the upper flash lamp UFL is made smaller than that of the lower flash lamp LFL. A time period during which the flash lamps FL emit light in a time period from the time point t231 to the time point t232 is set to be 40 milliseconds.

The surface and the back surface of the semiconductor wafer W supported on the support ring 72 are simultaneously irradiated with flashes of light. Thereby, the flash heating is performed on the semiconductor wafer W from both the front and back sides thereof. This causes the temperatures of the surface and the back surface of the semiconductor wafer W to rapidly rise over the time period from the time point t231 to the time point t232, as shown in FIG. 30.

In the eighth preferred embodiment, the light emission output of the upper flash lamp UFL is smaller than the light emission output of the lower flash lamp LFL, though the timing and period of the light emission thereof are the same. Accordingly, the intensity of flashes of light emitted to the back surface of the semiconductor wafer W is higher than the intensity of flashes of light emitted to the surface. Thus, the temperature of the back surface rises up to a higher temperature at a higher rate. In the eighth preferred embodiment, the surface of the semiconductor wafer W is caused to reach 1050° C., which is the target temperature, at the time point t232. Therefore, in the eighth preferred embodiment, the maximum temperature reached by the back surface of the semiconductor wafer W exceeds the target temperature, 1050° C. The rate of the temperature rise in the surface of the semiconductor wafer W, which is caused by the flash heating, is set to be 1000° C. per second or more and 40000° C. per second or less.

Figure 32:
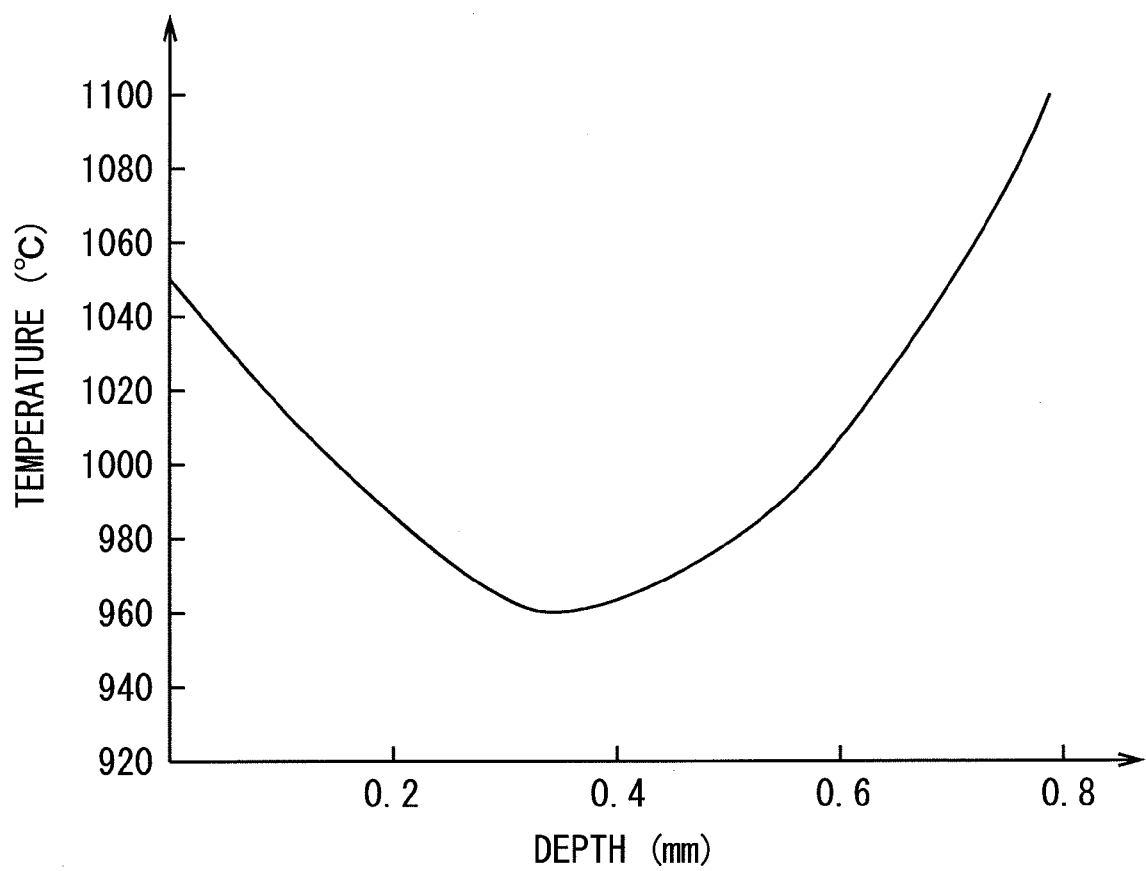
FIG. 32 is a diagram showing a temperature distribution in the thickness direction of the semiconductor wafer according to the eighth preferred embodiment.

FIG. 32 is a diagram showing a temperature distribution in the thickness direction of the semiconductor wafer W according to the eighth preferred embodiment. The temperature distribution shown in FIG. 32 is the one obtained at the time point t232 when the surface of the semiconductor wafer W reaches the target temperature. In FIG. 32, similarly to the sixth preferred embodiment, the horizontal axis indicates the depth from the surface of the semiconductor wafer W.

At the time point t232, the surface of the semiconductor wafer W reaches the target temperature. In the eighth preferred embodiment, flashes of light emitted to the back surface has a higher intensity, and therefore, at the time point t232, the back surface temperature of the semiconductor wafer W is higher than the target temperature. Similarly to the sixth preferred embodiment, heat generated in the surface of the semiconductor wafer W as a result of irradiation with flashes of light is conducted to the back surface, and heat generated in the back surface is conducted to the surface. Consequently, as shown in FIG. 32, a lowest temperature region occurs at a position slightly shifted to the surface side from the middle portion of the semiconductor wafer W with respect to the thickness direction. A tensile stress caused by the thermal expansion of the surface and the back surface of the semiconductor wafer W acts on the lowest temperature region.

In this manner, in the eighth preferred embodiment as well as the sixth preferred embodiment, the surface and the back surface of the preheated semiconductor wafer W are simultaneously irradiated with flashes of light. However, the intensity of flashes of light emitted to the back surface of the semiconductor wafer W is higher than the intensity of flashes of light emitted to the surface. Thus, in a period during which flashes of light are emitted, the lowest temperature region occurs at the position shifted to the surface side from the middle portion of the semiconductor wafer W with respect to the thickness direction, but nevertheless the lowest temperature does not occur in the surface or the back surface. Accordingly, a tensile stress caused by the thermal expansion of the surface and the back surface of the semiconductor wafer W acts on the lowest temperature region located at the position slightly shifted to the surface side from the middle portion with respect to the thickness direction.

Therefore, similarly to the sixth preferred embodiment, even if damage has occurred on the back surface of the semiconductor wafer W in the previous step, almost no tensile stress acts on the back surface. This can avoid occurrence of cracking of the semiconductor wafer W originating at the damage during irradiation with flashes of light. Additionally, similarly to the sixth preferred embodiment, a temperature difference between the highest temperature and the lowest temperature with respect to the thickness direction of the semiconductor wafer W is reduced. This also contributes to suppression of cracking of the semiconductor wafer W during irradiation with flashes of light. Moreover, the current that flows through the flash lamp FL during irradiation with flashes of light is made small. Thus, a load on the flash lamp FL is reduced.

In the eighth preferred embodiment, in contrast to the seventh preferred embodiment, the intensity of flashes of light emitted to the surface of the semiconductor wafer W is relatively low. Therefore, even in a case where a distribution of the light absorption rate in a plane is non-uniform because of the pattern formed on the surface, an influence thereof is suppressed. However, in the eighth preferred embodiment, the intensity of flashes of light emitted to the back surface of the semiconductor wafer W is relatively high, so that the maximum temperature reached by the back surface exceeds the target temperature. Therefore, the temperature of the entire semiconductor wafer W reached after the flash heating is relatively high. This requires a longer time for the temperature drop, as compared with the seventh preferred embodiment. Thus, the eighth preferred embodiment is suitable for a case where the flash heating is performed on such a semiconductor wafer W that the non-uniformity of a distribution of the absorption rate in a plane, which is caused by the pattern formed on the surface, is relatively large.

Ninth Preferred Embodiment

Next, a ninth preferred embodiment of the present invention will be described. A configuration of a heat treatment apparatus according to the ninth preferred embodiment is exactly the same as that of the fourth preferred embodiment (or that of the sixth preferred embodiment). Process steps performed on the semiconductor wafer W according to the ninth preferred embodiment are almost the same as those of the sixth preferred embodiment. The ninth preferred embodiment is different from the sixth preferred embodiment, in terms of the timing and period of the light emission and the light emission output of the flash lamp FL.

In the ninth preferred embodiment as well, after the semiconductor wafer W is preheated, the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light, to thereby perform the flash heating.

Figure 33:
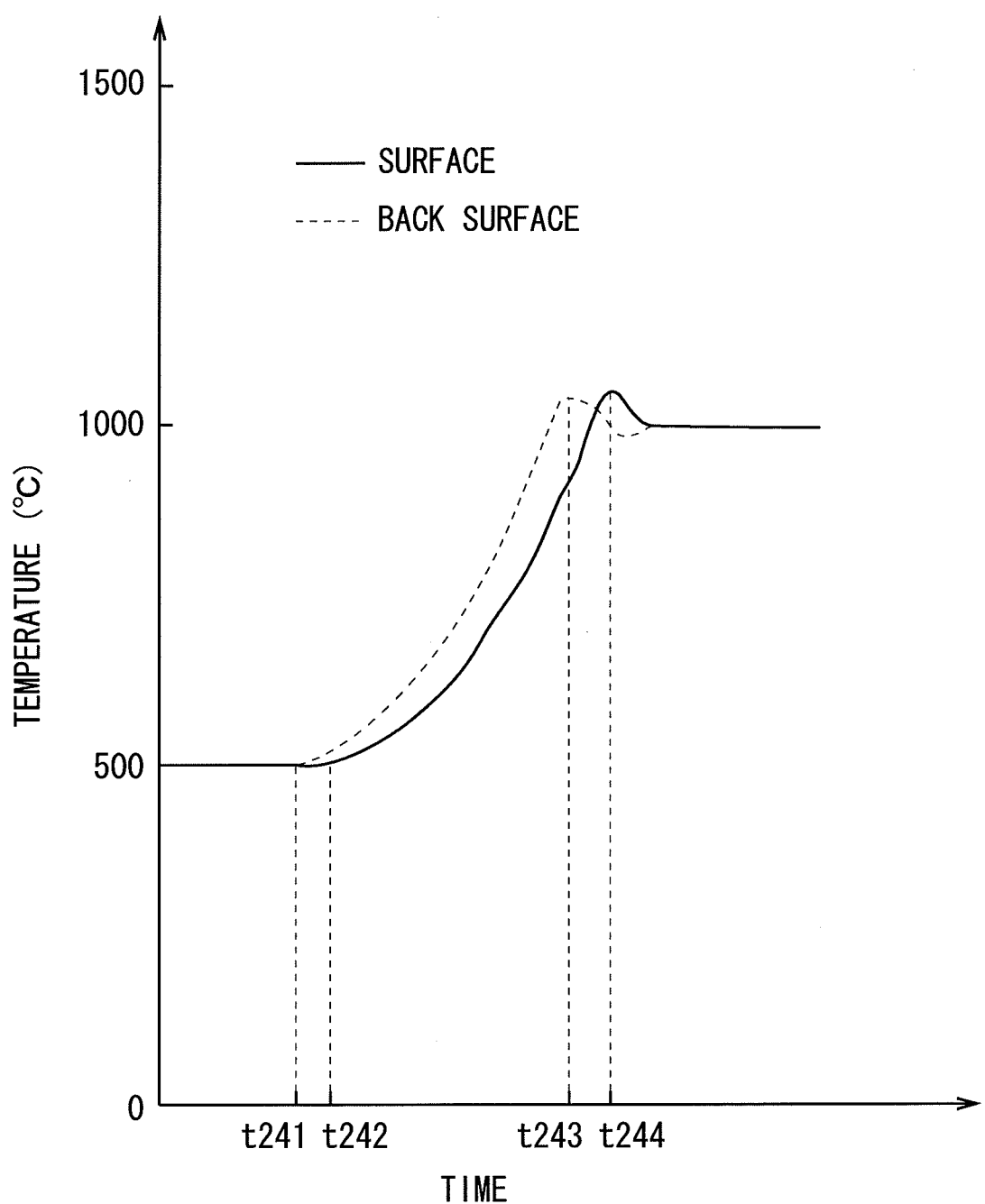
FIG. 33 is a diagram showing changes in the temperatures of the surface and the back surface of the semiconductor wafer according to a ninth preferred embodiment.

FIG. 33 is a diagram showing changes in the temperatures of the surface and the back surface of the semiconductor wafer W according to the ninth preferred embodiment. In FIG. 33, the solid line indicates the surface temperature of the semiconductor wafer W, and the dotted line indicates the back surface temperature of the semiconductor wafer W.

At a time point t241 that comes when a predetermined time period elapses after the temperature of the semiconductor wafer W reaches the preheating temperature (500° C.), under control by the controller 3, the plurality of flash lamps FL of the lower heating part 4 emit flashes of light. Then, at a time point t242, under control by the controller 3, the plurality of flash lamps FL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 34:
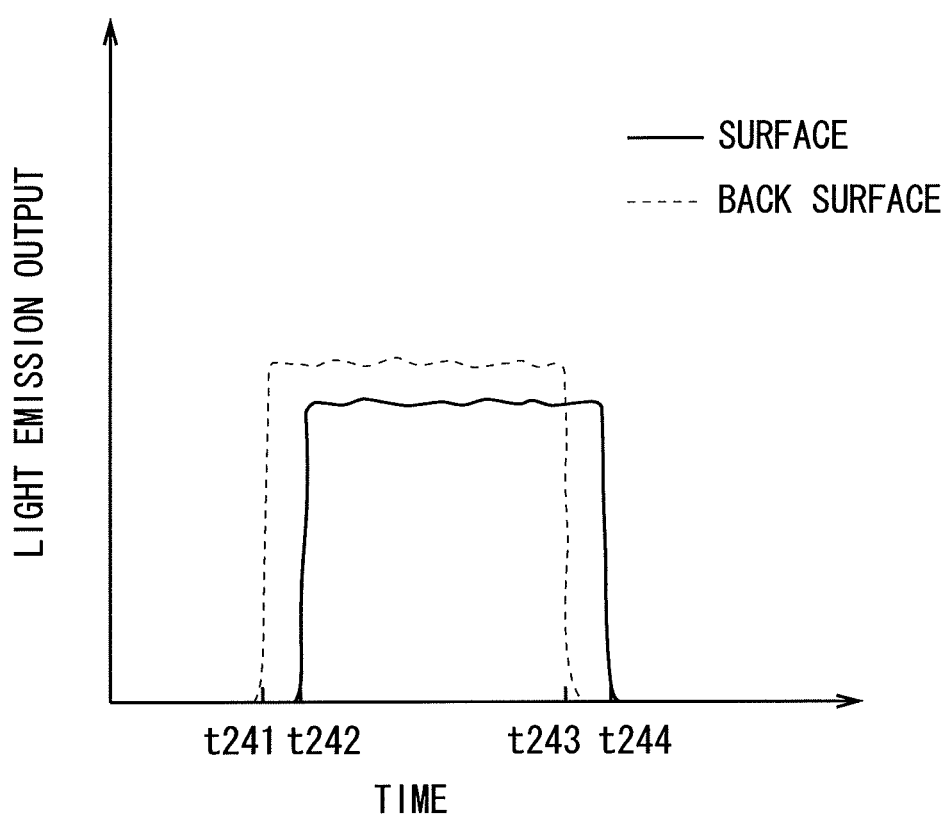
FIG. 34 is a diagram showing light emission output profiles of the lower flash lamp and the upper flash lamp according to the ninth preferred embodiment.

FIG. 34 is a diagram showing output waveforms (profiles) of light emission outputs of the lower flash lamp LFL and the upper flash lamp UFL according to the ninth preferred embodiment. In FIG. 34, the solid line indicates the light emission output profile of the upper flash lamp UFL that irradiates the surface of the semiconductor wafer W, and the dotted line indicates the light emission output profile of the lower flash lamp LFL that irradiates the back surface. In the ninth preferred embodiment, the lower flash lamps LFL start light emission at the time point t241, and complete the light emission at a time point t243. The upper flash lamps UFL starts light emission at the time point t242 that comes after the time point t241, and complete the light emission at a time point t244 that comes after the time point t243. In other words, in the ninth preferred embodiment, the start and completion of light emission from the lower flash lamps LFL precede the start and completion of light emission from the upper flash lamps UFL, respectively. A time period from the time point t241 to the time point t243 during which the lower flash lamps LFL emit light is 40 milliseconds, and a time period from the time point t242 to the time point t244 during which the upper flash lamps UFL emit light is also 40 milliseconds. Each of an elapsed time from the time point t241 to the time point t242 and an elapsed time from the time point t243 to the time point t244 is set to be 5 milliseconds. In other words, a length of delay time by which the timing and period of light emission of the upper flash lamps UFL are delayed is set to be 5 milliseconds. Accordingly, in a period of 35 milliseconds from the time point t242 to the time point t243, the timing and period of light emission of the upper flash lamps UFL overlap the timing and period of light emission of the lower flash lamps LFL.

As shown in FIG. 34, the light emission output of the upper flash lamp UFL that irradiates the surface of the semiconductor wafer W is smaller than the light emission output of the lower flash lamp LFL that irradiates the back surface. To be specific, a plurality of pulses having a relatively short pulse width are set for a pulse signal to be outputted to the IGBT 96 corresponding to the upper flash lamp UFL, while a plurality of pulses having a relatively long pulse width are set for a pulse signal to be outputted to the IGBT 96 corresponding to the lower flash lamp LFL. This shortens the total ON time of the IGBT 96 corresponding to the upper flash lamp UFL, so that the light emission output of the upper flash lamp UFL is made smaller than that of the lower flash lamp LFL.

At the time point t241, the lower flash lamps LFL start irradiating the back surface of the semiconductor wafer W supported on the support ring 72 with flashes of light. Thereby, the back surface of the semiconductor wafer W is firstly heated. In a time period from the time point t241 to the time point t242, the surface of the semiconductor wafer W is not irradiated with flashes of light. Therefore, in the time period from the time point t241 to the time point t242, the semiconductor wafer W is heated only at the back surface side thereof.

Figure 36:
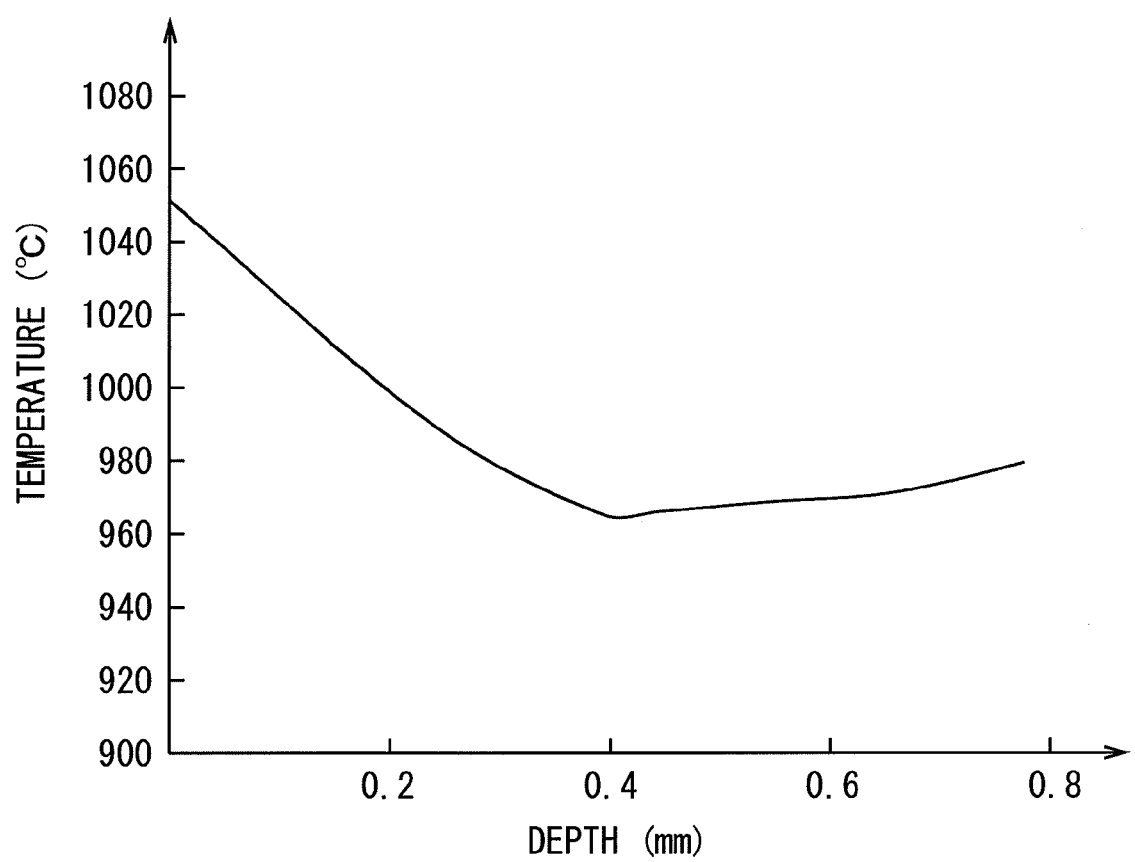
FIG. 36 is a diagram showing a temperature distribution in the thickness direction of the semiconductor wafer according to the ninth preferred embodiment.

FIGS. 35 and 36 are diagrams each showing a temperature distribution in the thickness direction of the semiconductor wafer W according to the ninth preferred embodiment. In FIGS. 35 and 36, the horizontal axis indicates the depth from the surface of the semiconductor wafer W. The temperature distribution shown in FIG. 35 is the one obtained immediately before the time point t242, that is, obtained at a time point when only the back surface of the semiconductor wafer W is irradiated with flashes of light.

In the time period from the time point t241 to the time point t242, only the back surface of the semiconductor wafer W is irradiated with flashes of light, and therefore the back surface has the highest temperature in the temperature distribution in the thickness direction. Heat generated in the back surface of the semiconductor wafer W as a result of irradiation with flashes of light is conducted to the surface, but, in this time period, the surface of the semiconductor wafer W has the lowest temperature, as shown in FIG. 35. However, a time length from the time point t241 to the time point t242, that is, only about five milliseconds, does not cause a large temperature rise in the back surface of the semiconductor wafer W. Therefore, a large tensile stress does not act on the surface.

Then, at the time point t242, the surface of the semiconductor wafer W is also irradiated with flashes of light. Therefore, after the time point t242, the flash heating is performed on the semiconductor wafer W from both the front and back sides thereof. Since irradiation of the surface of the semiconductor wafer W with flashes of light is delayed behind irradiation of the back surface, the temperature rise in the surface slightly delays behind the temperature rise in the back surface, as shown in FIG. 33.

In a time period from the time point t242 to the time point t243, both the surface and the back surface of the semiconductor wafer W are kept irradiated with flashes of light. Then, at the time point t243, the irradiation of the back surface of the semiconductor wafer W with flashes of light is completed in advance of completion of the irradiation of the surface. Thus, the back surface of the semiconductor wafer W is irradiated with flashes of light for the time period from the time point t241 to the time point t243. Thereby, the temperature of the back surface of the semiconductor wafer W rises during the time period from the time point t241 to the time point t243.

In a time period from the time point t243 to the time point t244, only the surface of the semiconductor wafer W is irradiated with flashes of light. However, in this time period, heat is continuously conducted from the back surface, whose temperature has been raised in advance, to the surface of the semiconductor wafer W. Then, at the time point t244, the irradiation of the surface of the semiconductor wafer W with flashes of light is completed. Thus, the surface of the semiconductor wafer W is irradiated with flashes of light for the time period from the time point t242 to the time point t244. Thereby, the temperature of the surface of the semiconductor wafer W rises during the time period from the time point t242 to the time point t244.

In the ninth preferred embodiment, the surface of the semiconductor wafer W is caused to reach 1050° C., which is the target temperature, at the time point t244. The rate of the temperature rise in the surface of the semiconductor wafer W, which is caused by the flash heating, is set to be 1000° C. per second or more and 40000° C. per second or less.

The temperature distribution shown in FIG. 36 is the one obtained at the time point t244 when the surface of the semiconductor wafer W reaches the target temperature. At the time point t242, irradiation of the surface of the semiconductor wafer W with flashes of light is started, and thereby the flash heating is performed on the semiconductor wafer W from both the front and back sides thereof. Thus, heat generated in the surface is conducted to the back surface, while heat generated in the back surface is conducted to the surface. As a result, a lowest temperature region that has initially occurred in the surface of the semiconductor wafer W is shifted inward with respect to the thickness direction. Then, at the time point t244, as shown in FIG. 36, the lowest temperature region is located almost near the middle portion with respect to the thickness direction. A tensile stress caused by the thermal expansion of the surface of the semiconductor wafer W at the time point t244 acts on the lowest temperature region located near the middle portion with respect to the thickness direction. At the time point t244, the irradiation of the back surface of the semiconductor wafer W with flashes of light is already completed, and therefore the back surface temperature has slightly dropped. Thus, the degree of thermal expansion in the back surface is smaller than in the surface.

As described above, in the ninth preferred embodiment, time periods during which the upper flash lamps UFL and the lower flash lamps LFL emit flashes of light partially overlap each other. In the time period from the time point t242 to the time point t243, the surface and the back surface of the semiconductor wafer W are simultaneously irradiated with flashes of light. Accordingly, after the time point t242, the lowest temperature region, which has once occurred in the surface of the semiconductor wafer W in the time period from the time point t241 to the time point t242, is shifted inward with respect to the thickness direction. At the time point t244 when the surface reaches the target temperature, the lowest temperature region is located near the middle portion with respect to the thickness direction. Therefore, in the time period from the time point t243 to the time point t244 during which a large thermal expansion occurs in the surface and the back surface of the semiconductor wafer W, the lowest temperature region is located inside with respect to the thickness direction, so that a tensile stress caused by the thermal expansion of the surface and the back surface acts on the lowest temperature region located inside.

Accordingly, similarly to the sixth preferred embodiment, even if damage has occurred on the back surface of the semiconductor wafer W in the previous step, almost no tensile stress acts on the back surface. This can avoid occurrence of cracking of the semiconductor wafer W originating at the damage during irradiation with flashes of light. Additionally, similarly to the sixth preferred embodiment, a temperature difference between the highest temperature and the lowest temperature with respect to the thickness direction of the semiconductor wafer W is reduced. This also contributes to suppression of cracking of the semiconductor wafer W during irradiation with flashes of light. Particularly in the ninth preferred embodiment, at the time point t244 when the surface reaches the target temperature, there is almost no temperature difference between the lowest temperature region and the back surface of the semiconductor wafer W, and therefore the amount of stress applied from the back surface side is extremely small. Moreover, the current that flows through the flash lamp FL during irradiation with flashes of light is made small. Thus, a load on the flash lamp FL is reduced.

In the ninth preferred embodiment, the beginning (time point t241) of the time period during which the lower flash lamps LFL emit flashes of light is earlier than the beginning (time point t242) of the time period during which the upper flash lamps UFL emit flashes of light. Accordingly, the surface can be heated by being irradiated with flashes of light with assistance of the heat conducted from the back surface. This makes it possible to reduce the intensity of flashes of light emitted from the upper flash lamps UFL, thus reducing an influence of the pattern formed on the surface.

In the ninth preferred embodiment, the end (time point t243) of the time period during which the lower flash lamps LFL emit flashes of light is earlier than the end (time point t244) of the time period during which the upper flash lamps UFL emit flashes of light. Accordingly, at the time point t244 when the surface of the semiconductor wafer W reaches the target temperature, the back surface temperature has slightly dropped. As a result, the temperature of the entire semiconductor wafer W reached after the flash heating is relatively low. This can increase the rate of temperature drop.

Particularly in the ninth preferred embodiment, the time interval from the end of the time period during which the lower flash lamps LFL emit flashes of light to the end of the time period during which the upper flash lamps UFL emit flashes of light is set shorter than the heat conduction time that is required for heat to be conducted from the back surface to the surface of the semiconductor wafer W. Here, the "heat conduction time" means a time length necessary until the heat generated in the back surface of the semiconductor wafer W as a result of irradiation with flashes of light is conducted to the surface. The heat conduction time is defined by the material and the outer size of the semiconductor wafer W. In a case of a silicon wafer with ϕ300 mm as adopted in this preferred embodiment, the heat conduction time is about 15 milliseconds. In this manner, the end of the time period during which the lower flash lamps LFL emit flashes of light is set earlier than the end of the time period during which the upper flash lamps UFL emit flashes of light, with the time interval between the ends being equal to or shorter than the heat conduction time (in the ninth preferred embodiment, 15 milliseconds). Thereby, also at the time point t244 that is the end of the time period during which the upper flash lamps UFL emit flashes of light, the assistance of heat conduction from the back surface can be received. From this viewpoint, the time interval from the end of the time period during which the lower flash lamps LFL emit flashes of light to the end of the time period during which the upper flash lamps UFL emit flashes of light is not limited to five milliseconds, as long as it is equal to or shorter than 15 milliseconds.

Tenth Preferred Embodiment

Next, a tenth preferred embodiment of the present invention will be described. A configuration of a heat treatment apparatus according to the tenth preferred embodiment is exactly the same as that of the heat treatment apparatus 1 according to the first preferred embodiment. To be specific, the heat treatment apparatus according to the tenth preferred embodiment is configured such that the holder 7 includes the Bernoulli chuck 170 and the lower heating part 4 includes only the flash lamps FL as a light source.

Process steps performed on the semiconductor wafer W according to the tenth preferred embodiment are almost the same as those of the sixth preferred embodiment. Firstly, the transport robot provided outside the apparatus transports the semiconductor wafer W that is a processing object into the chamber 6 through the transport opening 66, and transfers the semiconductor wafer W to the Bernoulli chuck 170. At this time, the hand of the transport robot holding the semiconductor wafer W enters the chamber 6 through the transport opening 66, and then stops at a position immediately above the holder 7. Then, the transfer part 79 horizontally moves from the standby position located under the light shielding member 71 to a position located under the Bernoulli chuck 170, and then moves up along the vertical direction. Thus, the pin of the transfer part 79 passes through the through hole of the Bernoulli chuck 170, and protrudes up from the placement surface 171, to receive the semiconductor wafer W from the hand of the transport robot. Then, the hand of the transport robot exits the chamber 6, and at the same time the transport opening 66 is closed to configure the heat treatment space 65 of the chamber 6 as an enclosed space. Then, the transfer part 79 that has received the semiconductor wafer W moves down, and thereby the semiconductor wafer W is transferred from the pin of the transfer part 79 to the Bernoulli chuck 170 and placed on the placement surface 171. The transfer part 79 having transferred the semiconductor wafer W to the Bernoulli chuck 170 returns to the standby position. In the tenth preferred embodiment as well, the semiconductor wafer W is transported into the chamber 6 and placed on the Bernoulli chuck 170 while the surface of the semiconductor wafer W having the pattern formed thereon and implanted with impurities serves as the upper surface facing upward.

Then, after the transport opening 66 is closed to configure the heat treatment space 65 as an enclosed space, the valve 82 is opened so that the process gas (in the tenth preferred embodiment, a nitrogen gas) is supplied from the gas supply part 8 into the heat treatment space 65. Along with this, valve 22 is opened, and the exhaust part 2 exhausts the heat treatment space 65. Simultaneously, the valve 182 is opened so that the nitrogen gas is supplied from the chucking gas supply part 180 to the hollow portion 173 of the Bernoulli chuck 170. The nitrogen gas supplied to the hollow portion 173 is ejected obliquely upward through the ejection port 174, and thereby the semiconductor wafer W is adsorptively held in a non-contact fashion by the Bernoulli chuck 170 due to the ejection pressure of nitrogen and the Bernoulli effect of the nitrogen stream.

Figure 37:
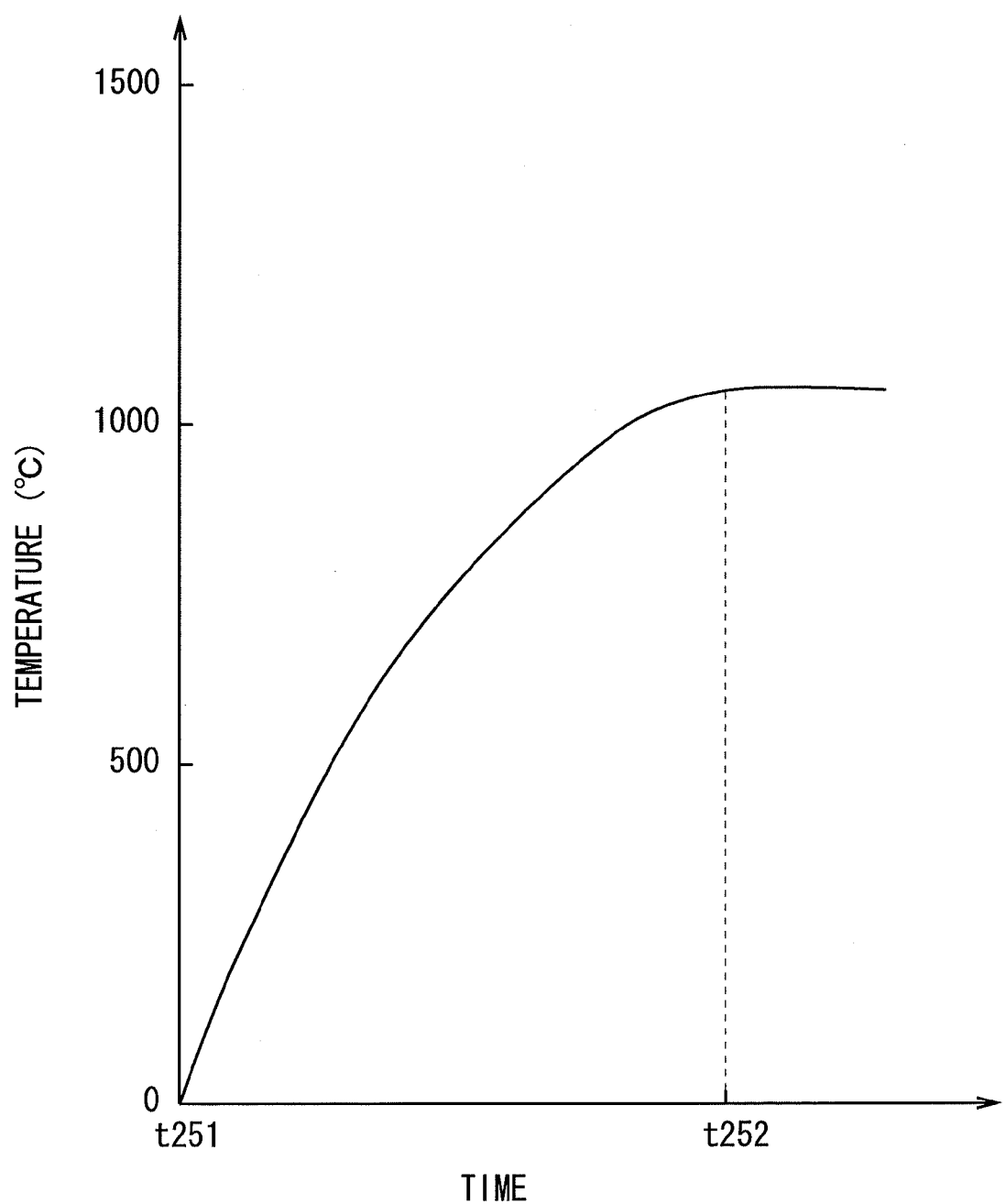
FIG. 37 is a diagram showing changes in the temperatures of the surface and the back surface of the semiconductor wafer according to a tenth preferred embodiment.

After the semiconductor wafer W is held in a non-contact fashion by the Bernoulli chuck 170, the flash heating is performed in which the plurality of flash lamps FL (lower flash lamps LFL) of the lower heating part 4 and the plurality of flash lamps FL (upper flash lamps UFL) of the upper heating part 5 irradiate the back surface and the surface of the semiconductor wafer W, respectively, with flashes of light. Thus, in the tenth preferred embodiment, without performing the preheating with halogen lamps, the flash heating is performed in which the surface and the back surface of the semiconductor wafer W having the room temperature are irradiated with flashes of light. FIG. 37 is a diagram showing changes in the temperatures of the surface and the back surface of the semiconductor wafer W according to the tenth preferred embodiment.

At a predetermined time point t251, under control by the controller 3, the plurality of flash lamps FL of the lower heating part 4 and the plurality of flash lamps FL of the upper heating part 5 emit flashes of light. The control of light emission from the lower flash lamps LFL and the upper flash lamps UFL is almost the same as that of the first preferred embodiment. To be specific, the controller 3 outputs a pulse signal to the gate of the IGBT 96, and thereby supply of charges from the capacitor 93 to each of the lower flash lamp LFL and the upper flash lamp UFL is made intermittent, thus achieving a chopper control of the light emission thereof.

Figure 38:
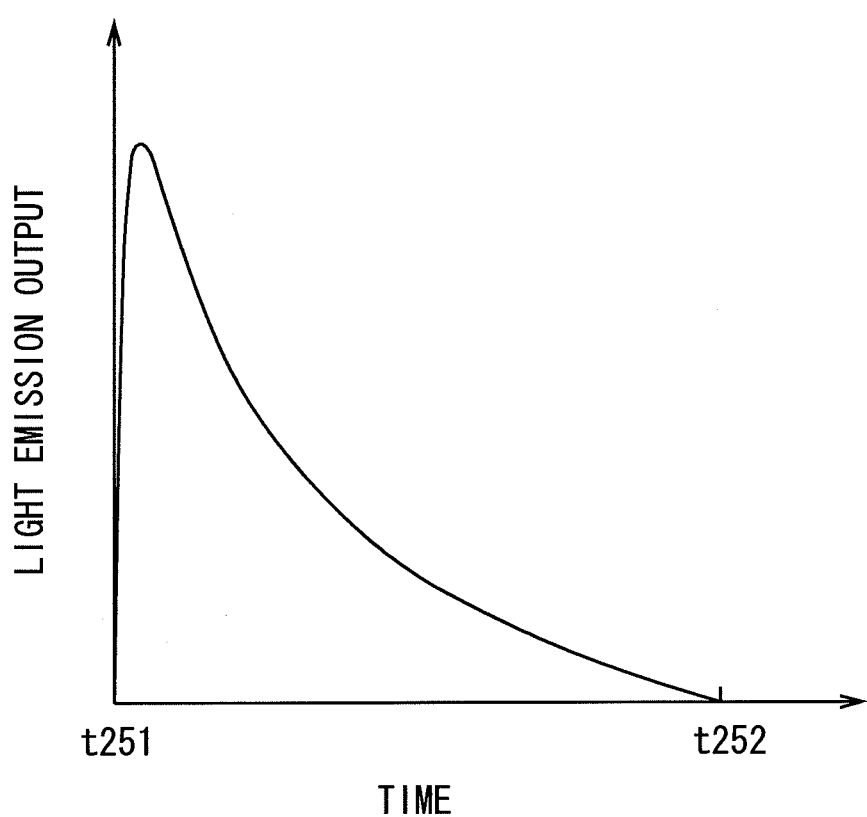
FIG. 38 is a diagram showing light emission output profiles of the lower flash lamp and the upper flash lamp according to the tenth preferred embodiment.

FIG. 38 is a diagram showing output waveforms (profiles) of light emission outputs of the lower flash lamp LFL and the upper flash lamp UFL according to the tenth preferred embodiment. In the tenth preferred embodiment, the lower flash lamps LFL and the upper flash lamps UFL simultaneously start light emission at the time point t251, and simultaneously complete the light emission at a time point t252. The light emission output of the lower flash lamp LFL and the light emission output of the upper flash lamp UFL have the same output waveform. Thus, the same pulse signal is outputted to the IGBT 96 corresponding to the lower flash lamp LFL and to the IGBT 96 corresponding to the upper flash lamp UFL, and thereby the lower flash lamps LFL and the upper flash lamps UFL are caused to simultaneously emit light at equivalent output levels. A time period from the time point t251 to the time point t252, during which the flash lamps FL emit light, is set to be 80 milliseconds.

Additionally, the light emission outputs of the lower flash lamp LFL and the upper flash lamp UFL are set such that, after reaching the peak, they gradually decrease and approach to zero until the time point (time point t252) when the light emission is completed. More specifically, a pulse signal that sets a plurality of pulses whose pulse width gradually decreases and whose pulse interval gradually increases over the time period from the time point t251 to the time point t252 is outputted to the IGBTs 96 corresponding to the lower flash lamps LFL and the upper flash lamps UFL. As a result, the lower flash lamps LFL and the upper flash lamps UFL emit light for 80 milliseconds from the time point t251 to the time point t252, and the light emission output thereof reaches the peak and then gradually decreases and approaches to zero until the time point t252.

The surface and the back surface of the semiconductor wafer W held in a non-contact fashion by the Bernoulli chuck 170 are simultaneously irradiated with flashes of light at equivalent output levels. Thereby, the flash heating is performed on the semiconductor wafer W from both the front and back sides thereof. The flashes of light emitted from the lower flash lamps LFL transmit through the Bernoulli chuck 170 made of quartz, and is radiated to the back surface of the semiconductor wafer W held in a non-contact fashion by the Bernoulli chuck 170. Such a flash heating from both the front and back surfaces causes the temperatures of the surface and the back surface of the semiconductor wafer W to rapidly rise and reach the target temperature (1050° C.) over the time period from the time point t251 to the time point t252, as shown in FIG. 37. The rate of the temperature rise in the surface and the back surface of the semiconductor wafer W, which is caused by the flash heating, is set to be 1000° C. per second or more and 40000° C. per second or less.

Figure 39:
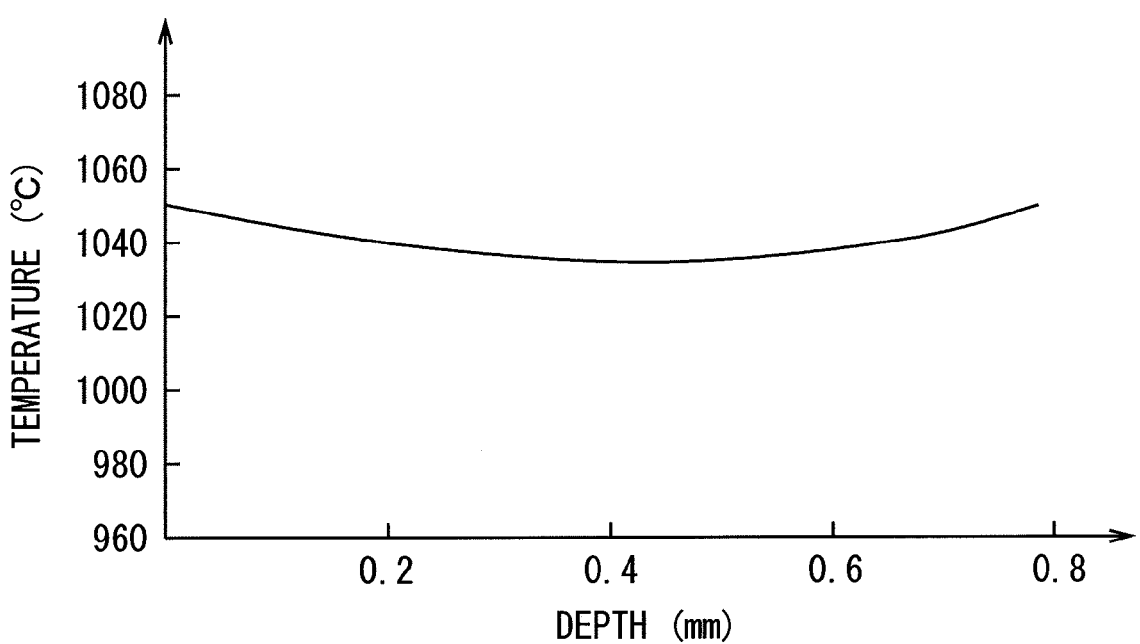
FIG. 39 is a diagram showing a temperature distribution in the thickness direction of the semiconductor wafer according to the tenth preferred embodiment.

FIG. 39 is a diagram showing a temperature distribution in the thickness direction of the semiconductor wafer W according to the tenth preferred embodiment. The temperature distribution shown in FIG. 39 is the one obtained at the time point t252 when the surface of the semiconductor wafer W reaches the target temperature. In FIG. 39, similarly to the sixth preferred embodiment, the horizontal axis indicates the depth from the surface of the semiconductor wafer W.

At the time point t252, the surface and the back surface of the semiconductor wafer W simultaneously reach the target temperature. Heat generated in the surface of the semiconductor wafer W as a result of irradiation of flashes of light is conducted to the back surface while heat generated in the back surface is conducted to the surface. Consequently, as shown in FIG. 39, the surface and the back surface of the semiconductor wafer W become equal to each other at the highest temperature, while a lowest temperature region occurs in a middle portion with respect to the thickness direction. Accordingly, the same decree of thermal expansion occurs in the surface and the back surface of the semiconductor wafer W, so that a tensile stress acts in a region near the middle portion of the semiconductor wafer W with respect to the thickness direction which has the lowest temperature.

After the simultaneous irradiation with flashes of light emitted from the upper flash lamps UFL and the lower flash lamps LFL with the same output is completed at the time point t252, the temperatures of both the surface and the back surface of the semiconductor wafer W drop. After the temperature of the semiconductor wafer W drops to a predetermined temperature or lower, the transfer part 79 horizontally moves from the standby position to the position located under the Bernoulli chuck 170. Then, the transfer part 79 moves up along the vertical direction, and thus the pin of the transfer part 79 lifts the processed semiconductor wafer W so that the semiconductor wafer W is spaced apart from the Bernoulli chuck 170. Then, the transport opening 66 is opened, and the hand of the transport robot enters the chamber 6 and stops at the position immediately below the semiconductor wafer W. Then, the transfer part 79 moves down, to transfer the processed semiconductor wafer W to the hand of the transport robot. Then, the hand of the transport robot having received the semiconductor wafer W exits the chamber 6. Thereby, the semiconductor wafer W is transported out. Thus, the flash heating treatment in the heat treatment apparatus according to the tenth preferred embodiment is completed.

In the tenth preferred embodiment, the surface and the back surface of the semiconductor wafer W having the room temperature are simultaneously irradiated with flashes of light at equivalent output levels. Thereby, over the time period from the time point t251 to the time point t252, the temperatures of the surface and the back surface of the semiconductor wafer W are similarly raised, to reach the target temperature that is the highest temperature. In the time period during which flashes of light are emitted, a temperature distribution occurs in which the surface and the back surface of the semiconductor wafer W are constantly kept at the highest temperature while the middle portion with respect to the thickness direction is constantly kept at the lowest temperature. Therefore, the same degree of thermal expansion occurs in the surface and the back surface of the semiconductor wafer W. A tensile stress caused by the thermal expansion of one of them does not act on the other of them. On the other hand, a tensile stress caused by the thermal expansion of the surface and the back surface acts on the region near the middle portion of the semiconductor wafer W with respect to the thickness direction which has the lowest temperature.

Accordingly, similarly to the sixth preferred embodiment, even if damage has occurred on the back surface of the semiconductor wafer W in the previous step, almost no tensile stress acts on the back surface. This can avoid occurrence of cracking of the semiconductor wafer W originating at the damage during irradiation with flashes of light. Additionally, similarly to the sixth preferred embodiment, a temperature difference between the highest temperature and the lowest temperature with respect to the thickness direction of the semiconductor wafer W is reduced. This also contributes to suppression of cracking of the semiconductor wafer W during irradiation with flashes of light.

Moreover, in the tenth preferred embodiment, the light emission outputs of the lower flash lamp LFL and the upper flash lamp UFL are set such that, after reaching the peak, they gradually decrease and approach to zero until the time point when the light emission is completed. This prevents an excessive temperature rise in the surface and the back surface of the semiconductor wafer W at the time point when the irradiation with flashes of light is completed, and also allows a temperature difference with respect to the depth direction of the semiconductor wafer W to gradually decrease in a smooth manner until the time point when the irradiation with flashes of light is completed. As a result, a thermal stress acting on the semiconductor wafer W during irradiation with flashes of light can be relieved. Thus, cracking of the semiconductor wafer W is more surely prevented.

Modification

While some preferred embodiments of the present invention have been described hereinabove, various modifications of the present invention in addition to those described above may be made without departing from the scope and spirit of the invention. For example, the time periods during which the upper flash lamps UFL and the lower flash lamps LFL emit flashes of light are not limited to the one illustrated in each preferred embodiment described above, and may be appropriately set by using the waveform of a pulse signal that is outputted to the IGBT 96. However, a total length of the time period during which the upper flash lamps UFL and the lower flash lamps LFL emit flashes of light is equal to or shorter than one second. For example, in the sixth to tenth preferred embodiments, the beginnings and the ends of the time periods during which the upper flash lamps UFL and the lower flash lamps LFL emit flashes of light may be set as shown in FIGS. 40A to 42C. FIGS. 40A to 42C are timing charts each showing the time periods during which the upper flash lamps UFL and the lower flash lamps LFL emit flashes of light. The solid line indicates the time period during which the upper flash lamps UFL emit flashes of light, and the dotted line indicates the time period during which the lower flash lamps LFL emit flashes of light.

In cases shown in FIGS. 40A, 40B, and 40C, the time periods during which the upper flash lamps UFL and the lower flash lamps LFL emit flashes of light begin at the same time. In an example case shown in FIG. 40A, the upper flash lamps UFL and the lower flash lamps LFL simultaneously start irradiation with flashes of light, and simultaneously complete the irradiation with flashes of light. This example case corresponds to the sixth preferred embodiment described above. In an example case shown in FIG. 40B, the upper flash lamps UFL and the lower flash lamps LFL simultaneously start irradiation with flashes of light, and the irradiation with flashes of light emitted from the lower flash lamps LFL to the wafer back surface is completed earlier. In an example case shown in FIG. 40C, the upper flash lamps UFL and the lower flash lamps LFL simultaneously start irradiation with flashes of light, and the irradiation with flashes of light emitted from the upper flash lamps UFL to the wafer surface is completed earlier.

In cases shown in FIGS. 41A, 41B, and 41C, irradiation of the surface of the semiconductor wafer W with flashes of light emitted from the upper flash lamps UFL is started earlier than irradiation with flashes of light emitted from the lower flash lamps LFL. In an example case shown in FIG. 41A, irradiation with flashes of light emitted from the upper flash lamps UFL is started earlier, and the upper flash lamps UFL and the lower flash lamps LFL simultaneously complete irradiation with flashes of light. In an example case shown in FIG. 41B, irradiation with flashes of light emitted from the upper flash lamps UFL is started earlier, and irradiation with flashes of light emitted from the lower flash lamps LFL is completed earlier. In an example case shown in FIG. 41C, irradiation with flashes of light emitted from the upper flash lamps UFL is started earlier and completed earlier.

In cases shown in FIGS. 42A, 42B, and 42C, irradiation with flashes of light emitted from the lower flash lamps LFL to the back surface of the semiconductor wafer W is started earlier than irradiation with flashes of light emitted from the upper flash lamps UFL. In an example case shown in FIG. 42A, irradiation with flashes of light emitted from the lower flash lamps LFL is started earlier, and the upper flash lamps UFL and the lower flash lamps LFL simultaneously complete irradiation with flashes of light. In an example case shown in FIG. 42B, irradiation with flashes of light emitted from the lower flash lamps LFL is started earlier and completed earlier. This example case corresponds to the ninth preferred embodiment. In an example case shown in FIG. 42C, irradiation with flashes of light emitted from the lower flash lamps LFL is started earlier, and irradiation with flashes of light emitted from the upper flash lamps UFL is completed earlier.

As shown in FIGS. 40A to 42C, the timings when the upper flash lamps UFL and the lower flash lamps LFL emit flashes of light may be set in various combinations. However, in any combination, the time period during which the upper flash lamps UFL emit flashes of light and the time period during which the lower flash lamps LFL emit flashes of light are set so as to at least partially overlap each other. This allows the surface and the back surface of the semiconductor wafer W to be simultaneously irradiated with flashes of light during the overlap period, to thereby cause the lowest temperature region to occur inside the semiconductor wafer W with respect to the thickness direction. Accordingly, even if there is any damage in the back surface of the semiconductor wafer W, almost no tensile stress acts on the back surface. This can avoid occurrence of cracking of the semiconductor wafer W originating at the damage during irradiation with flashes of light.

In the example cases shown in FIGS. 40A to 42C, no particular limitation is put on the time periods during which the upper flash lamps UFL and the lower flash lamps LFL emit flashes of light. They can be appropriately set by using the waveform of a pulse signal that is outputted to the IGBT 96. However, a total length of the time period during which the upper flash lamps UFL and the lower flash lamps LFL emit flashes of light is equal to or shorter than one second. Preferably, the time period during which the lower flash lamps LFL emit flashes of light is set longer than the heat conduction time that is required for heat to be conducted from the back surface to the surface of the semiconductor wafer W. This is because heat conducted to the surface assists the flash heating on the surface, resulting in an enhanced heating efficiency as a whole.

In the example cases shown in FIGS. 40A to 42C, the light emission outputs of the upper flash lamps UFL and the lower flash lamps LFL may be either identical to each other or different from each other.

In the second preferred embodiment, the upper flash lamps UFL and the lower flash lamps LFL simultaneously emit light at equivalent output levels. Instead, their light emission may be performed at different timings in different periods, and with different light emission outputs. For example, it may be possible that the time periods during which the upper flash lamps UFL and the lower flash lamps LFL emit flashes of light are started or ended at different timings. However, it is necessary that the time period during which the upper flash lamps UFL emit flashes of light and the time period during which the lower flash lamps LFL emit flashes of light at least partially overlap each other.

In the fourth and fifth preferred embodiments described above, the waiting time period from when the supplementary heating is completed to when the upper flash lamps UFL start emitting flashes of light is set longer than the heat conduction time. However, this is not limiting. It may be acceptable that, after the supplementary heating performed by the lower flash lamps LFL is completed and then the temperature difference between the surface and the back surface of the semiconductor wafer W decreases to 10° C. or less, the upper flash lamps UFL start emitting flashes of light. For example, in a case where, as in the fifth preferred embodiment, the surface temperature and the back surface temperature of the semiconductor wafer W are almost equal to each other at the time point when the supplementary heating is completed, the upper flash lamps UFL may emit flashes of light immediately after the supplementary heating is completed, without waiting for a time period equal to or longer than the heat conduction time. This can further shorten the heat treatment time period.

The Bernoulli chuck may be the one as shown in FIG. 43. In FIG. 43, the same elements as those shown in FIG. 2 are denoted by the same corresponding reference numerals. The Bernoulli chuck 170 shown in FIG. 2 includes the placement surface 171 having a flat plate shape, whereas a Bernoulli chuck 170a shown in FIG. 43 includes a placement portion 177 having an annular ring shape. The diameter of the placement portion 177 having the annular ring shape is smaller than the diameter of the semiconductor wafer W. The recess 172 having an annular ring shape is provided so as to surround the placement portion 177.

A side surface of the placement portion 177 is configured as a tapered surface. The ejection port 174 is formed in a quartz-made wall surface at the ceiling of the Bernoulli chuck 170a, such that the ejection port 174 extends along the inclination of the tapered surface that defines the inner circumference of the placement portion 177. Accordingly, a nitrogen gas ejected obliquely upward through the ejection port 174 is forced to flow along the tapered surface that defines the inner circumference of the placement portion 177. The other parts of the configuration of the Bernoulli chuck 170a are the same as those of the Bernoulli chuck 170 shown in FIG. 2.

When the nitrogen gas is supplied from the chucking gas supply part 180 to the hollow portion 173 in a state where the semiconductor wafer W is placed on the placement portion 177 of the Bernoulli chuck 170a, the nitrogen gas is ejected through the ejection port 174 toward a peripheral portion of a lower surface of the semiconductor wafer W. As shown in FIG. 43, the ejected nitrogen gas flows obliquely upward along the tapered surface that defines the inner circumference of the placement portion 177, and causes the semiconductor wafer W placed on the top of the placement portion 177 to float slightly above the placement portion 177. A stream of nitrogen gas flowing from the central portion toward the end edge portion of the semiconductor wafer W occurs in the gap formed between the placement portion 177 and the peripheral portion of the lower surface of the semiconductor wafer W. Since the stream of nitrogen gas occurs in the gap between the semiconductor wafer W and the placement portion 177, the Bernoulli effect is caused, and thereby the semiconductor wafer W receives, from the surrounding atmosphere, the pressure that presses the semiconductor wafer W against the placement surface 171. As a result, similarly to the first preferred embodiment described above, the ejection pressure of nitrogen and the Bernoulli effect of the nitrogen stream enable the Bernoulli chuck 170a to adsorptively hold the semiconductor wafer W in a non-contact fashion.

The material of the light shielding member 71 is not limited to ceramic such as silicon carbide, aluminum nitride, and boron nitride, as long as it is opaque to light emitted from the flash lamps FL and the halogen lamps HL. For example, opaque quartz is adoptable. The opaque quartz is quartz containing fine air bubbles and thus having a light shielding function. The light shielding member 71 may be made of a metal (for example, stainless steel). In a case where the light shielding member 71 is made of a metal, it is preferable that the light shielding member 71 is cooled with water in order to allow the light shielding member 71 to withstand irradiation with flashes of light, and additionally the surface of the light shielding member 71 is configured as a mirror surface. It may be also possible that a part of the chamber side portion 63 made of stainless steel serves as the light shielding member 71.

A portion of the Bernoulli chuck 170 outside the semiconductor wafer W held thereon may be made of opaque quartz. In this configuration, light emitted from the upper heating part 5 does not travel at the lateral sides of the peripheral portion of the semiconductor wafer W and therefore does not reach the peripheral portion of the lower surface thereof. Thus, the peripheral portion is not heated. Likewise, light emitted from the lower heating part 4 does not travel at the lateral sides of the peripheral portion of the semiconductor wafer W and therefore does not reach the peripheral portion of the upper surface thereof. Thus, the peripheral portion is not heated.

In a case where an unintended film is formed on the back surface of the semiconductor wafer W, such a film may be removed before the semiconductor wafer W is transported into the chamber 6. It may be also possible to measure the light absorption rate of the back surface of the semiconductor wafer W and, based on a measure result, adjust the light emission output of flashes of light emitted from the lower flash lamps LFL. Alternatively, when the type and thickness of the film formed on the back surface of the semiconductor wafer W are known in advance, the light emission output of the lower flash lamps LFL may be adjusted based on them.

In the fifth preferred embodiment, the surface of the semiconductor wafer W is irradiated with flashes of light emitted from the lower flash lamps LFL, so that the temperature thereof is raised up to 500° C. However, this is not limiting. The temperature rise may be up to about 800° C., similarly to the fourth preferred embodiment. The surface temperature of the semiconductor wafer W being equal to or higher than 800° C. may undesirably cause diffusion of implanted impurities. However, since the time period during which flashes of light are emitted in the supplementary heating stage is extremely short, and the waiting time period thereafter is extremely short (in the example shown in the fifth preferred embodiment, 100 milliseconds). Therefore, diffusion hardly occurs. Increasing the ratio of irradiating of the back surface of the semiconductor wafer W with flashes of light can accordingly reduce the intensity of flashes of light emitted to the surface. Thus, the degree of dependence on the pattern is further reduced.

It may be also possible to form a nickel film on the surface of the semiconductor wafer and then perform the flash heating treatment by using the heat treatment apparatus according to the present invention, to thereby form nickel silicide (silicidation). It may be also possible to additionally form a high-dielectric film (High-k film) containing, for example, hafnium on the surface of the semiconductor wafer and perform the flash heating treatment by using the heat treatment apparatus according to the present invention, to thereby promote crystallization of the high-dielectric film (PDA: Post Deposition Anneal).

Alternatively, it may be possible to form a resist film on the surface of the semiconductor wafer W, and then perform a baking process (PAB: Post Applied Bake) after application of the resist film or perform a baking process (PEB: Post Exposure Bake) after exposure of the resist film by using the heat treatment technique according to the present invention. The target temperature required for these heat treatments is relatively low (100° C. to 200° C.). Therefore, even in a case where, as in the third preferred embodiment, only the surface of the semiconductor wafer W is irradiated with flashes of light, cracking which may be caused by a rapid thermal expansion is suppressed.

The substrate serving as a processing object of the heat treatment technique according to the present invention is not limited to a semiconductor wafer. A glass substrate for use in a liquid crystal display device or the like, or a substrate for use in a solar cell, is adoptable.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate having a pattern formed on a front surface thereof by irradiating said substrate with flashes of light, said heat treatment apparatus comprising:
    a chamber configured to receive a substrate;
    a support member configured to support a substrate within said chamber;
    a first flash lamp configured to irradiate a back surface of a substrate supported on said support member with flashes of light, to thereby perform a supplementary heating on said substrate;
    a second flash lamp configured to irradiate a front surface of said substrate having subjected to the supplementary heating with flashes of light, to thereby heat said front surface to a predetermined target temperature; and
    a halogen lamp configured to, before said first flash lamp starts the supplementary heating, preheat said substrate by irradiating said back surface with light.

2. The heat treatment apparatus according to claim 1, wherein a time period during which said first flash lamp emits flashes of light is equal to or shorter than one second but longer than a heat conduction time that is required for heat to be conducted from said back surface to said front surface.

3. The heat treatment apparatus according to claim 1, wherein the rate of the temperature rise in said back surface, which is caused by the irradiation with flashes of light emitted from said first flash lamp, is 1000° C. per second or higher.

4. The heat treatment apparatus according to claim 1, wherein a time interval from when said first flash lamp completes the supplementary heating to when said second flash lamp starts emitting flashes of light is longer than a heat conduction time that is required for heat to be conducted from said back surface to said front surface.

5. The heat treatment apparatus according to claim 1, wherein after said first flash lamp completes the supplementary heating and then a temperature difference between said front surface and said back surface decreases to 10° C. or less, said second flash lamp starts emitting flashes of light.

6. The heat treatment apparatus according to claim 1, wherein
said first flash lamp and said second flash lamp are rod-like lamps,
said first flash lamp and said second flash lamp are arranged perpendicularly to each other.

7. The heat treatment apparatus according to claim 1, wherein
a light shielding member is provided around said support member, said light shielding member optically isolating said first flash lamp and said second flash lamp from each other.

8. The heat treatment apparatus according to claim 1, wherein
said first flash lamp is arranged at a position closer to said support member than said halogen lamp is.

9. The heat treatment apparatus according to claim 1, wherein
said support member includes a Bernoulli chuck made of quartz and configured to hold said substrate in a non-contact fashion due to the Bernoulli effect.

10. A heat treatment method for heating a substrate having a pattern formed on a front surface thereof by irradiating said substrate with flashes of light, said method comprising the steps of:
(a) irradiating a back surface of a substrate supported on a support member within a chamber with flashes of light, to thereby perform a supplementary heating on said substrate; and
(b) irradiating a front surface of said substrate having subjected to the supplementary heating with flashes of light, to thereby heat said front surface to a predetermined target temperature; and
(c) prior to said step (a), irradiating said back surface with light emitted from a halogen lamp, to thereby preheat said substrate.

11. The heat treatment method according to claim 10, wherein
a time period during which the irradiation with flashes of light in said step (a) is performed is equal to or shorter than one second but longer than a heat conduction time that is required for heat to be conducted from said back surface to said front surface.

12. The heat treatment method according to claim 10, wherein
the rate of the temperature rise in said back surface, which is caused by the irradiation with flashes of light in said step (a), is 1000° C. per second or higher.

13. The heat treatment method according to claim 10, wherein
a time interval from when the supplementary heating in said step (a) is completed to when the irradiation with flashes of light in said step (b) is started is longer than a heat conduction time that is required for heat to be conducted from said back surface to said front surface.

14. The heat treatment method according to claim 10, wherein
after the supplementary heating in said step (a) is completed and then a temperature difference between said front surface and said back surface decreases to 10° C. or less, the irradiation with flashes of light in said step (b) is started.

15. A heat treatment method for heating a substrate by irradiating said substrate with flashes of light, said method comprising the steps of:
(a) irradiating a back surface of a substrate supported on a support member within a chamber with flashes of light, to thereby heat said substrate from the back surface side thereof; and
(b) irradiating a front surface of said substrate supported on said support member with flashes of light, to thereby heat said substrate from the front surface side thereof,
wherein a time period during which the irradiation with flashes of light in said step (a) is performed and a time period during which the irradiation with flashes of light in said step (b) is performed at least partially overlap each other.

16. The heat treatment method according to claim 15, wherein
a light emission output of flashes of light in said step (a) and a light emission output of flashes of light in said step (b) are different from each other.

17. The heat treatment method according to claim 15, wherein
the beginning of the time period during which the irradiation with flashes of light in said step (a) is performed is different from the beginning of the time period during which the irradiation with flashes of light in said step (b) is performed.

18. The heat treatment method according to claim 15, wherein
the end of the time period during which the irradiation with flashes of light in said step (a) is performed is different from the end of the time period during which the irradiation with flashes of light in said step (b) is performed.

19. The heat treatment method according to claim 18, wherein
the end of the time period during which the irradiation with flashes of light in said step (a) is performed is earlier than the end of the time period during which the irradiation with flashes of light in said step (b) is performed, with the time interval between said ends being equal to or shorter than a heat conduction time that is required for heat to be conducted from said back surface to said front surface.

* * * * *